US008525849B2

(12) United States Patent
Nakamura et al.

(10) Patent No.: US 8,525,849 B2
(45) Date of Patent: Sep. 3, 2013

(54) DESIGNING SUPPORT METHOD, DESIGNING SUPPORT EQUIPMENT, PROGRAM AND COMPUTER-READABLE STORAGE MEDIUM

(75) Inventors: Satoshi Nakamura, Kanagawa (JP);
Shingo Kitamura, Kanagawa (JP);
Youichi Tachibana, Kanagawa (JP);
Naoji Tsukakoshi, Kanagawa (JP)

(73) Assignee: Zuken Inc., Kanagawa (JP)

( * ) Notice: Subject to any disclaimer, the term of this patent is extended or adjusted under 35 U.S.C. 154(b) by 942 days.

(21) Appl. No.: 12/376,235

(22) PCT Filed: Oct. 10, 2007

(86) PCT No.: PCT/JP2007/069737
§ 371 (c)(1),
(2), (4) Date: Apr. 14, 2009

(87) PCT Pub. No.: WO2008/044699
PCT Pub. Date: Apr. 17, 2008

(65) Prior Publication Data
US 2009/0326874 A1 Dec. 31, 2009

(30) Foreign Application Priority Data

Oct. 11, 2006 (JP) ................................ 2006-277259

(51) Int. Cl.
*G09G 5/12* (2006.01)
(52) U.S. Cl.
USPC ............ 345/619; 345/629; 345/419; 345/581
(58) Field of Classification Search
USPC .................................. 345/619, 629, 581, 419
See application file for complete search history.

(56) References Cited

U.S. PATENT DOCUMENTS

| 5,761,328 | A | * | 6/1998 | Solberg et al. ................. 382/113 |
| 6,944,513 | B1 | * | 9/2005 | Tomomitsu et al. ............ 700/98 |
| 7,107,285 | B2 | * | 9/2006 | von Kaenel et al. ................... 1/1 |
| 2002/0067364 | A1 | * | 6/2002 | Lane et al. ..................... 345/531 |
| 2003/0131332 | A1 | | 7/2003 | Pfeil et al. |
| 2005/0091626 | A1 | * | 4/2005 | Okano et al. ..................... 716/11 |
| 2007/0132785 | A1 | * | 6/2007 | Ebersole et al. .............. 345/633 |
| 2007/0198534 | A1 | * | 8/2007 | Hon et al. ........................ 707/10 |

(Continued)

FOREIGN PATENT DOCUMENTS

| JP | 07262241 | A | * | 10/1995 |
| JP | 09-128437 | | | 5/1997 |
| JP | 2001-84277 | | | 3/2001 |
| JP | 2005-108018 | | | 4/2005 |

*Primary Examiner* — Javid A Amini
(74) *Attorney, Agent, or Firm* — Muncy, Geissler, Olds & Lowe, PLLC

(57) ABSTRACT

A designing support equipment for displaying design information on a display unit and designing a product so as to easily design the outline of a whole product and details of the constituent elements of the product. The equipment comprises a display unit having a first display displaying design information logically expressing the electrical operation of objects to be designed, a second display displaying design information expressing a physical two-dimensional shape of the objects, and a third display displaying design information expressing a physical three-dimensional shape of the objects, selecting means for selecting at least two displays from the first to third displays, and control means for allowing the display unit to display the selected display from the first to third displays about the same object and varying the displayed contents of the first to third displays displayed on the display unit so as to keep the matching.

52 Claims, 50 Drawing Sheets

(56) References Cited

U.S. PATENT DOCUMENTS

| | | |
|---|---|---|
| 2009/0100096 A1* | 4/2009 | Erlichson et al. .......... 707/104.1 |
| 2009/0202114 A1* | 8/2009 | Morin et al. ................. 382/118 |
| 2009/0303603 A1* | 12/2009 | Goggins ....................... 359/628 |
| 2010/0066559 A1* | 3/2010 | Judelson ................. 340/825.49 |
| 2011/0270833 A1* | 11/2011 | von Kaenel et al. .......... 707/736 |
| 2012/0127204 A1* | 5/2012 | Distler .......................... 345/647 |

\* cited by examiner

FIG. 14 PART ARRANGEMENT &L→P→G INTERLOCK

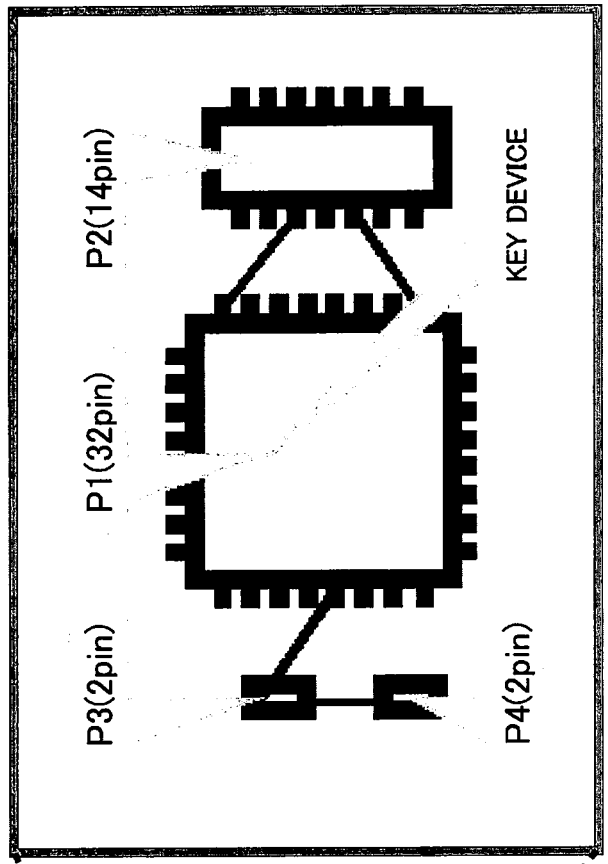
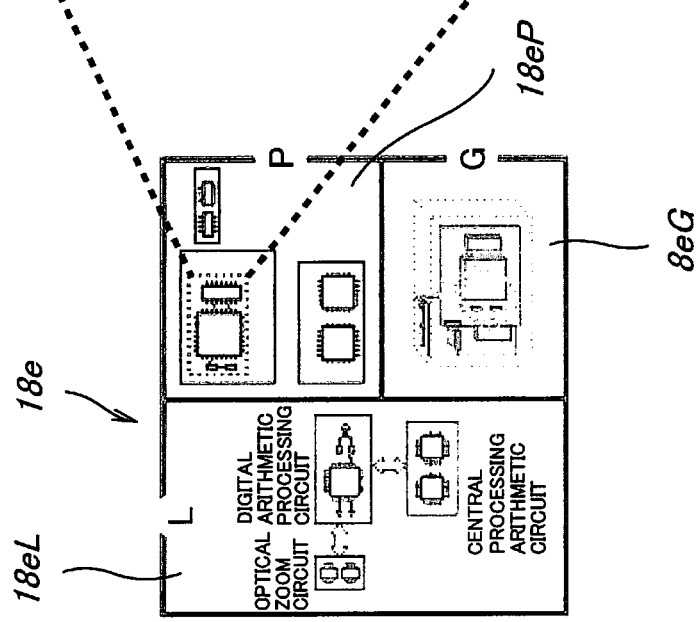
FIG. 18(a)
FIG. 18(b)

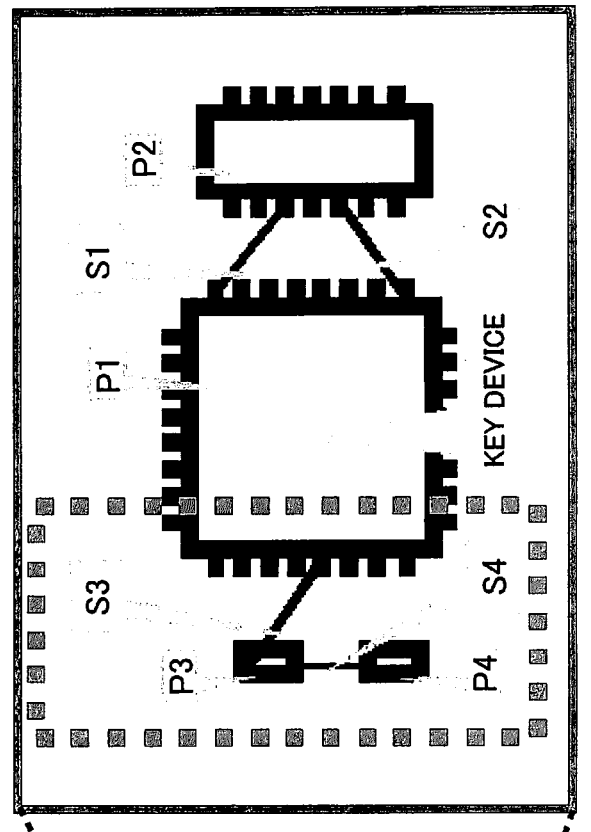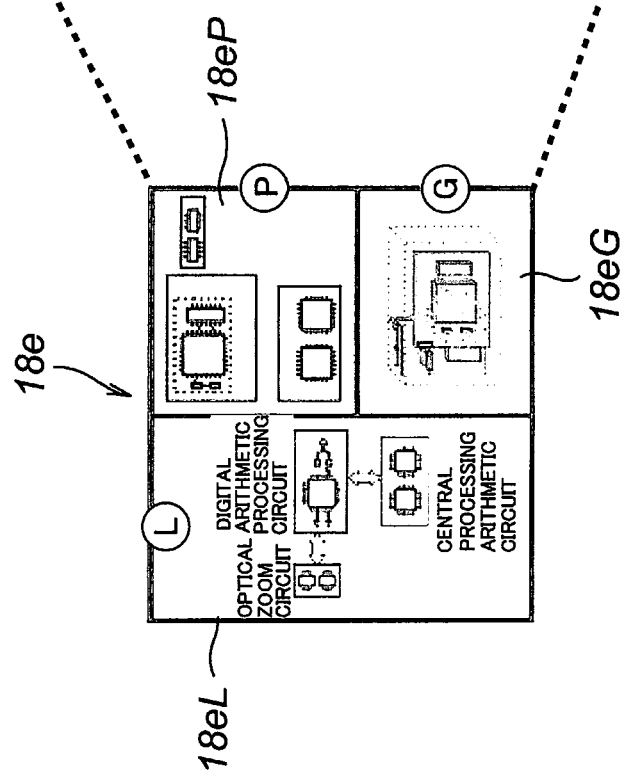
FIG. 21(a)
FIG. 21(b)

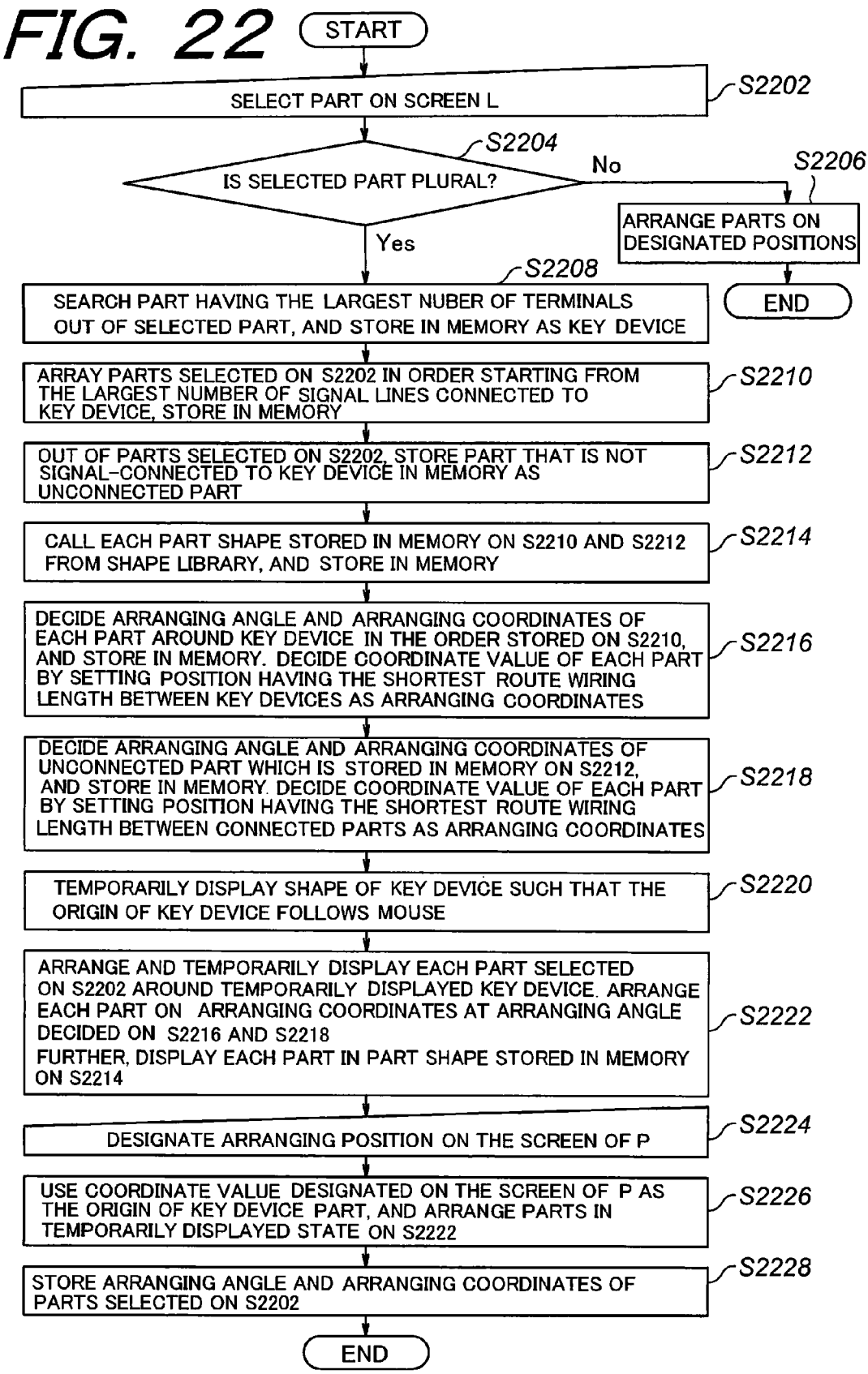

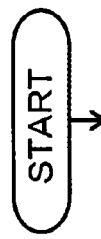
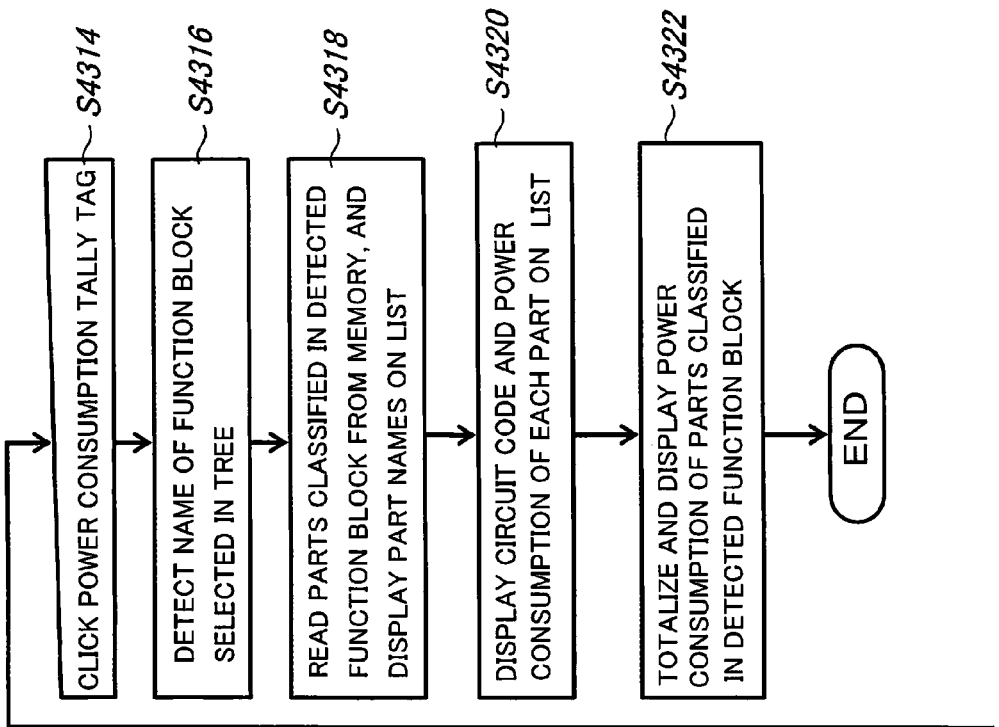
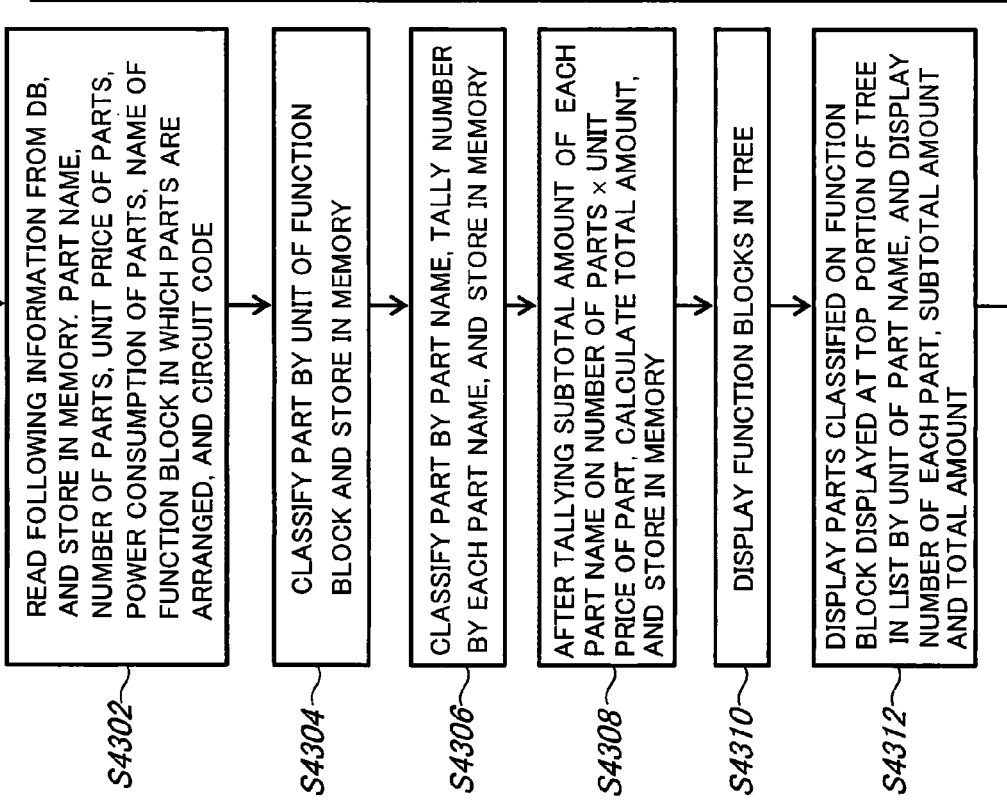
FIG. 43

FIG. 49

| ELEMENT BLOCK | ELECTRIC TERMINAL | PHYSICAL BLOCK | PHYSICAL BLOCK TERMINAL | PHYSICAL BLOCK CONNECTION INFORMATION | ELECTRIC INFORMATION |
|---|---|---|---|---|---|
| EMBODIMENT | | | | | |
| CIRCUIT PART | CIRCUIT PART TERMINAL | SUBSTRATE BLOCK | SUBSTRATE BLOCK TERMINAL | CONNECTION BETWEEN SUBSTRATE BLOCKS | SIGNAL |
| PACKAGE SUBSTRATE | | | | | |
| SEMICONDUCTOR CHIP | SEMICONDUCTOR CHIP TERMINAL | PACKAGE SUBSTRATE BLOCK | PACKAGE SUBSTRATE BLOCK TERMINAL | CONNECTION BETWEEN PACKAGE SUBSTRATE BLOCKS | SIGNAL |
| MODULE | | | | | |
| MODULE PART | MODULE PART TERMINAL | UNIT BLOCK | UNIT BLOCK TERMINAL | CONNECTION BETWEEN UNIT BLOCKS | SIGNAL |
| EXPRESSES ITEMS THAT CONSTITUTE ELECTRONIC PRODUCT | EXPRESSES EXISTENCE OF ELECTRIC INTERFACE | EXPRESSES A MOUNTING UNIT | EXPRESSES EXISTENCE OF ELECTRIC INTERFACE IN PHYSICAL BLOCK | EXPRESSES EXISTENCE OF ELECTRIC ASSOCIATION BETWEEN PHYSICAL BLOCKS | EXPRESSES ELECTRIC CHARACTERISTIC |

DESIGNING SUPPORT METHOD, DESIGNING SUPPORT EQUIPMENT, PROGRAM AND COMPUTER-READABLE STORAGE MEDIUM

FIELD OF THE INVENTION

The present invention relates to a designing support method, a designing support equipment, a program and a computer-readable storage medium, more specifically the invention relates to a designing support method, a designing support equipment, a program and a computer-readable storage medium, which are used in designing various systems such as electric products such as various electric appliances using a computer system, electronic devices or mechanical systems such as various automobiles.

BACKGROUND ART

On the initial stage of development of various products provided with electrical connection relationship such as electric products and electronic products, evaluation of the feasibility of whole product is studied based on unfixed various information, and design in such a initial stage of development is called a "concept design".

More specifically, the concept design means design on the initial stage of design in product development, and planning study, trial production of a product or the like is performed on the stage of concept design.

In short, in the concept design stage, various objects that constitute a product (the object means various product constituent items such as software, circuit parts, chassis parts, chips, modules, interconnect, packages and chassis, which are needed in constituting a product) are simultaneously dealt with, and whether they fulfill functions and designs required in the market is studied while taking all objects in consideration comprehensively.

For example, as an example of a conventional designing procedure, description will be made for a designing procedure in developing a digital camera product. Such a conventional design procedure is divided into a product planning stage (product planning), a function design or specification design stage (function design/specification design), and a mounting design or detail design stage (mounting design/detail design), consideration of purchase or consideration of diversion of existing items from outside (purchase/diversion from outside) is done along with each of the design stages. Then, the product planning stage and the function design/specification design stage generally correspond to the concept design.

Herein, on the product planning stage, what kind of product concept or product outline will be created is considered. Specifically, what kind of catalog spec will be needed is considered, and as the catalog spec of a digital camera,
Power of optical zoom
Power of digital zoom
Necessity of SD card memory compatibility
Necessity of video shooting
Number of inches of liquid crystal display screen and the like, for example, are consideration targets.

After such a product planning stage, procedure moves to a function design/specification design stage in which functions necessary in realizing contents decided in the product planning and its specific realizing method are considered.

On the function design/specification design stage, a central processing operation function, a graphics function, an I/O function and the like are expressed on a logical block diagram.

After that, based on a design in the function design/specification design stage, the mounting/detail design, the purchase/diversion from outside or the like is performed. More specifically, functions and specific realizing methods are classified into actual product constituent items, and each of the product constituent items is individually designed, consideration of purchase or consideration of diversion of existing items from outside is performed.

Specifically, on the mounting/detail design stage, for example, design of semiconductor, design of substrate, design of wire or cable, design of flexible substrate or the like is performed.

Further, on the stage of purchase/diversion from outside, purchase and diversion of flash parts, batteries, battery units, lens modules, liquid crystal panels, panel substrates or the like, for example, are considered.

Herein, description will be further made for the function design/specification design stage. On the function design/specification design stage, the entire system schematic design utilizing a logical block diagram is performed, and in this occasion, designers perform design while referring to reference documents, explanatory materials or past cases.

More specifically, when the designers move on with design, they express design contents by manual graphics on paper, or express design contents by graphics simply using graphic tools such as Visio (trademark) and PowerPoint (trademark). Alternatively, designers do not express anything on a medium at all, but move on with design in designers' imagination.

Herein, although it is possible to grasp the operation image of a product in the logical block diagram, it is unclear specifically what kind of constitution is used to realize operations, so that he/she creates an overall operation image by attaching documents, simple explanatory papers, reference documents, past design examples or the like other than the logical block diagram.

It is to be noted that the "logical block" expresses a unit of product functions. The block is put together by an operation unit in many cases, the level of detail of expressed contents is different for each person who handles the block.

Further, the "logical block diagram" is a diagram in which electric designers list logical blocks, can see each association, and can imagine overall operation when they move on with product design.

Once the operation image of a product is completed as described above, a processing in which the completed operation image is sorted to actual product constituent items is performed. As a work for this processing, a mock-up or a barrack (prototype) is fabricated by handcraft to create a pseudo operation image. In this occasion, he/she only sees the logical block diagram and associated information for reference, so that it is extremely difficult to understand the operation image in accurate contents.

Therefore, sorting of the operation image to product constituent items had to be ambiguous.

It is to be noted that semiconductors, substrates, wires, cables, flexible substrates, flash parts, lens modules, batteries, battery units, liquid crystal panels, panel substrates and the like are fabricated by mock-ups or barracks, for example, in the example of digital camera.

As described, on the concept design stage, evaluation of various matters regarding product development, that is, functions, designs, operation images, cost or time of sales or the like, for example, tends to be very ambiguous. For this reason, not only a major rework occurs on the stage of detail design in which each object is individually designed, but also information exchange between detail designs has to be very frequent, which were pointed out as a cause of design changes.

Further, on the concept design stage, tests are conducted by actually fabricating mock-ups or barracks to confirm whether or not a problem is in a product planning, so it was pointed out that work time and expense increased.

Due to the above-described background, devising has been strongly desired for a method in which various objects such as software, circuit parts, chassis parts, chips, modules, interconnecting, packages, chassis or the like, which constitute a product can be expressed in a very ambiguous state on the concept design, and moreover, environment in which they can be designed and considered from the aspect of function and the aspect of mounting can be provided.

Further, in the concept design, tests need to be performed by actually fabricating mock-ups or barracks, whose work time and expense increase, devising of a method in which such mock-ups or barracks are not fabricated but trial production to test can be executed on a computer has been strongly desired.

It is to be noted that the above-described requests exist not only in the concept design but also in the design on various stages to no small extent, a target field of the design is not only limited to electric products or electronic devices such as various electric appliances but also covers various systems such as mechanical systems like various automobiles.

It is to be noted that prior art that the present applicant knows at the point of filing a patent is as described above and not an invention according to document publicly known invention, so there is no prior art information to be described.

DISCLOSURE OF THE INVENTION

Problems to be Solved by the Invention

The present invention has been created in view of the above-described various problems that prior art has, and it is an object of the invention to provide a designing support method, a designing support equipment, a program and a computer-readable storage medium in which various objects such as software, circuit parts, chassis parts, chips, modules, interconnecting, packages, chassis and the like, which constitute a product can be expressed in an ambiguous state by using a computer system, and moreover, environment in which they can be designed and considered from the aspect of function and the aspect of mounting is provided, and an outline of whole product or details of each constituent element of a product can be easily designed.

Further, it is an object of the present invention to provide a designing support method, a designing support equipment, a program and a computer-readable storage medium in which the need of performing tests by actually fabricating mock-ups or barracks, whose work time and expense increase is eliminated, and trial production to test can be executed on a computer without fabricating the mock-ups or barracks.

Means for Solving the Problems

To achieve the above-described objects, in the present invention, a region in which design information logically expressing the electrical operation of objects to be designed is displayed, a region in which design information expressing the objects to be designed in a physical two-dimensional shape is displayed, a region in which design information expressing the objects to be designed in a physical three-dimensional shape is displayed are severally provided as a display region of a display unit in a computer system, the same object to be designed is displayed in three display regions of the display unit.

More specifically, in the present invention, as conceptually shown in FIG. 1, design information (appropriately referred to as "Logical (logical)" or "L" in this specification) logically expressing an electrical operation such as a circuit diagram being an object to be designed, a circuit block (logical block), hardware description language, netlist and parts list of various products, design information (appropriately referred to as "Physical (physical) or "P" in this specification) expressing various products being objects to be designed in physical two-dimensional shapes, and design information (appropriately referred to as "Geometrical (geometrical)" or "G" in this specification) expressing various products being objects to be designed in physical three-dimensional shapes can be simultaneously displayed on a display screen.

Further, in the present invention, holding matching between the three design information of LPG in real-time is made possible, designing of various products being objects to be designed can be supported while expressing in the three aspects of LPG.

Further, in the present invention, to hold matching between the three design information of LPG, the three design information of LPG are synchronized/interlocked with each other in real-time.

The real time synchronization/interlocking of the three design information of LPG can be realized by controlling so as to refer to the same design information, for example. More specifically, if the three design information of LPG is acquired while referring to the same design information, LPG is consequently expressed so as to change in a synchronized/interlocked manner because the three design information of LPG is based on the same design information. It is to be noted that selecting and displaying any two design information out of the three LPG is also possible.

More particularly, in the present invention, matching between the three design information of LPG is held in real-time, and expressed in three aspects.

More specifically, matching between the three design information being Logical, Physical and Geometrical is held, and each information is expressed in three display regions.

Herein, as described, Logical (L) means design information logically expressing an electrical operation, further, Physical (P) means design information expressed in physical two-dimensional shapes, and Geometrical (G) means design information expressed in physical three-dimensional shapes, and these three pieces of information is synchronized or interlocked with each other in real-time to hold matching.

Further, in the present invention, design information is expressed in logical blocks. More specifically, in expressing design information, an electrical operation is displayed in logical blocks that were logically classified.

Further, in the present invention, two-dimensional physical information regarding a plurality of substrates is expressed. More specifically, in expressing design information, it is displayed in two-dimensional physical information including a plurality of substrates and electrical connection information between the substrates.

Further, in the present invention, three-dimensional physical information (assembly diagram) having electrical design information is expressed. More specifically, in expressing design information, it is displayed in three-dimensional physical information including electrical design information of electric parts, electrical connection information, layer constitution of a printed circuit board or the like.

Further, in the present invention, electric parts including peripheral parts are automatically arranged. More specifically, regarding an electric part selected on the display screen of Logical by performing logical block designation, region designation and part designation, Physical and Geometrical part search is performed in real-time by the operation of drag and drop, and peripheral parts are also appropriately arranged.

Further, in the present invention, automatic generation of a connector and a flexible substrate is performed. More specifically, in arranging parts by the method of the present invention, optimum connector parts are generated at optimum positions on each substrate on the display screens of P and G, and the connectors are physically connected by an optimum flexible substrate.

Herein, the optimum connector part denotes a connector part having the number of pins compatible with the number of signal lines electrically connecting substrates.

Further, the optimum flexible substrate denotes a flexible substrate having a thickness proportional to the number of signal lines connecting substrates.

It is to be noted that connectors on each substrate are physically connected by a flexible substrate on the display screen of G, and a connector part and a flexible substrate are connected by a rubber band on the display screen of P.

Further, in the present invention, automatic changing of connectors and flexible substrates is performed. More specifically, in the case where an electric part is moved between substrates or in the case where an electric part is deleted/added on the display screens of P and G, the number of signal lines electrically connecting substrates is changed. In such occasion, connector part arranged on each substrate is changed to an optimum connector part, and re-arranged on an optimum position on each substrate.

Further, on the display screens of P and G, the flexible substrate is changed to a thickness proportional to the number of signal lines connecting substrates, and the rubber band of P is also changed.

Further, in the present invention, part changing is performed while holding matching between LPG. More specifically, in the case where an electric part on either display screen of L, P and G is changed, logical information, two-dimensional shaped part or three-dimensional shaped part is searched and changed in real-time on the other two display screens. For example, in the case where a circuit code IC1 is changed from part A to part B on the display screen of L, IC1 is changed in real-time to a two-dimensional shaped part B on the screen of P, and IC1 is changed in real-time to a three-dimensional shaped part B on the screen of G.

Further, in the present invention, part deletion is performed while holding matching between LPG. More specifically, when an electric part was deleted on the screen of L, a two-dimensional shaped part and a three-dimensional shaped part on the two display screens of P and G are deleted in real-time to hold matching. For example, in the case where circuit code IC1 was deleted on the display screen of L, IC1 is deleted in real-time from the screens of P and the screen of G.

Further, when an electric part is deleted on either display screen of P and G, a two-dimensional shaped part and a three-dimensional shaped part on the other screen are deleted in real-time to hold matching. For example, in the case where circuit code IC is deleted on the screen of P, IC1 is deleted in real-time from the screen of G.

Meanwhile, in the present invention, it is assumed that the information of L be right, and for this reason, the information that a part was deleted reflects from L to P and G, but does not reflects from P and G to L. However, P and G are synchronized with each other into the same state constantly.

Further, in the present invention, part addition is performed while holding matching between LPG. More specifically, when an electric part is added on either display screen of P and G, a two-dimensional shaped part and a three-dimensional shaped part are added in real-time on the same coordinates on the other screen to hold matching. For example, in the case where circuit code IC2 is added on the coordinate value (X,Y)=(10,20) of on the substrate A on the screen of P, IC2 is added on the coordinate value (X,Y)=(10,20) on the substrate A on the screen of G.

Further, when an electric part is added in a particular logical block on the screen of L and in the case where the logical block is arranged on the screen of P and the screen of G, the two-dimensional shaped part and the three-dimensional shaped part are added in real-time on the screens of P and G.

It is to be noted that P and G are synchronized with each other into the same state constantly in adding a part. However, synchronization from L to P and G is limited to the case where parts are arranged on P and G by the unit of logical block.

Further, in the present invention, part movement (addition of signal line) is performed while hold matching between PG.

More specifically, in moving an electric part on either display screen of P and G, the two-dimensional shaped part and the three-dimensional shaped part are moved in real-time on the same coordinates on the other screen to hold matching. It is to be noted that signal lines also follow simultaneously with the movement of part.

For example, it is assumed that:

Condition 1. IC1 is arranged on the substrate A and IC2 arranged on a substrate B on the screens of P and G;

Condition 2. IC1 and IC2 are electrically connected to each other by a signal line X; and Condition 3. The signal line X is a signal line crossing the substrates because IC1 and IC2 are arranged on different substrates.

Under these conditions, IC2 is moved from the substrate B to the substrate A on the screen of P. In short, the signal line X crossing the substrates becomes a closed signal line in the substrate A.

In moving the part as described the above, the followings are performed in real-time by the present invention and matching is held.

Deleting one rubber band crossing the substrates on the screen of P.

Making the thickness of a flexible substrate connecting the substrates thinner on the screen of G because one signal line crossing the substrates is deleted.

Changing connector parts arranged on the substrate A and the substrate B to connector parts compatible with the number of signal lines reduced by one.

Further, in the present invention, signal changing is performed while holding matching between LPG. More specifically, in changing connection information (signal line) on the screen of L, the connection information, the connector parts and the thickness of flexible substrates on the two screens of P and G are changed in real-time to hold matching.

For example, it is assumed that the design information is as follows.

Condition 1. IC1 is arranged on the substrate A and IC2 and IC3 are arranged on the substrate B on the screens of P and G;

Condition 2. IC1 and IC2 are electrically connected to each other by the signal line X; and Condition 3. The signal line X is a signal line crossing the substrates because IC1 and IC2 are arranged on different substrates.

Under these conditions, in the case where the signal line X connected to IC1 is changed to a signal connected to IC3 on the screen of L, the signal line X becomes a signal line connecting IC2 and IC3 in the same substrate. In short, the signal line X crossing the substrates becomes a closed signal line in the substrate.

As described the above, in changing the connection of the signal line X on the screen of L, the followings are performed in real-time by the present invention and matching is held.

Deleting one rubber band crossing the substrates and newly generating a rubber band connecting IC2 and IC3 on the screen of P.

Making the thickness of a flexible substrate connecting the substrates thinner on the screen of G because one signal line crossing the substrates is reduced.

Changing connector parts arranged on the substrate A and the substrate B to connector parts compatible with the number of signal lines reduced by one.

Further, in the present invention, signal deleting is performed while holding matching between LPG. More specifically, in deleting connection information (signal line) on the screen of L, the connection information, the connector parts and the thickness of flexible substrates on the two screens of P and G are changed in real-time to hold matching.

For example, it is assumed that the design information is as follows.

Condition 1. IC1 is arranged on the substrate A and IC2 is arranged on the substrate B on the screens of P and G;

Condition 2. IC1 and IC2 are electrically connected to each other by the signal line X; and Condition 3. The signal line X is a signal line crossing the substrates because IC1 and IC2 are arranged on different substrates.

Under these conditions, the signal line X connecting IC1 and IC2 is deleted on the screen of L. In short, one signal line crossing the substrates of the substrate A and the substrate B is reduced.

In this occasion, the followings are performed in real-time by the present invention and matching is held.

Deleting one rubber band crossing the substrates on the screen of P.

Making the thickness of a flexible substrate connecting the substrates thinner on the screen of G because one signal line crossing the substrates is reduced.

Changing connector parts arranged on the substrate A and the substrate B to connector parts compatible with the number of signal lines reduced by one.

Further, in the present invention, signal addition is performed while holding matching between LPG. More specifically, in adding connection information (signal line) on the screen of L, the connection information, the connector parts and the thickness of flexible substrates on the two screens of P and G are changed in real-time to hold matching.

For example, it is assumed that the design information is as follows.

Condition 1. IC1 is arranged on the substrate A and IC2 is arranged on the substrate B on the screens of P and G;

Condition 2. IC1 and IC2 are electrically connected to each other by the signal line X; and Condition 3. The signal line X is a signal line crossing the substrates because IC1 and IC2 are arranged on different substrates.

Under these conditions, a signal line Y connecting IC1 and IC2 is newly added on the screen of L. In short, one signal line crossing the substrates of the substrate A and the substrate B is increased.

In this occasion, the followings are performed in real-time by the present invention and matching is held.

Adding one rubber band crossing the substrates on the screen of P.

Making the thickness of a flexible substrate connecting substrates thicker on the screen of G because one signal line crossing the substrates was increased.

Changing connector parts arranged on the substrate A and the substrate B to connector parts compatible with the number of signal lines increased by one.

Further, in the present invention, input of various information regarding electric design is performed. More specifically, only designated information can be reflected on a designated logical (functional) block of a circuit diagram from information such as a circuit diagram, a parts list and a netlist regarding electric design. In reflecting information, designating a part of the logical (functional) block, the parts list or the netlist in the circuit diagram is made possible.

Further, in the present invention, output of various information regarding electric design is performed. More specifically, only necessary information regarding electric design can be outputted and produced from the circuit diagram by the unit of logical (functional) block, the unit of substrate unit or the like. It is to be noted that the output information denotes information regarding the electric design of the circuit diagram, the parts list, the netlist or the like.

Further, in the present invention, association and reference of various design information are performed. More specifically, information regarding the electric design of the circuit diagram, the parts list, the netlist or the like is associated.

Further, reference to only associated information (such as the parts list of logical block A only) out of particular design information (circuit diagram or the like) is made possible.

More specifically, the designing support method according to the present invention has: a display unit equipped with a first display that displays design information logically expressing the electrical operation of objects to be designed, the second display that displays design information expressing the objects to be designed in a physical two-dimensional shape, and a third display that displays design information expressing the objects to be designed in a physical three-dimensional shape; selecting means for selecting at least two displays out of the above-described first display, the above-described second display and the above-described third display; and control means for controlling displays on the above-described display unit, and where design is performed by displaying design information on the above-described display unit, in which the above-described control means executes a step of displaying a display that the above-described selecting means selected out of the above-described first display, the above-described second display and the above-described third display on the above-described display, regarding the same object to be designed, and a step of changing displayed contents displayed on the above-described display unit into the state where matching is held on the above-described first display, the above-described second display and the above-described third display.

Further, the designing support method according to the present invention has: a plurality of terminals connected via a network; and terminal control means for controlling the above-described plurality of terminals, which are connected via the network, via the above-described network, in which the above-described terminal has: the display unit equipped with the first display that displays design information logically expressing electrical operation of the objects to be designed, the second display that displays design information expressing the objects to be designed in a physical two-dimensional shape, and the third display that displays design information expressing the objects to be designed in a physical three-dimensional shape; the selecting means for selecting at least two displays out of the above-described first display, the above-described second display and the above-described third display; and control means for displaying a display that the above-described selecting means selected out of the above-described first display, the above-described second display and the above-described third display on the above-described display unit regarding the same object to be designed, and changing the displayed contents displayed on the above-described display unit in the state where matching is held on the above-described first display, the above-described second display and the above-described third display, where design is performed by displaying design information on the above-described display unit, in which the above-described terminal control means executes a step of detecting a change of displayed contents severally displayed on the above-described display units of the above-described plurality of terminals, and a step of changing the displayed contents of terminals whose displayed contents did not change so as to hold matching with the displayed contents of a terminal whose displayed contents changed when the change of displayed contents was detected in the above-described detecting step.

Further, the designing support equipment according to in the present invention, designing support equipment that displays design information on a display unit and performs design, which has: the display unit equipped with the first display that displays design information logically expressing the electrical operation of the objects to be designed, the second display that displays design information expressing objects to be designed in a physical two-dimensional shape, and the third display that displays design information expressing the objects to be designed in a physical three-dimensional shape; the selecting means for selecting at least two displays out of the above-described first display, the above-described second display and the above-described third display; and control means for displaying a display that the above-described selecting means selected out of the above-described first display, the above-described second display and the above-described third display on the above-described display unit regarding the same object to be designed, and changing displayed contents displayed on the above-described display unit to the state where matching is held on the above-described first display, the above-described second display and the above-described third display.

Further, the designing support equipment according to in the present invention, designing support equipment that displays design information on the display unit and performs design, which has: a plurality of terminals connected via a network; terminal control means for controlling the above-described plurality of terminals, which are connected via the network, via the above-described network, in which the above-described terminal has: a display unit equipped with the first display that displays design information logically expressing the electrical operation of the objects to be designed, the second display that displays design information expressing the objects to be designed in a physical two-dimensional shape, and the third display that displays design information expressing the objects to be designed in a physical three-dimensional shape; selecting means for selecting at least two displays out of the above-described first display, the above-described second display and the above-described third display; and control means for displaying a display that the above-described selecting means selected out of the above-described first display, the above-described second display and the above-described third display on the above-described display unit regarding the same object to be designed, and changing displayed contents displayed on the above-described display to the state where matching is held on the above-described first display, the above-described second display and the above-described third display, in which the above-described terminal control means has: detecting means for detecting a change of displayed contents severally displayed on the above-described display units of the above-described plurality of terminals; and display matching means for changing the displayed contents of terminals whose displayed contents did not change so as to hold matching with the displayed contents of a terminal whose displayed contents changed when the above-described detecting means detected the change of displayed contents.

Further, the designing support equipment according to in the present invention, the above-described control means has: detecting means for detecting a change of displayed contents in each of the above-described first display, the above-described second display and the above-described third display; display matching means for changing displayed contents of the above-described first display, the above-described second display or the above-described third display, whose displayed contents did not change so as to hold matching with the displayed contents of the above-described first display, the above-described second display or the above-described third display whose displayed contents were changed when the above-described detecting means detected change of displayed contents.

Further, in the designing support equipment according to the present invention, the above-described design information logically expressing an electrical operation is design information including logical blocks in which the electrical operation is logically classified.

Further, in the designing support equipment according to the present invention, the above-described design information expressing the objects to be designed in a physical two-dimensional shape has at least one or more substrates, and also includes electrical connection information of a plurality of substrates and between the above-described plurality of substrates.

Further, in the designing support equipment according to the present invention, the above-described design information expressing the objects to be designed in a physical three-dimensional shape includes electrical design information.

Further, the designing support equipment according to the present invention further has: designating means for designating constituent element that constitutes the above-described objects to be designed on the above-described first display, the above-described second display or the above-described third display, which were displayed on the above-described display unit, and the above-described control means has means for holding matching of constituent elements by reflecting the constituent element designated by the above-described designating means and other constituent elements having predetermined relationship with the above-described constituent element on the displayed contents of the above-described first display, the above-described second display and the above-described third display.

Further, in the designing support equipment according to the present invention, the above-described control means has automatic generating means for automatically generating the connector and the flexible substrate while holding matching of displayed contents on the above-described second display and the above-described third display.

Further, in the designing support equipment according to the present invention, the above-described control means has automatic changing means for automatically changing the connector and the flexible substrate while holding matching of displayed contents on the above-described second display and the above-described third display.

Further, in the designing support equipment according to the present invention, the above-described control means has: detecting means for detecting at least any editing processing out of changing, deleting, adding and moving of a part on each of the above-described first display, the above-described second display and the above-described third display; and display matching means for changing the displayed contents of the above-described first display, the above-described second display or the above-described third display whose displayed contents did not change so as to hold matching with the display contents of the above-described first display, the above-described second display or the above-described third display, where the part was changed based on an editing processing of the part, when the above-described detecting means detected the editing processing.

Further, in the designing support equipment according to the present invention, the above-described control means has: detecting means for detecting at least any editing processing out of changing, deleting or adding in each of the above-described first display, connection information in the above-described second display and the above-described third display; and display matching means for changing the displayed contents of the above-described first display, the above-described second display or the above-described third display, whose displayed contents did not change so as to hold matching with the displayed contents of the above-described first display, the above-described second display or the above-described third display, where the connection information was changed based on the editing processing of the connection information, when the above-described detecting means detected the editing processing.

Further, in the designing support equipment according to the present invention, the above-described design information includes at least design information regarding electric design.

Further, the designing support equipment according to the present invention further has: design information selecting means for selecting the above-described design information regarding electric design; and output means for outputting information based on the design information selected by the above-described design information selecting means.

Further, the designing support equipment according to the present invention further has: associating means for associating the above-described design information regarding electric design.

Further, the program according to the present invention is a program for allowing a computer to execute the designing support method according to the present invention.

Further, the program according to the present invention is a program for allowing a computer to function as the designing support equipment according to the present invention.

Further, the computer-readable storage medium according to the present invention is a computer-readable storage medium recording the program according to the present invention therein.

Effect of the Invention

Since the present invention is constituted as described above, it is possible to look over the whole product from the initial stage of the design, the need of rework and information exchange between detail designs, which frequently occurred on the detail design stage, is eliminated, and as a result, an excellent effect that the entire lead time of product design can be shortened is exerted.

Further, since the present invention is constituted as described above, an excellent effect that trial production tests can be executed on a computer without actually fabricating prototypes is exerted.

BRIEF DESCRIPTION OF THE DRAWINGS

FIGS. 18(a)(b) are explanatory views of the processing of automatic arrangement of electric parts including peripheral parts according to the present invention (automatic arranging processing), where FIG. 18(a) is an explanatory view of circuit parts to be automatically arranged, and FIG. 18(b) is a partially enlarged view of FIG. 18(a).

FIG. 19(a) is an explanatory view corresponding to FIG. 18(a)

FIG. 20(a) is an explanatory view corresponding to FIG. 18(a)

FIGS. 21(a)(b) are explanatory views of the processing of automatic arrangement of electric parts including peripheral parts according to the present invention (automatic arranging processing), where FIG. 20(a) is an explanatory view corresponding to FIG. 18(a)

FIG. 22 is a flowchart showing the processing routine of the automatic arranging processing according to the present invention.

FIG. 43 is a flowchart of processing routine showing a processing in outputting design information by function.

FIG. 49 is an explanatory view showing an example of objects that the present invention deals with.

FIG. 50 is an explanatory view showing an example of design information that the present invention deals with.

EXPLANATION OF NUMERICAL CHARACTERS

10 Computer System
12 Network
14 WWW Server System
14a Central Processing Unit (CPU)
14b Read Only Memory (ROM)
14c Random Access Memory (RAM)
14d Display unit (Display)
14e Character Input Device
16 Storage
18 Client System
18a Central Processing Unit (CPU)
18b Read Only Memory (ROM)
18c Random Access Memory (RAM)
18d Magnetic Disc
18e Display unit (Display)
18eL Logical Display Region
18eP Physical Display Region
18eG Geometrical Display Region
18f Character Input Device
18g Pointing Device

BEST MODE FOR IMPLEMENTING THE INVENTION

Hereinafter, referring to the attached drawings, description will be made in detail for an embodiment example of a designing support method, a designing support equipment, a program and a computer-readable storage medium according to the present invention.

Figure 1:
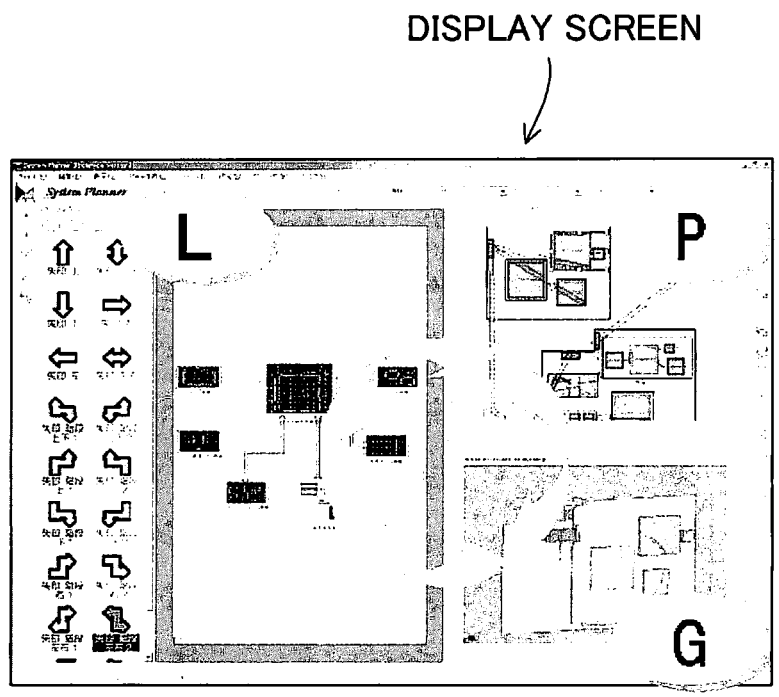
FIG. 1 is a conceptual explanatory view of the present invention.
Figure 2:
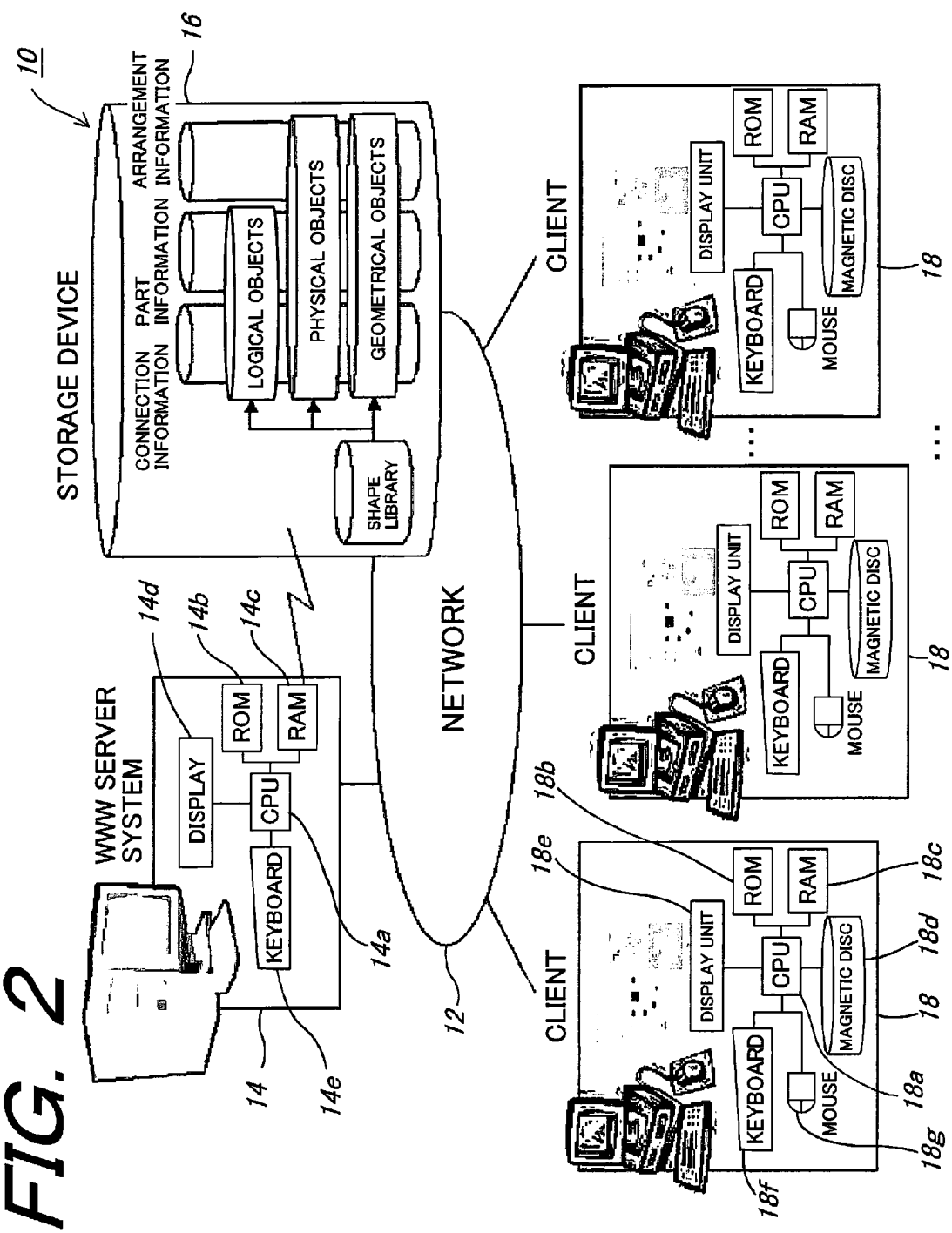
FIG. 2 is a block constitution view showing the system constitution of an embodiment example of a computer system equipped with the designing support equipment according to the present invention.

FIG. 2 shows the block constitution view showing the system constitution of an embodiment example of a computer system equipped with the designing support equipment according to the present invention.

In the following explanation, description will also be made in detail for the constitution of a database (DB) used in the present invention, but the constitution of the database described here is only an example, and it goes without saying that another database constitution different from this may be used.

In this computer system 10, as described later, the above-described three design information of LPG hold matching, and interlock and synchronize with each other in real-time by the editing processing such as changing, deleting, adding and moving of electric parts or the editing processing such as changing, deleting, adding and moving of electric signals.

The computer system 10 is built by a client server system, and constituted by having a WWW server system 14, a storage 16 storing database used in the present invention, and client systems 18 being n-pieces (n is a positive integer) of terminals which are severally connected via a network 12.

Herein, the WWW server system 14 is constituted so as to control the entire operation by using a central processing unit (CPU) 14a.

To this CPU 14a, a read only memory (ROM) 14b storing programs for controlling the CPU 14a, a random access memory (RAM) 14c equipped with a storage region storing information read out from the database (DB), which is stored in the storage 16, a storage region used as a working area of the CPU 14a, or the like a display (display) 14d equipped with a screen such as a CRT and a liquid crystal panel, which performs various displays based on the control of the CPU 14a, and a character input device 14e such as a keyboard for inputting arbitrary characters, are connected via a bus.

Further, the client system 18 is constituted so as to control its entire operation by using a central processing unit (CPU) 18a.

To this CPU 18a, a read only memory (ROM) 18b storing programs for controlling the CPU 18a, a random access memory (RAM) 18c equipped with a storage region storing information read out from the WWW server system 14, a storage region storing information read out from the database stored in the storage 16, or a storage region used as a working area of the CPU 14a, or the like a magnetic disc 18d storing various information created in the client systems 18, a display unit (display) 18e equipped with a screen such as a CRT and a liquid crystal panel, which performs various displays based on the control of the CPU 18a, a character input device 18f such as a keyboard for inputting arbitrary characters, and a pointing device 18g such as a mouse that designates an arbitrary position on the display screen of the display unit 18e, are connected via a bus.

In this computer system 10, with an operation of input means such as the character input device 18f and the pointing device 18g by a user who performs a designing operation by using the client system 18, the user can input his/her desired instruction or setting.

Then, in response to such an operation of the character input device 18f or the pointing device 18g by the user, various processings (described later), that is, a processing such as changes of display on the display unit 18e and building of database on the storage 16, for example, is executed by the service from the WWW server system 14.

In the above-described constitution, description will be made for processing contents executed by the computer system 10 while referring to each drawing on and after FIG. 3.

Now, in the following explanation, for simplified explanation by making the present invention easily understood, description will be made for a case where objects to be designed that is designed by the computer system 10 are electric products, and furthermore, the pointing device 18g will be appropriately referred to as simply a "mouse".

Figure 3:
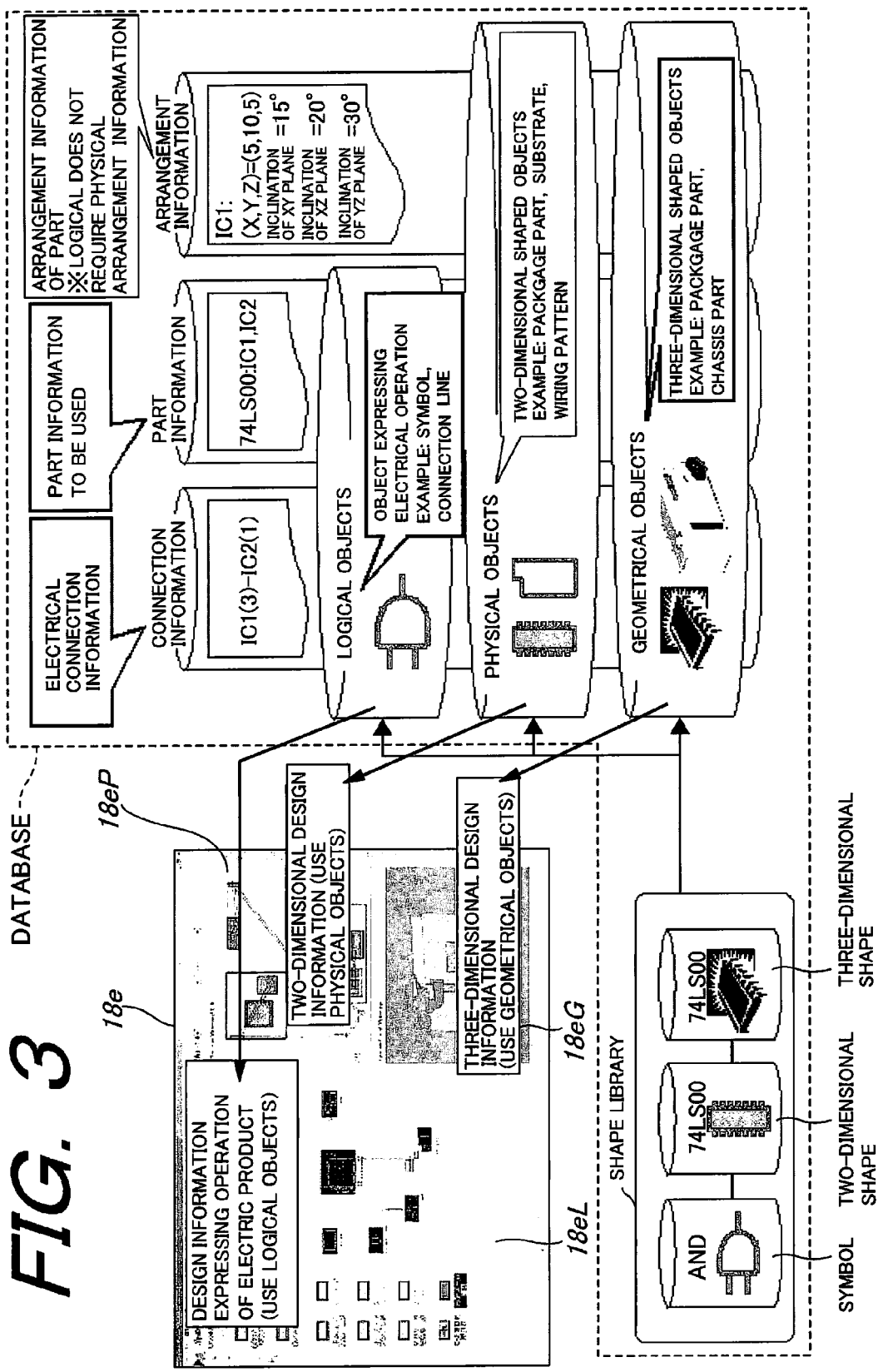
FIG. 3 is an explanatory view of the outline of a processing executed in a computer system equipped with the designing support equipment according to the present invention.

FIG. 3 shows the explanatory view of the outline of processings executed in the computer system 10, and shows relationship between the display unit 18e in the client system 18 and a database stored in the storage 16.

First, description will be made for the display unit 18e in the client system 18. The display unit 18e is equipped with: a logical display region 18eL (hereinafter, appropriately referred to as "screen L") in which Logical being design information logically expressing the electrical operations such as the circuit diagram of an electric product is displayed by using Logical objects (logical objects) stored in a database (described later); a physical display region 18eP (hereinafter, appropriately referred to as "screen P") in which Physical being design information expressing electric products in physical two-dimensional shapes is displayed by using Physical objects (physical objects) stored in the database (described later); and a geometrical display region 18eG (hereinafter, appropriately referred to as "screen G") in which Geometrical being design information expressing electric products in physical three-dimensional shapes is displayed by using Geometrical objects (geometrical objects) stored in the database (described later).

Next, description will be made for the structure of the database stored in the storage 16. The database stores nine pieces of information in total, that is, Logical objects (L objects) displayed in the logical display region 18eL, Physical objects (P objects) displayed on the physical display region 18eP, Geometrical objects (G objects) displayed on the geometrical display region 18eG, connection information shared by three display regions of the logical display region 18eL, the physical display region 18eP and the geometrical display region 18eG on the display unit 18e, part information shared by three display regions of the logical display region 18eL, the physical display region 18eP and the geometrical display region 18eG on the display unit 18e, arrangement information shared by three display regions of the logical display region 18eL, the physical display region 18eP and the geometrical display region 18eG on the display unit 18e, and three shape libraries storing three types of shapes being symbols showing the shapes of Logical objects, two-dimensional shapes showing the shapes of Physical objects and three-dimensional shapes showing the shapes Geometrical objects.

Herein, Logical objects are objects expressing electrical operations, which are symbols, connection lines or the like, for example.

Further, Physical objects are two-dimensional shaped objects, which are package parts, substrates, wiring pattern or the like, for example.

Further, Geometrical objects are three-dimensional shaped objects, which are package parts, chassis parts or the like, for example.

On the other hand, the connection information is electrical connection information, and the part information is part information to be used, and the arrangement information is arrangement information of parts.

Herein, Logical objects are built based on the connection information, the part information and the symbols in the shape library. Since the physical arrangement information is unnecessary in Logical objects, the arrangement information is not used in Logical objects.

Further, Physical objects are built based on the connection information, the part information, the arrangement information and the two-dimensional shapes in the shape library.

Further, Geometrical objects are built based on the connection information, the part information, the arrangement information and three-dimensional shapes in the shape library.

In the computer system 10, to hold matching between three design information called LPG, each design information stored in the database is changed in real-time.

Hereinafter, description will be made in detail for an example in which design information is expressed in the three aspects of LPG being the logical display region 18eL, the physical display region 18eP and the geometrical display region 18eG of the display unit 18e and LPG is changed into a matching holding state.

In the following explanation, description will be mainly made for an example of LPG expressed in a synchronized/interlocked manner, an example of changing, deleting, adding and moving parts, and an example of changing, deleting and adding signals.

Figure 4:
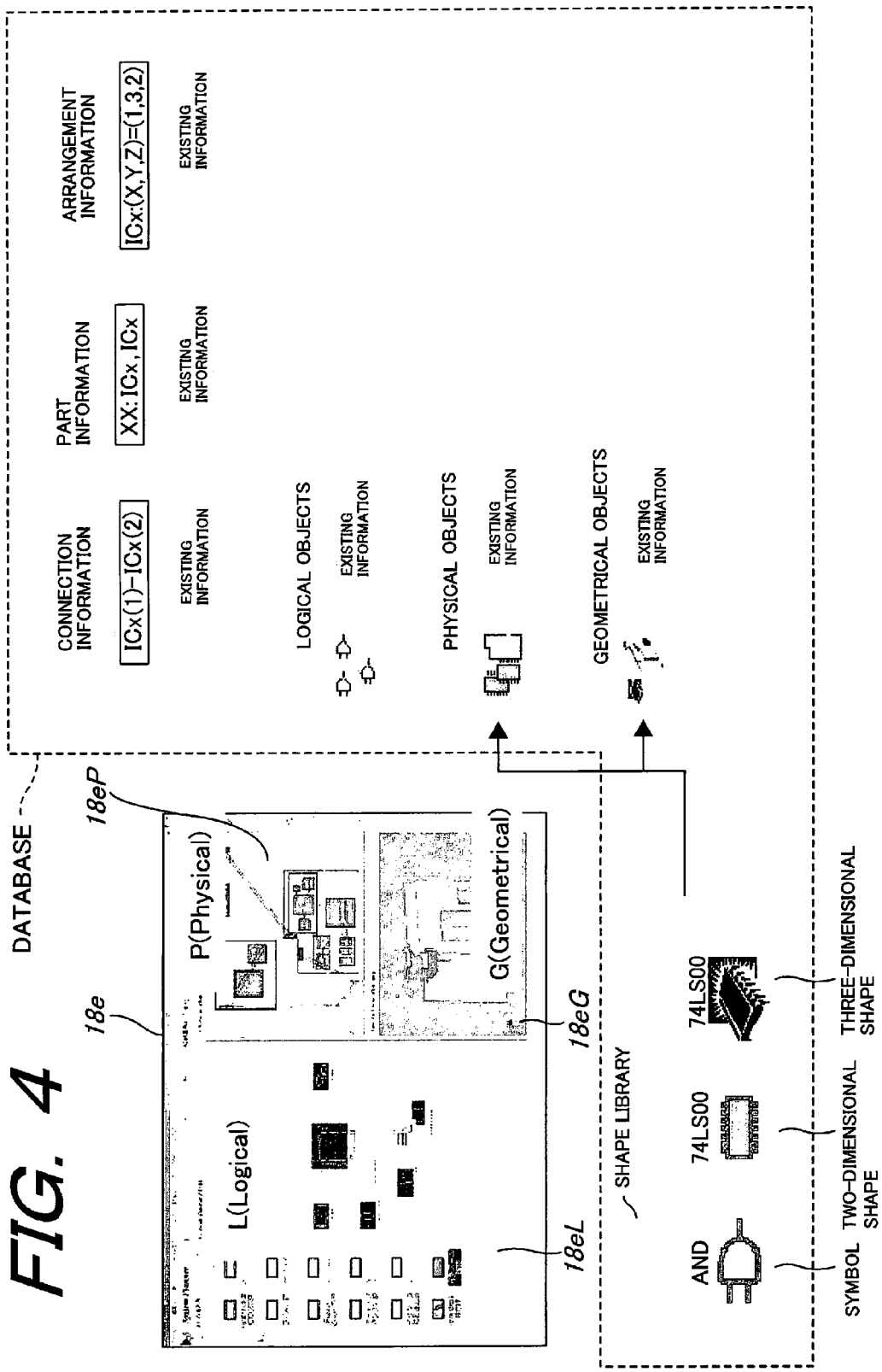
FIG. 4 is an explanatory view showing the initial state of a display state on a display unit and the stored contents of database in the state.

Herein, in the following explanation, it is assumed that the display state of the display unit 18e shown in FIG. 4 is used as an initial state, and the database has contents as shown in FIG. 4 in this state. It is assumed that the database previously stores information, and the information is referred to as existing information.

Further, in the explanation below, description will be made for the design of a digital camera, but the present invention can be utilized in supporting the design of not only electric appliances such as cell phones, personal computers and televisions but also all products such as vehicles that require electric design.

Next, in the initial state shown in FIG. 4, description will be made for a processing where symbols are newly arranged in the logical display region 18eL of the display unit 18e (symbol arrangement processing) while referring to FIG. 5. It is to be noted that a flowchart showing the processing routine of the symbol arrangement processing shown in FIG. 6 will be referred to as well.

Figure 5:
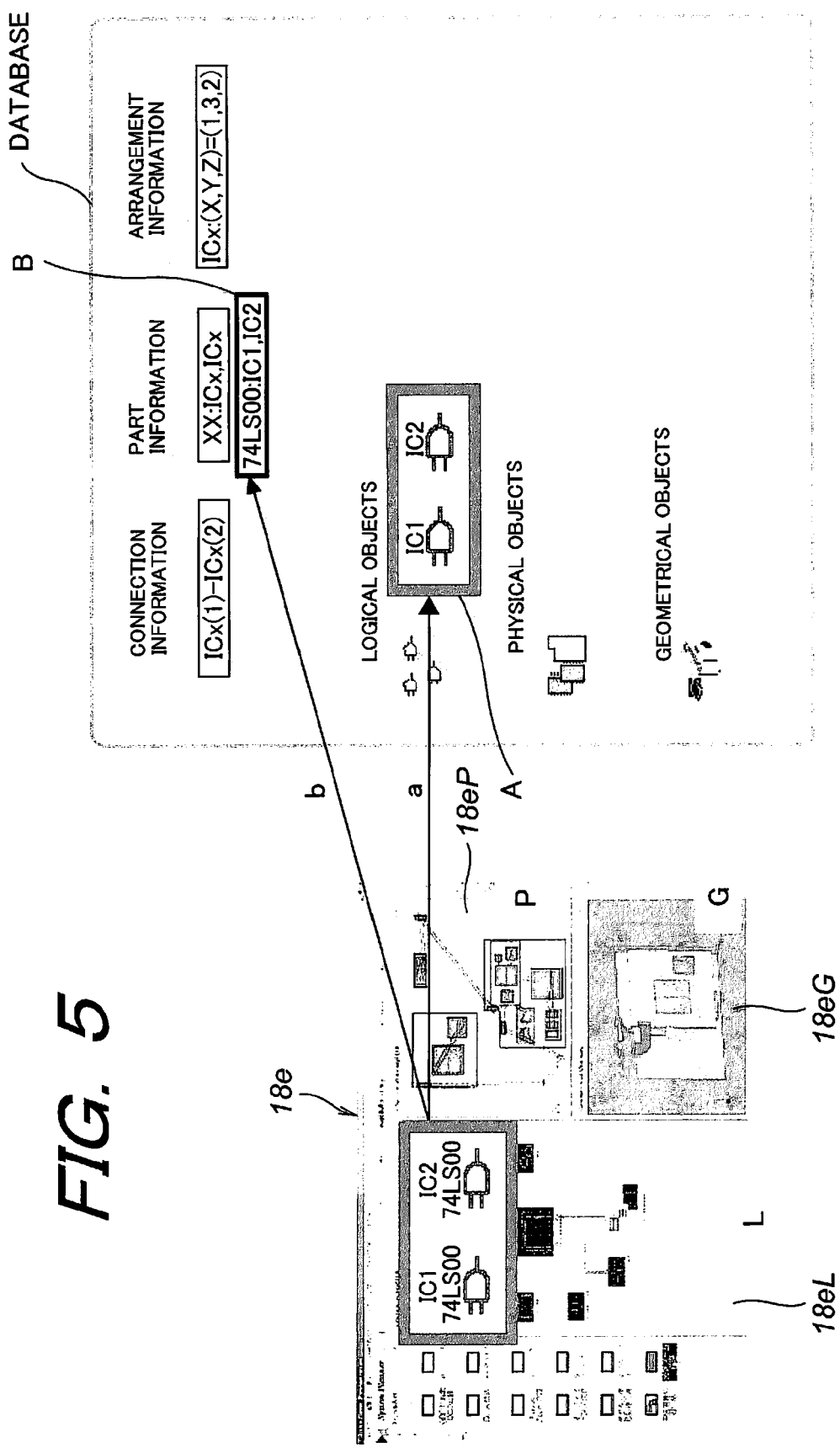
FIG. 5 is an explanatory view of a processing (symbol arrangement processing) in which a symbol is newly arranged on a logical display region of the display unit according to the present invention.
Figure 6:
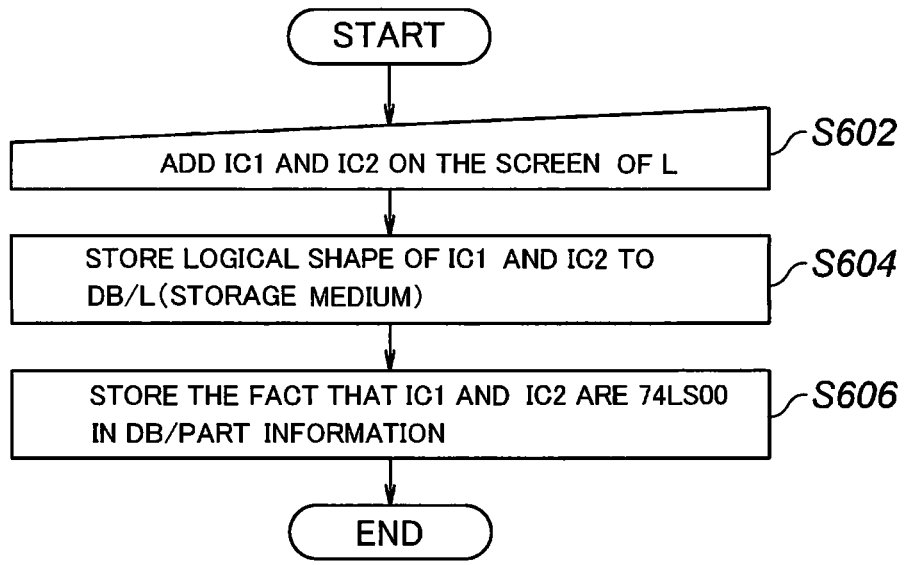
FIG. 6 is a flowchart showing the processing routine of the symbol arrangement processing according to the present invention.

In the example of this symbol arrangement processing, a user arranges two symbols on the logical display region 18eL of the display unit 18e being a display screen displaying L by using the character input device 18f or the pointing device 18g, parts expressed by the symbols uses "74LS00", and each circuit code is called "IC1" and "IC2", as shown in FIG. 5.

More specifically, in the processing routine of the symbol arrangement processing, when the user adds IC1 and IC2 by newly inputting IC1 and IC2 on the logical display region 18eL of the display unit 18e being a display screen displaying L by using the character input device 18f or the pointing device 18g (step S602), symbols being the logical shapes of IC1 and IC2 are stored in Logical objects of the database (step S604), and furthermore, information "74LS00: IC1, IC2" showing IC1, IC2 and 74LS00 is stored in the part information of the database (step S606), and the processing routine is ended.

In short, as the information of the database, two symbol figures are added to Logical objects as new objects (refer to a of FIG. 5), and information that IC1 and IC2 are 74LS00 is added as the part information, as shown in FIG. 5 (refer to b of FIG. 5).

In other words, design information "A+B" of the database shown in FIG. 5 is displayed on the logical display region 18eL.

Next, in the state shown in FIG. 5, description will be made for a processing where a signal is newly connected to the logical display region 18eL of the display unit 18e (signal connecting processing) while referring to FIG. 7. It is to be noted that a flowchart showing the processing routine of the signal connecting processing shown in FIG. 8 will be referred to as well.

Figure 7:
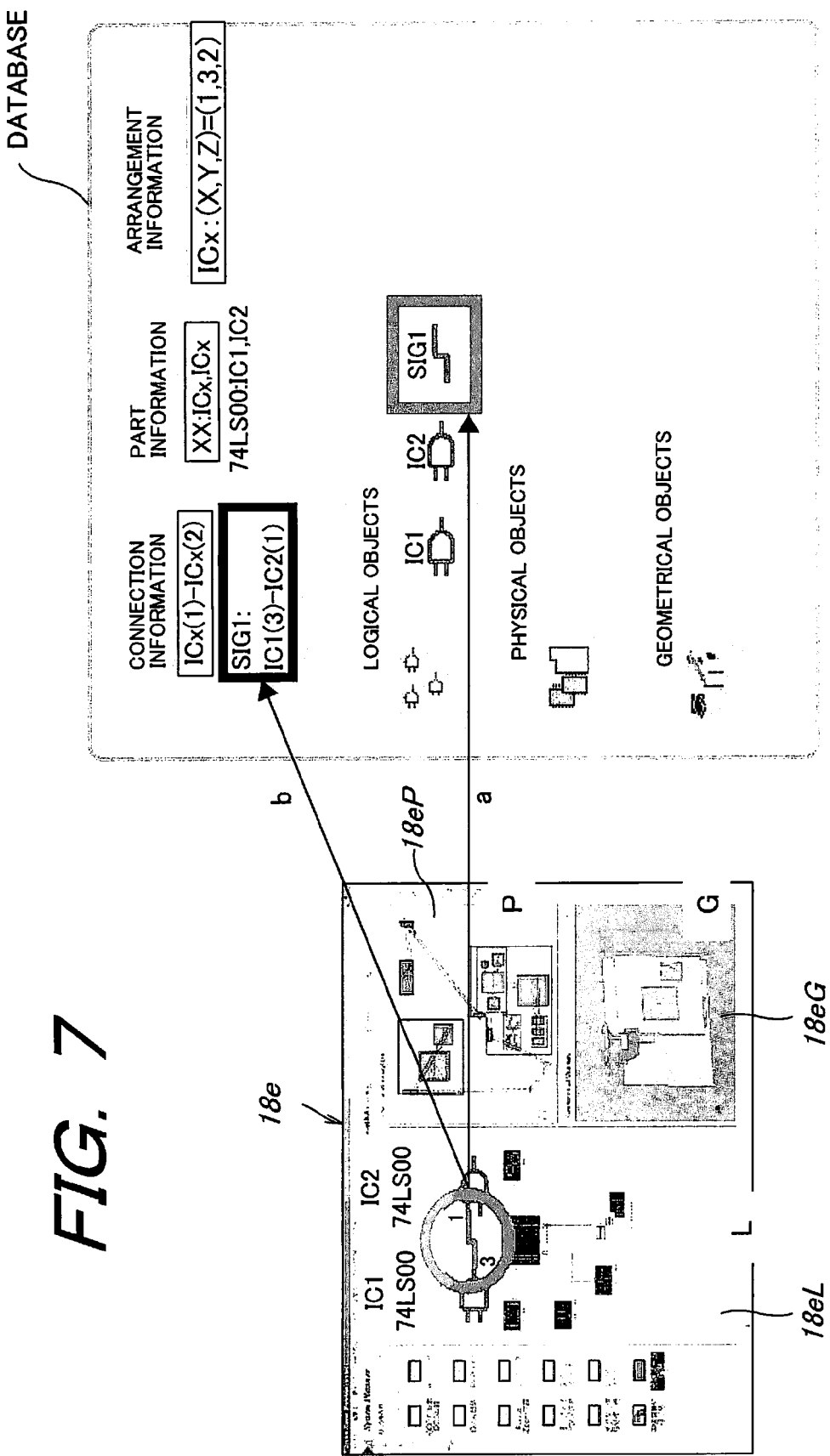
FIG. 7 is an explanatory view of a processing (signal connecting processing) in which a signal is newly connected to a logical display region of the display unit according to the present invention.
Figure 8:
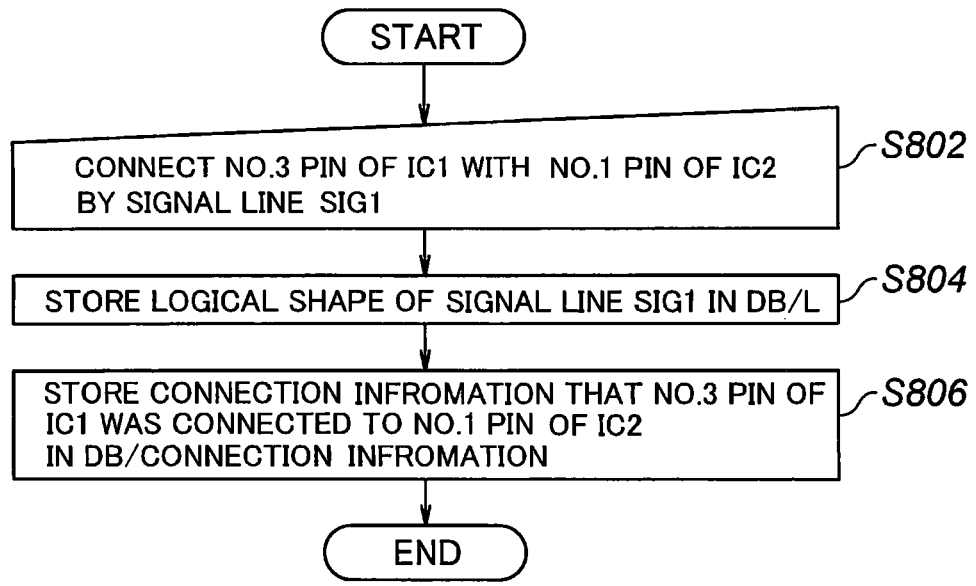
FIG. 8 is a flowchart showing the processing routine of the signal connecting processing according to the present invention.

In the example of this signal connecting processing, the user signal-connected "the third pin of IC1" and "the first pin of IC2" by using the character input device 18f or the pointing device 18g on the logical display region 18eL as shown in FIG. 7.

More specifically, in the processing routine of the signal connecting processing, when the user newly inputted a signal line SIG1 connecting the third pin of IC1 and the first pin of IC2 on the logical display region 18eL by using the character input device 18f or the pointing device 18g to connect the third pin of IC1 and the first pin of IC2 by the signal line SIG1 (step S802), a symbol being the logical shape of the signal line SIG1 is stored in Logical objects of the database (step S804) and furthermore, connection information "SIG1:IC1(3)-IC2(1)" that the third pin of IC1 and the first pin of IC2 were connected is stored in the connection information of the database (step S806), and this processing routine is ended.

In short, as shown in FIG. 7, one symbol showing the shape of connection line being a new object is added to Logical objects as information of the database (refer to a of FIG. 7), and information "SIG1: IC1(3)-IC2(1)" regarding a signal name SIG1 is added as the connection information (refer to b of FIG. 7).

Next, in the state shown in FIG. 7, description will be made for a processing where a part is newly arranged on the physical display region 18eP of the display unit 18e and the physical display region 18eP and the geometrical display region 18eG are changed in an interlocked manner based on the part arrangement (part arrangement &P→G interlock processing) while referring to FIG. 9. It is to be noted that a flowchart showing the processing routine of the part arrangement &P→G interlock processing shown in FIG. 10 will be referred to as well.

Figure 9:
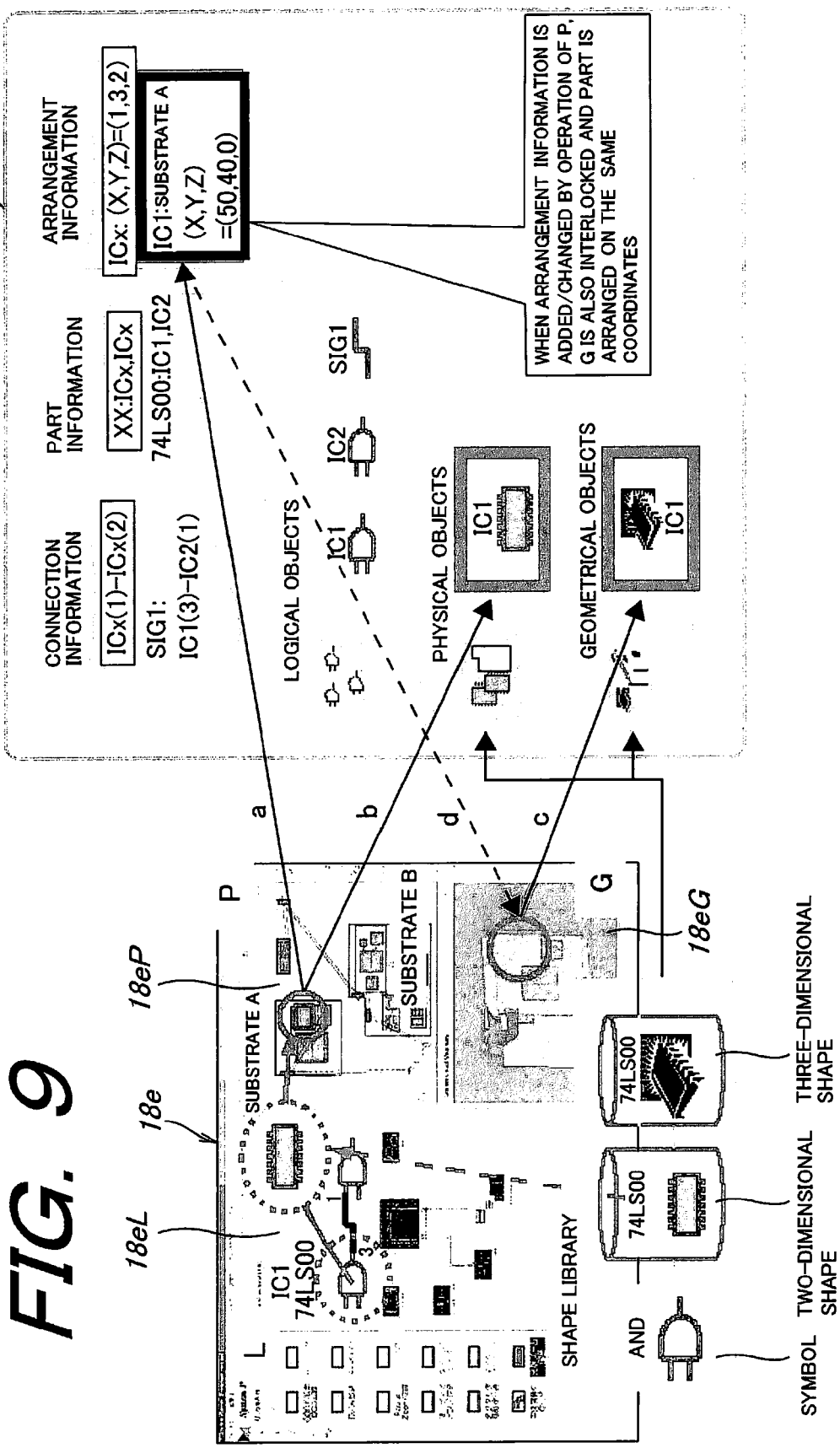
FIG. 9 is an explanatory view of a processing (part arrangement &P→G interlock processing) in which a part is newly arranged in a physical display region of the display unit according to the present invention, and a physical display region and a geometrical display region are changed in an interlocked manner by the part arrangement.

In the example of this part arrangement &P→G interlock processing, as shown in FIG. 9, when the user performs drag&drop (drag and drop) where he/she drags IC1 displayed on the logical display region 18eL by using the pointing device 18g to bring it to the physical display region 18eP and drops IC1 on a substrate A displayed on the physical display region 18eP, IC1 is arranged on the substrate A displayed on the physical display region 18eP, and IC1 is also automatically arranged on the geometrical display region 18eG simultaneously.

More specifically, in the part arrangement &P→G interlock processing routine, when the user selects IC1 displayed on the logical display region 18eL (74LS00) by using the mouse as the pointing device 18g (step S1002) the two-dimensional shaped part of 74LS00 is searched from the shape library (step S1004).

After that, the two-dimensional shape searched on step S1004 is temporarily displayed to allow the shape to follow the movement of the mouse (drag) (step S1006) IC1 is dropped and arranged on the substrate A while designating a position by the mouse on the screen of the physical display region 18eP (step S1008) It is to be noted that a coordinate value designated by the mouse should be (X,Y,Z)=(50,40,0).

Next, information that IC1 was arranged on the coordinate value designated by the mouse (X,Y,Z)=(50,40,0) "IC1: substrate A (X,Y,Z)=(50,40,0)" is stored in the arrangement information of the database (step S1010).

After that, a signal that the arrangement information was added on the screen of the physical display region 18eP is transmitted to the screen of the geometrical display region 18eG (step S1012), processings on and after step S1016 are performed on the screen of the geometrical display region 18eG that received the signal (step S1014).

More specifically, only the coordinate value of the added IC1 is read out from the arrangement information of the database, and the read-out coordinate value is stored in the RAM 18c (hereinafter, simply appropriately referred to as "memory") (step S1016).

Next, the fact that the added IC1 is 74LS00 is read out from the part information of the database, and the read-out 74LS00 is stored in the memory (step S1018).

Furthermore, the three-dimensional shaped part of 74LS00 stored in the memory is searched from the shape library of the database (step S1020), the searched three-dimensional shaped part is arranged on the coordinate value of IC1 stored in the memory (step S1022) on the screen of the geometrical display region 18eG, and this processing routine is ended.

In short, as shown in FIG. 9, information shown below is added as the information of the database.

The coordinate value of IC1 the arrangement information (refer to a of FIG. 9)

The two-dimensional shape of IC1 as the objects of Physical objects (refer to b of FIG. 9)

The three-dimensional shape of IC1 as the objects of Geometrical objects created by automatically arranging IC1 on the screen of the geometrical display region 18eG (refer to c of FIG. 9)

Since the arrangement information is shared by Physical objects and Geometrical objects, so that when a part is arranged on the physical display region 18eP, display on the geometrical display region 18eG is also interlocked and synchronized (refer to d of FIG. 9).

Next, in the state shown on FIG. 9, description will be made for a processing (part movement &G→P interlock processing) in which IC1 is moved on the screen of the geometrical display region 18eG of the display unit 18e and IC1 is automatically moved simultaneously on the screen of the physical display region 18eP, while referring to FIG. 11. It is to be noted that a flowchart showing the processing routine of part movement &G→P interlock processing shown in FIG. 12 will be referred to as well.

Figure 11:
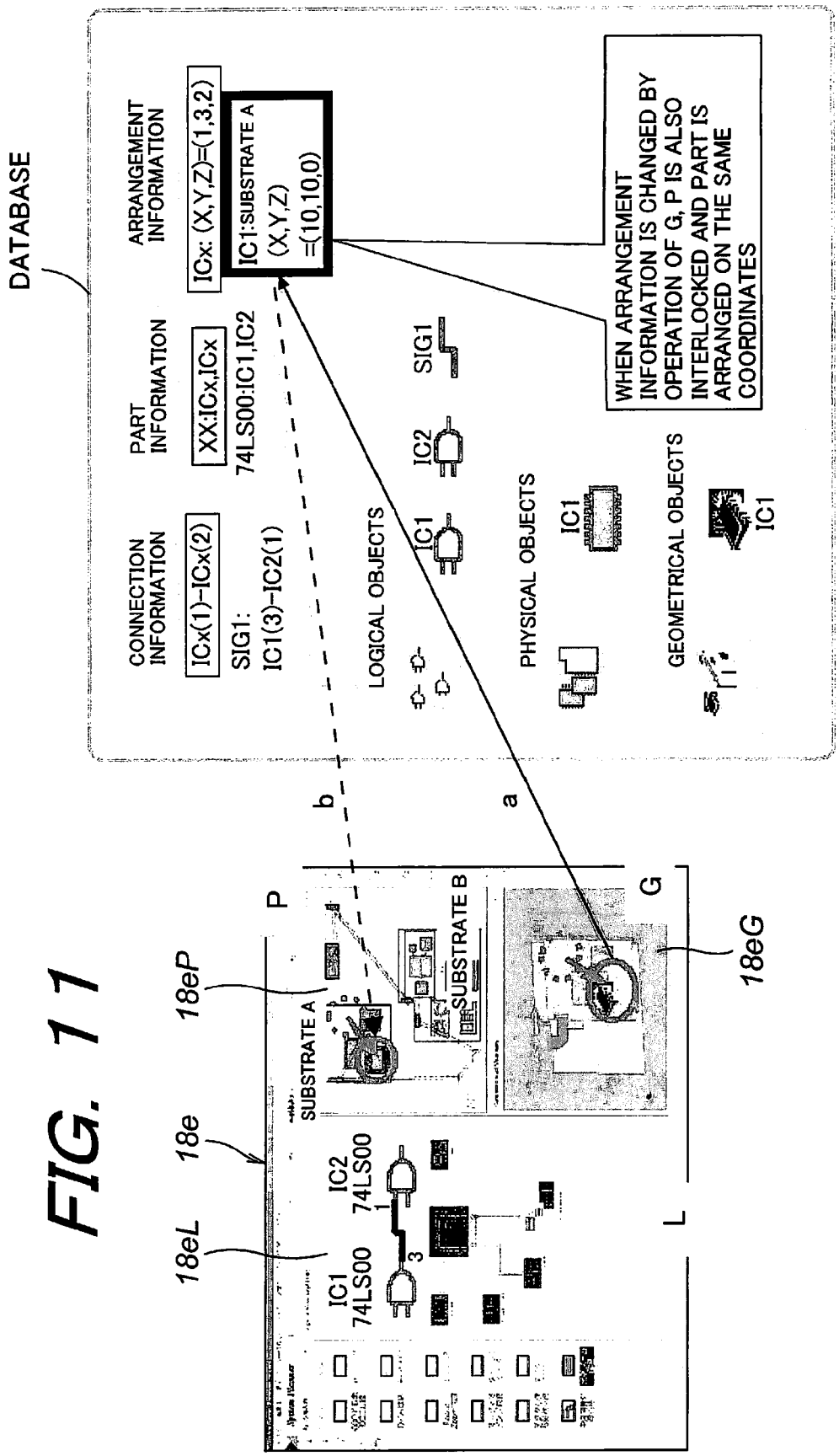
FIG. 11 is an explanatory view of a processing (part movement &G→P interlock processing) in which IC1 is moved on the screen of the geometrical display region of the display unit according to the present invention and IC1 is automatically moved simultaneously on the screen of the physical display region.

In the example of this part movement &G→P interlock processing, as shown in FIG. 11, when the user performs drag&drop (drag and drop) in which IC1 displayed on the geometrical display region 18eG is dragged and moved to another position on the geometrical display region 18eG and dropped on the another position by using the pointing device 18g, the arrangement of IC1 displayed on the geometrical display region 18eG is changed, and the position of IC1 on the physical display region 18eP is also changed simultaneously.

More specifically, in part movement &G→P interlock processing, when the user selects IC1 displayed on the geometrical display region 18eG by using the mouse as the pointing device 18g (step S1202), the three-dimensional shape of the selected IC1 is temporarily displayed to allow it to follow the movement of the mouse (drag) (step S1204), and IC1 is dropped and arranged on a destination while performing position designation by the mouse on the screen of the geometrical display region 18eG (step S1206). It is to be noted that the coordinate value of the destination designated by the mouse should be (X,Y,Z)=(10,10,0).

Next, "IC1: substrate A (X,Y,Z)=(50,40,0)" being the arrangement information of IC1 stored in the arrangement information of the database is changed to the coordinate value (X,Y,Z)=(10,10,0) of the destination designated by the mouse on the substrate A (step S1208).

Then, a signal that the arrangement information was added on the screen of the geometrical display region 18eG is transmitted to the screen of the physical display region 18eP (step S1210), processings on and after step S1214 are performed on the screen of the physical display region 18eP that received the signal (step S1212).

More specifically, the coordinate value of IC1 is read out from the arrangement information of the database, and the read-out coordinate value is stored in the memory (step S1214).

Next, on the screen of the physical display region 18eP, IC1 is moved to the coordinate value stored in the memory (step S1216), and this processing routine is ended.

In short, as shown in FIG. 11, the coordinate value of IC1 stored in the arrangement information is changed as information of the database (refer to a of FIG. 11).

Then, the computer system 10 detects the fact that the arrangement information was changed, IC1 displayed on the screen of the physical display region 18eP is automatically moved to the coordinate value stored in the arrangement information (refer to b of FIG. 11).

Figure 10:
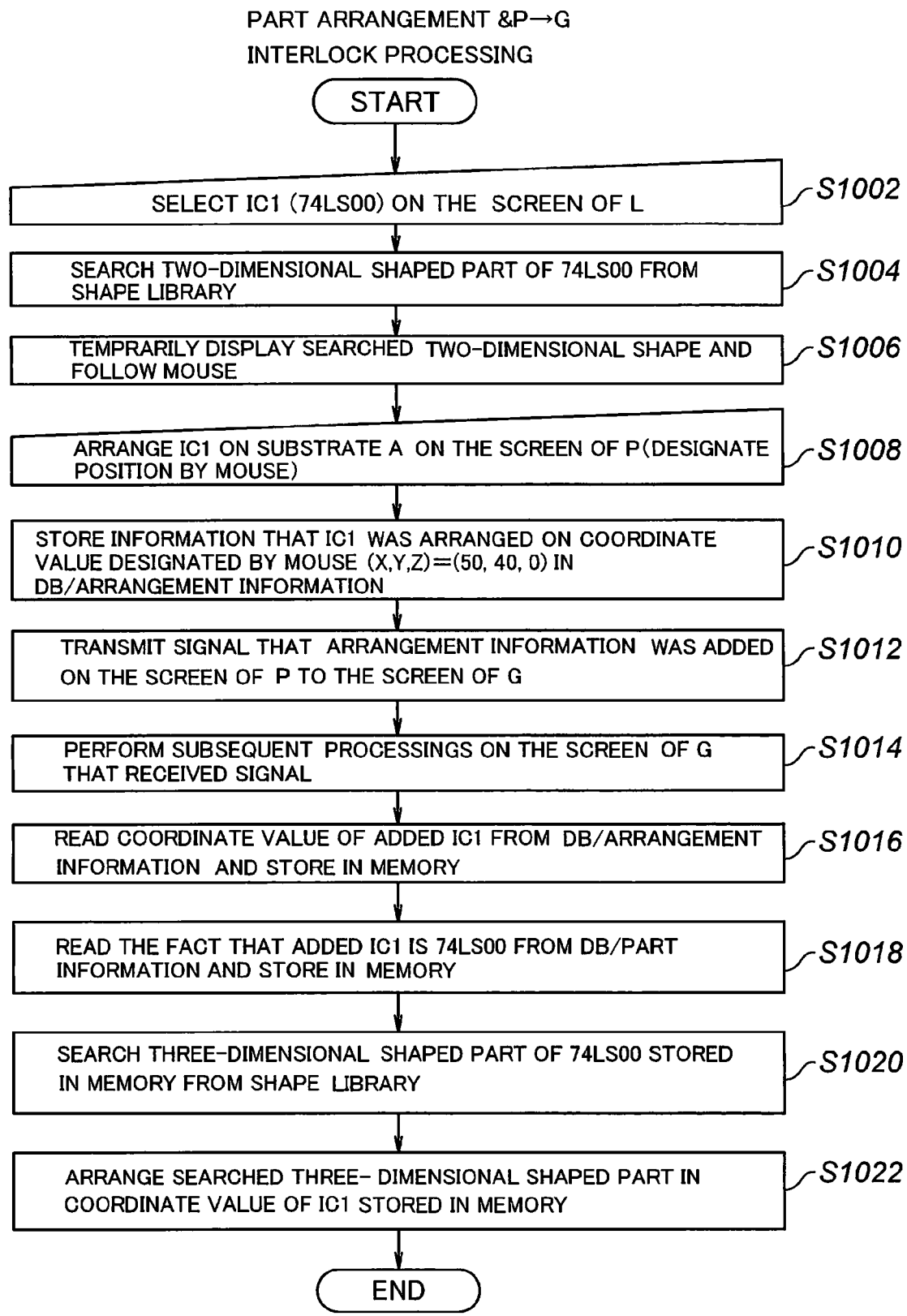
FIG. 10 is a flowchart showing the processing routine of the part arrangement &P→G interlock processing according to the present invention.
Figure 12:
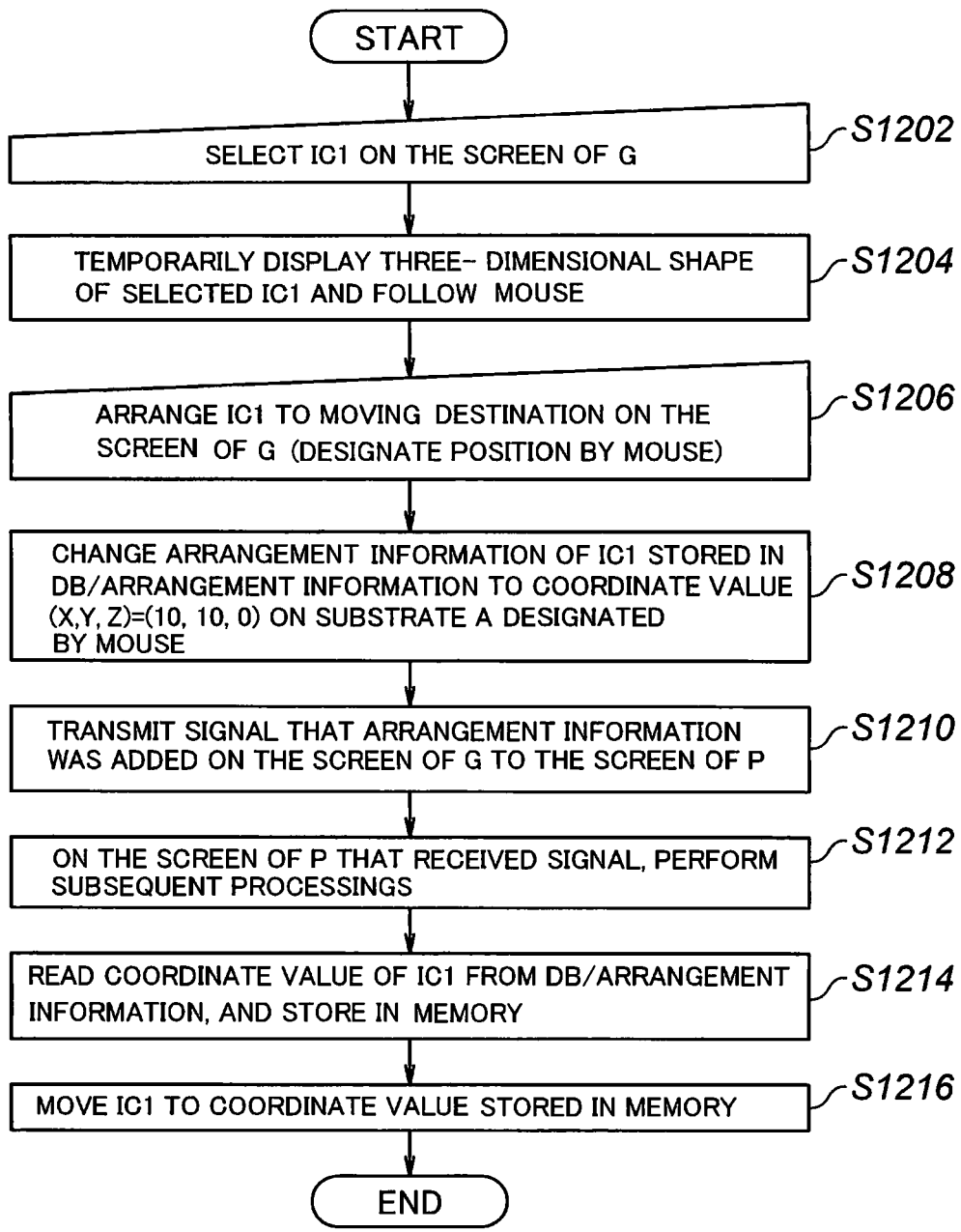
FIG. 12 is a flowchart showing the processing routine of the part movement &G→P interlock processing according to the present invention.

Although the above-described processing of part arrangement described while referring to FIG. 9 and FIG. 10 allows the displays on the both display regions to be synchronized so as to reflect the change of screen display of the physical display region 18eP on the screen display of the geometrical display region 18eG, the above-described processing of part arrangement described while referring to FIG. 11 and FIG. 12 allows the displays on the both display regions to be synchronized so as to reflect the change of the screen display of the geometrical display region 18eG on the screen display of the physical display region 18eP.

Next, in the state shown on FIG. 11, description will be made for a processing (part arrangement &L→P G interlock processing) in which IC2 is dragged&dropped from the screen of the logical display region 18eL of the display unit 18e and arranged on a substrate B on the screen of the physical display region 18eP of the display unit 18e while referring to FIG. 13. It is to be noted that a flowchart showing the processing routine of part arrangement &L→P→G interlock processing shown in FIG. 14 will be referred to as well.

Figure 13:
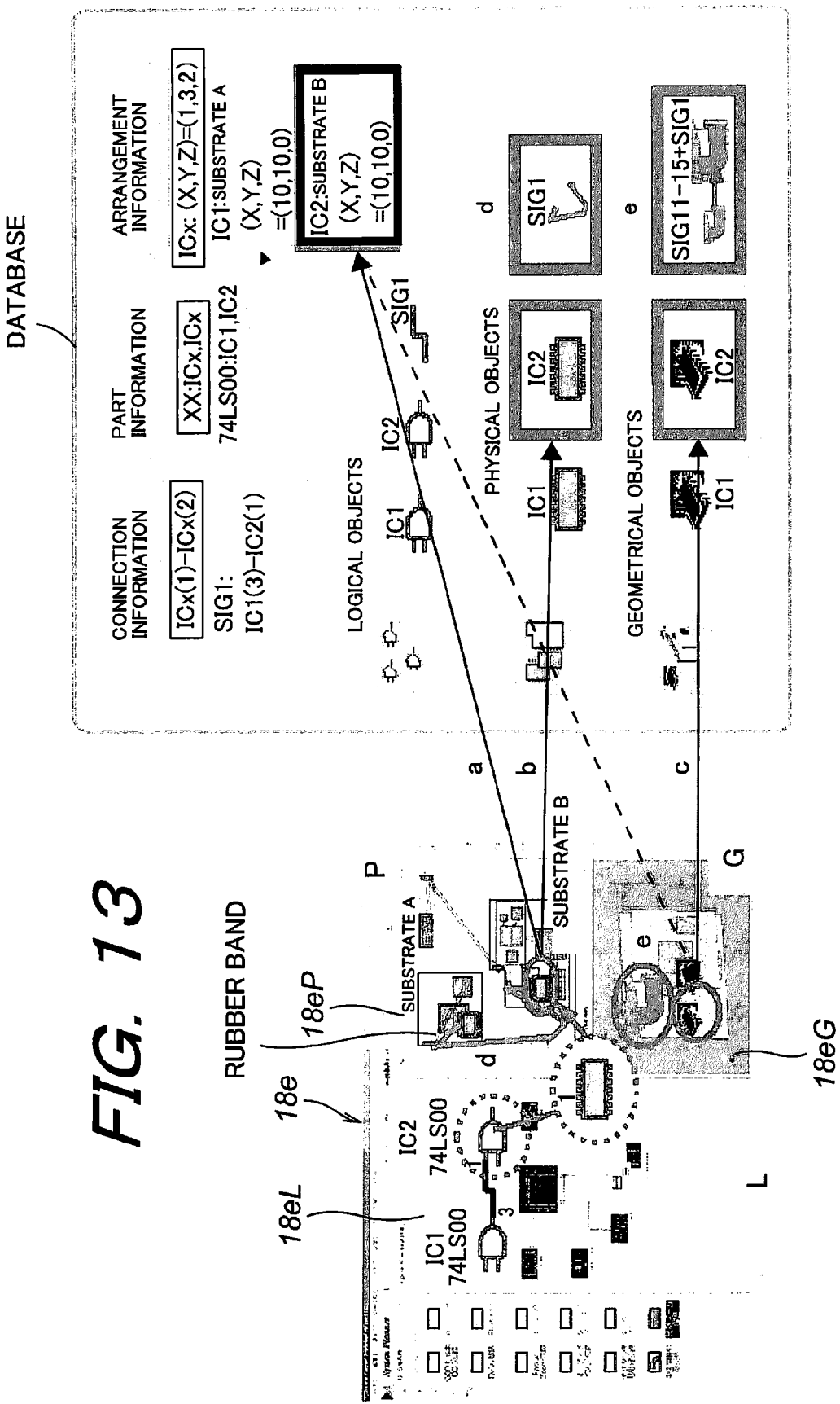
FIG. 13 is an explanatory view of a processing (part arrangement &L→P→G interlock processing) in which IC2 is dragged & dropped from the screen of the logical display region of the display unit according to the present invention and arranged on the substrate B on the screen of the physical display region of the display unit.
Figure 14:
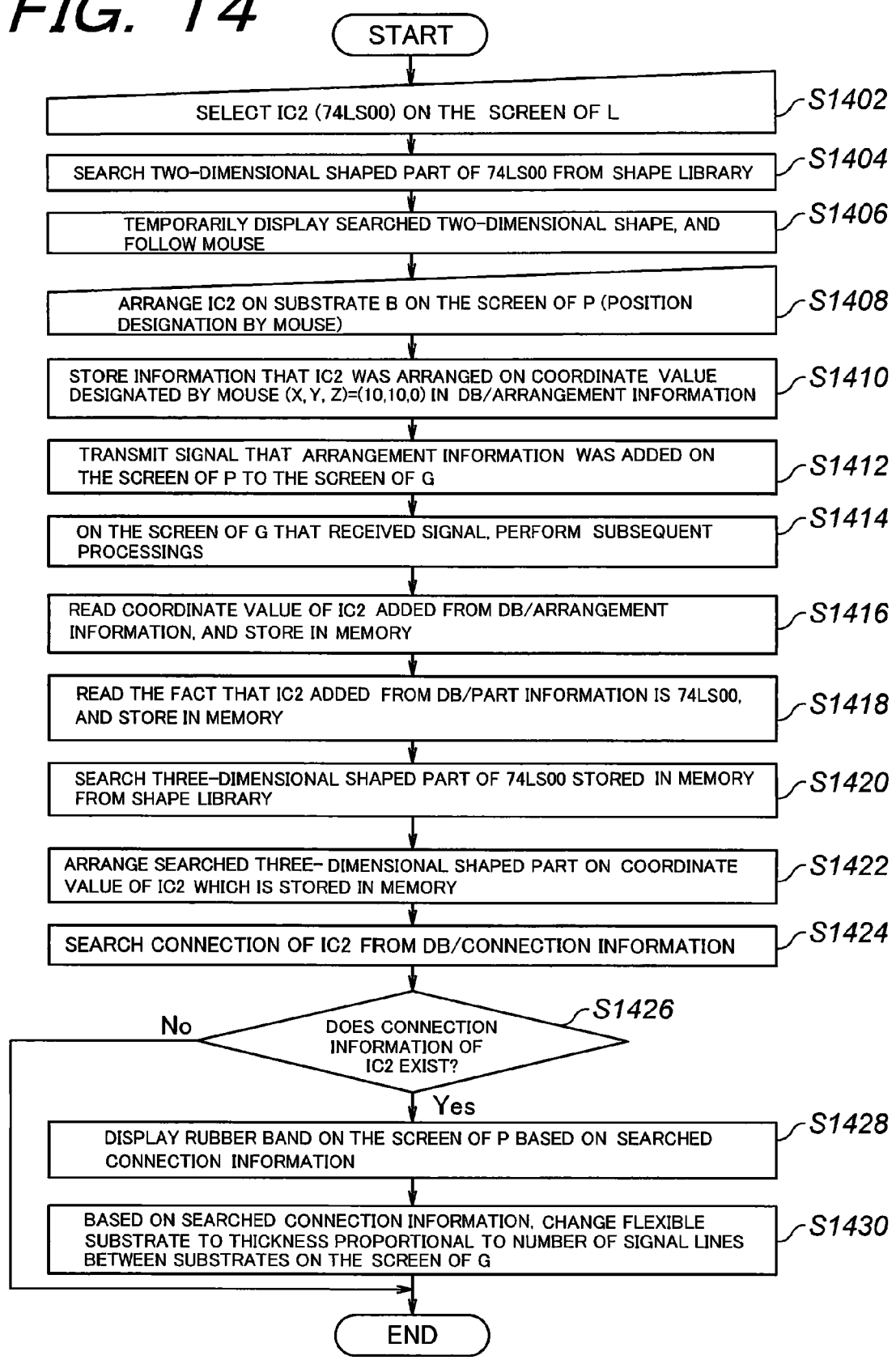
FIG. 14 is a flowchart showing a processing routine of part arrangement &L→P→G interlock processing according to the present invention.

In the example of this part arrangement &L→G→P interlock processing, as shown in FIG. 13, when the user performs drag&drop where IC2 displayed on the logical display region 18eL is dragged by using the pointing device 18g and dropped on the substrate B displayed on the physical display region 18eP, IC2 displayed on the logical display region 18eL is displayed on the substrate B in the physical display region 18eP.

More specifically, in the part movement &L→G→P interlock processing, when the user selects IC2 (74LS00) displayed on the logical display region 18eL by using the mouse as the pointing device 18g (step S1402), the two-dimensional shaped part of 74LS00 is searched from the shape library (step S1404).

Then, the two-dimensional shaped searched on step S1404 is temporarily displayed to allow it to follow the movement of the mouse (drag) (step S1406), and IC2 is dropped and arranged on the substrate B while performing position designation by the mouse on the screen of the physical display region 18eP (step S1408).

It is to be noted that the coordinate value designated by the mouse should be (X,Y,Z)=(10,10,0).

Next, information "IC2: substrate B (X,Y,Z)=(10,10,0)" that IC2 was arranged on the coordinate value designated by the mouse (X,Y,Z)=(10,10,0) is stored in the arrangement information of the database (step S1410).

After that, a signal that the arrangement information was added on the screen of the physical display region 18eP is transmitted to the screen of the geometrical display region 18eG (step S1412), and processings on and after step S1416 are performed on the screen of the geometrical display region 18eG that received the signal (step S1414).

More specifically, the coordinate value of the added IC2 is read out from the arrangement information of the database, and the read-out coordinate value is stored in the memory (step S1416).

Next, the fact that the added IC2 is 74LS00 is read out from the part information of the database, and the read-out 74LS00 is stored in the memory (step S1418).

Furthermore, the three-dimensional shaped part of 74LS00 stored in the memory is searched from the shape library of the database (step S1420), and the searched three-dimensional shaped part is arranged on the coordinate value of IC2 stored in the memory, on the screen of the geometrical display region 18eG (step S1422).

Next, connection of IC2 is searched from the connection information of the database (step S1424), and whether or not the connection information of IC2 exists is judged (step S1426).

In the case of judgment where the connection information of IC2 does not exist in the judgment processing of this step S1426, this processing routine is ended.

On the other hand, in the case of judgment where the connection information of IC2 exists on the judgment processing of step S1426, rubber band is displayed on the screen of the physical display region 18eP based on the searched connection information (step S1428).

Then, based on the searched connection information, a flexible substrate is changed to a thickness proportional to the number of signal lines between a plurality of substrates on the screen of the geometrical display region 18eG (step S1430), and this processing routine is ended.

In short, as shown in FIG. 13, information below is added as information of the database.

The coordinate value of IC2 as the arrangement information (refer to a of FIG. 13)

The two-dimensional shape of IC2 as the objects of Physical objects (refer to b of FIG. 13)

The three-dimensional shape of IC2 as the objects of Geometrical objects (refer to c of FIG. 13)

Then, the following is added and displayed simultaneously.

Rubber band between IC2 and IC1 as the objects of Physical objects (FIG. 13d)

And then, the following information is added.

Flexible substrate is made thicker in proportion to the number of signal lines as the objects of Geometrical objects.

More specifically, since Logical objects, Physical objects and Geometrical objects share the connection information, rubber band showing electrical connection is displayed synchronously with the connection information inputted on the logical display region 18eL simultaneously with the arrangement of a part on the physical display region 18eP.

Next, in the state shown on FIG. 13, description will be made for a processing (signal deleting &L→P→G interlock processing) where a signal line connecting IC1 and IC2 is deleted on the screen of the logical display region 18eL of the display unit 18e while referring to FIG. 15. It is to be noted that a flowchart showing the processing routine of signal deleting &L→P→G interlock processing shown in FIG. 16 will be referred to as well.

Figure 15:
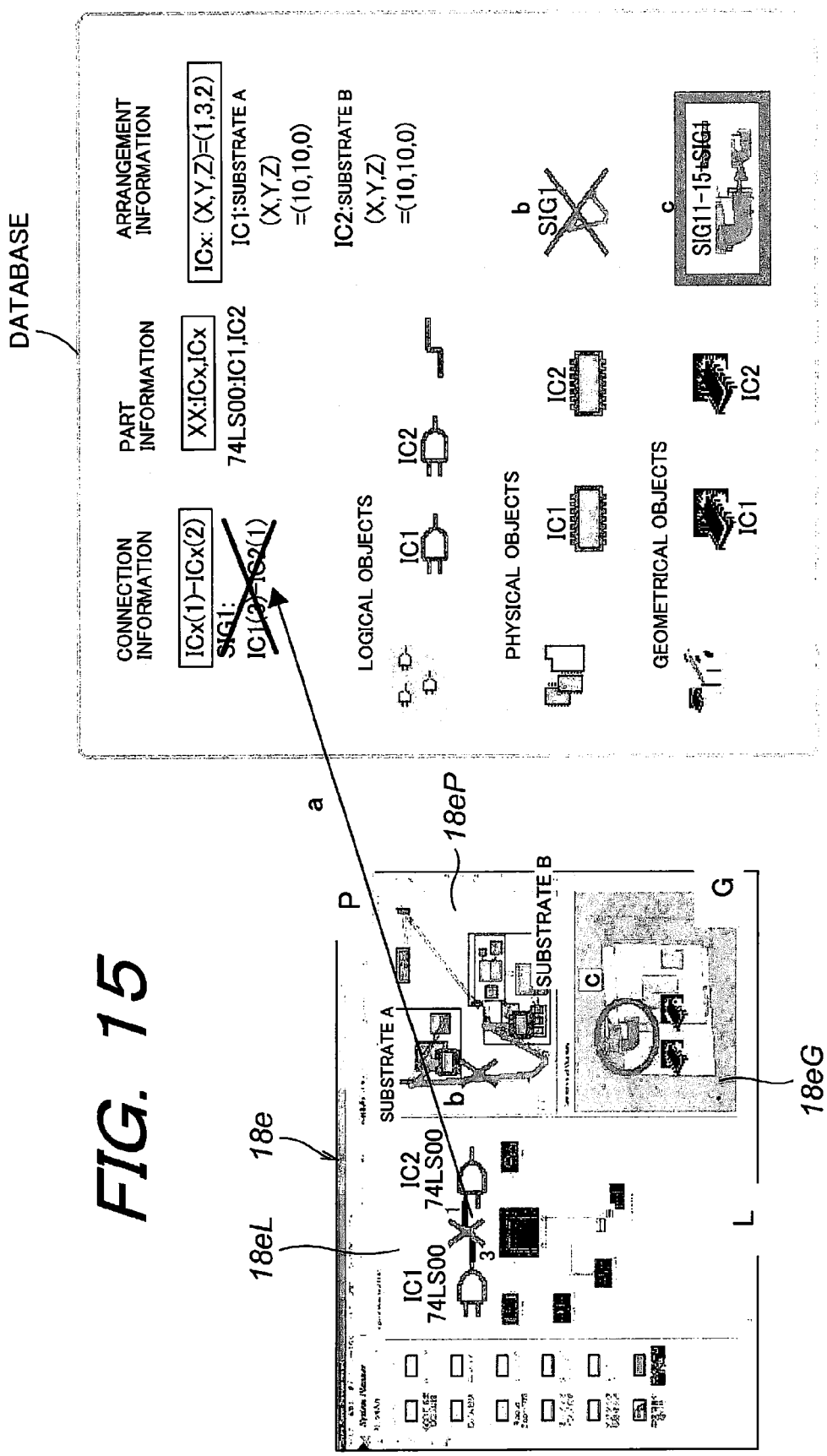
FIG. 15 is an explanatory view of a processing (signal deleting &L→P→G interlock processing) in which a signal line connecting IC1 and IC2 is deleted on the screen of logical display region of the display unit according to the present invention.
Figure 16:
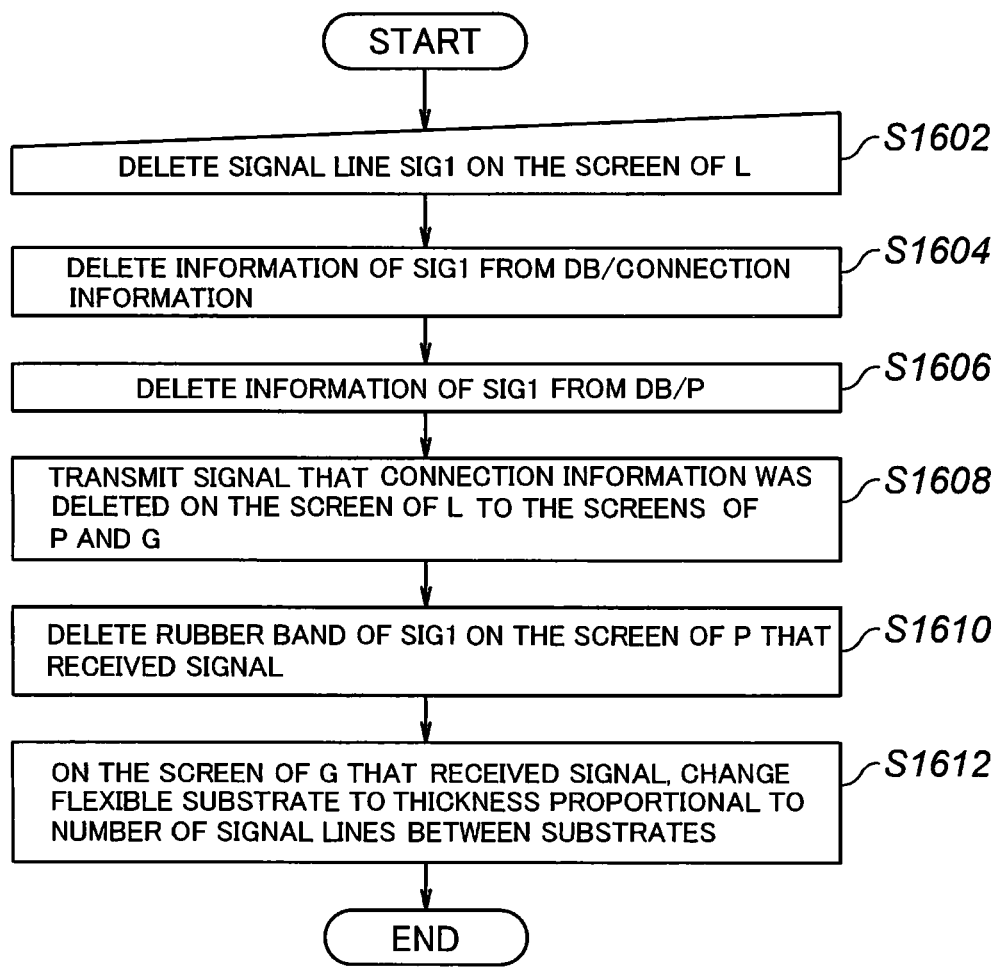
FIG. 16 is a flowchart showing the processing routine of the signal deleting &L→P→G interlock processing according to the present invention.

In the example of L→P→G interlock processing associated with this signal deleting, as shown in FIG. 15, when the user deletes the signal line SIG1 connecting IC1 and IC2 displayed on the logical display region 18eL by using the pointing device 18g, the rubber band is deleted from the screen of the physical display region 18eP, and the flexible substrate on the screen of the geometrical display region 18eG is displayed thin proportionally to the number of signal lines.

More specifically, in the signal deleting &L→P→G interlock processing, when the user deletes the signal line SIG1 displayed on the logical display region 18eL by using the mouse as the pointing device 18g (step S1602), the information of SIG1 is deleted from the connection information of the database (step S1604), and the information of SIG1 is deleted from Physical objects of the database (step S1606).

After that, signal that the connection information was deleted on the screen of the logical display region 18eL is transmitted to the screen of the physical display region 18eP and the geometrical display region 18eG (step S1608), the rubber band of SIG1 is deleted on the screen of the physical display region 18eP that received the signal (step S1610), the flexible substrate is change to a thickness proportional to the number of signal lines between a plurality of substrates on the screen of the geometrical display region 18eG that received the signal (step S1612), and this processing routine is ended.

In short, as shown in FIG. 15, the information of the database is changed as follows while a signal name SIG1 is used as a key.

The connection information between IC1 and IC2 of the signal name SIG1 is deleted from the connection information (refer to a of FIG. 15)

SIG1 is deleted from Physical objects and the rubber band is also deleted from the screen of the physical display region 18eP (refer to b of FIG. 15)

The flexible substrate is made thin proportionally to the number of signal lines as the objects of Geometrical objects.

More specifically, since Logical objects, Physical objects and Geometrical objects share the connection information, information regarding the physical display region 18eP and the geometrical display region 18eG is also automatically changed simultaneously with the deletion of a signal line on the logical display region 18eL so as to hold matching.

In the above, description was made that the shape of the flexible substrate was changed together with the change of a signal line between a plurality of substrates, but a connector connecting the flexible substrates on the above-described plurality of substrates and a printed board arranged is also automatically changed to a connector having the number of pins suitable to the signal line between the above-described plurality of substrates.

Next, description will be made for a processing of automatic arrangement of electric parts including peripheral parts (automatic arranging processing) which is executed by the computer system 10.

Figure 17A:
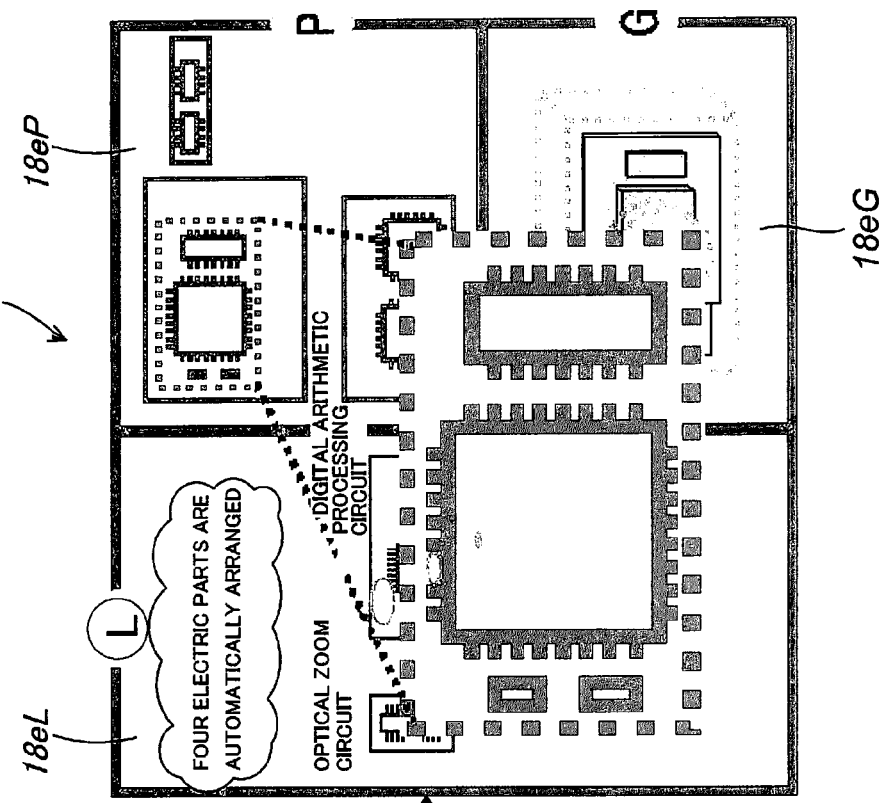
FIG. 17 is an explanatory view of the processing of automatic arrangement of electric parts including peripheral parts according to the present invention (automatic arrangement processing).
Figure 17B:
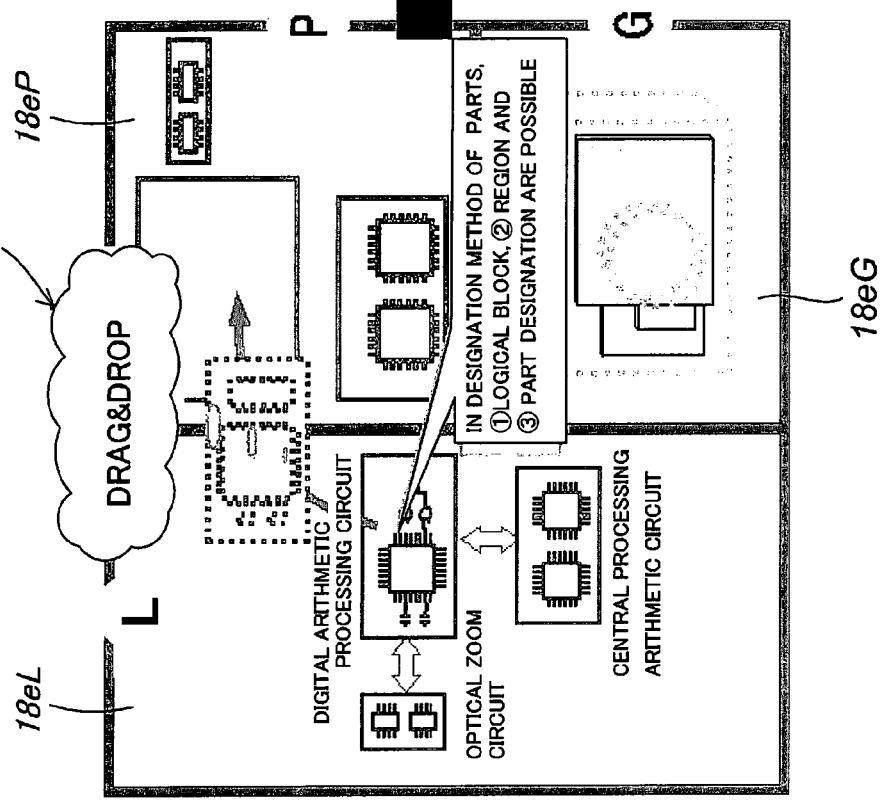

Herein, FIG. 17 shows an example of the automatic arranging processing, and this example shows the state where, when the user selects a logical block "digital arithmetic processing circuit" on the logical display region 18eL by using the pointing device 18g and performs part arrangement to the selected digital arithmetic processing circuit on the physical display region 18eP by the drag&drop operation (refer to FIG. 17(a)), mutual positional relation between a plurality of circuit parts, that is, four electric parts specifically, on the physical display region 18eP and the parts are automatically arranged by a method (described later), in arranging the digital arithmetic processing circuit on the physical display region 18eP (refer to FIG. 17(b)).

Meanwhile, as a designation method of items to be arranged on the physical display region 18eP, designation by "logical block", "region" and "part" can be performed.

Hereinafter, description will be made in detail for the automatic arranging processing being the processing of automatic arrangement of electric parts including peripheral parts by referring to each drawing on and after FIG. 18.

In Each drawing on and after FIG. 18, an example of the automatic arranging processing where one or more circuit parts are automatically arranged, and in an automatic arranging processing of arranging circuit parts by the computer system 10, the processings below are executed in order by arranging circuit parts.

(1) Decision of key devices (primary parts)
(2) Decision of arranging order of circuit parts
(3) Arrangement of circuit parts according to the arranging order decided in (2) above To make the present invention easily understood, it is assumed that circuit parts automatically arranged in the example below are shown in FIG. 18.

More specifically, it is assumed that circuit parts to be automatically arranged are illustrated in FIG. 18(b) being the partially enlarged view of FIG. 18(a), these illustrated four parts are P1, P2, P3, P4, and the number of terminals of each part (PIN number) is 32 for P1, 14 for P2, 2 for P3, and 2 for P4.

First, description will be made for the processing method of "(1) Decision of a key device" by referring to a flowchart showing the processing routine of the automatic arranging processing shown in FIG. 18 and FIG. 22.

More specifically, when the processing routine of the automatic arranging processing is activated, the processing of "(1) Decision of a key device" is performed on step S2202 to step S208.

Specifically, when the user selects parts that need to be automatically arranged on the logical display region 18eL by using the pointing device 18g (step S2202) whether or not selected part is plural is judged on step S2202 (step S2204).

In the judgment processing on step S2204, in the case of judgment that the selected part is not plural, more specifically, is single, the part selected on step S2202 is arranged on a designated position (step S2206) and this processing routine is ended.

On the other hand, in the judgment processing on step S2204, in the case where the selected part is judged to be plural, a part having the largest number of terminals is searched out of the selected parts, the searched part having the largest number of terminals is stored in the memory as a key device (step S2208).

More specifically, the part having the largest the number of terminals is decided as a key device as described above, and the example shown in FIG. 18 will be specifically described. In the example shown in FIG. 18, since the four parts of P1, P2, P3, P4 are selected on step S2202, P1 having the largest number of terminals out of P1, P2, P3, P4 is decided as a key device on step S2208, and stored in the memory.

Meanwhile, in deciding a key device, it goes without saying that an arbitrary part may be manually decided as a key device instead of deciding a part having the largest number of terminals as a key device as described above.

Next, description will be made for the above-described processing method "(2) Decision of arranging order of circuit parts" while referring to a flowchart showing the processing routine of the automatic arranging processing shown in FIG. 19 and FIG. 22.

Herein, in the present invention, arranging order of parts is decided starting from the largest number of signal lines connected to the key device, and the processing of "(2) Decision of arranging order of circuit parts" is executed by step S2210 to step S2212.

Specifically, the parts selected on step S2202 are arrayed starting from the largest number of signal lines connected to the key device and stored in the memory (step S2210), a part that is not signal-connected to the key device out of the parts selected on step S2202 is stored in the memory as an unconnected part (step S2212).

The example shown in FIG. 18 will be specifically described. The arranging order of each part connected to the circuit part P1 that was decided to be the key device in the processing of "(1) Decision of key devices", more specifically P2, P3, P4 is decided starting from the largest number of signal lines.

Figure 19A:
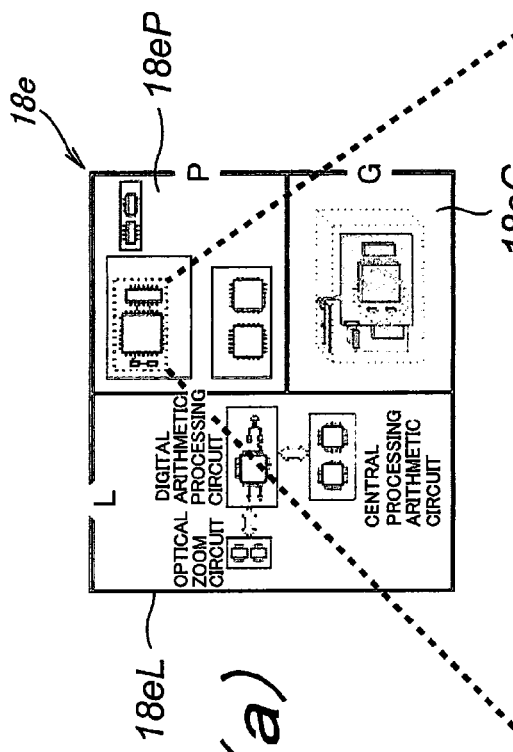
FIGS. 19(a)(b)(c) are explanatory views of the processing of automatic arrangement of electric parts including peripheral parts according to the present invention (automatic arranging processing), where
Figure 19B:
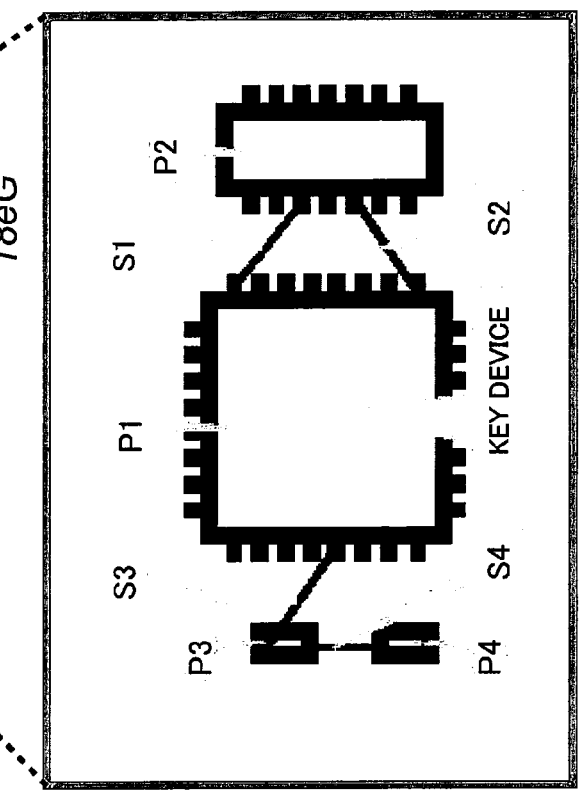
FIG. 19(b) is a partially enlarged view corresponding to FIG. 18(b)

Herein, assuming that each signal line of P1, P2, P3, P4 is S1, S2, S3, S4 as illustrated in FIG. 19(b) being the partially enlarged view of FIG. 19(a) corresponding to FIG. 18(a) (FIG. 19(b) corresponds to FIG. 18(b)), the number of signal lines of each part which is connected to the key device P1 is as follows.

P2 . . . 2 (signal lines S1, S2)
P3 . . . 1 (signal line S3)
P4 . . . 0 (no signal line)
And the arranging order is decided in P2→P3→P4.

It is to be noted that the arranging order should only be decided based on the determination standard below, for example, in the case where the number of signal lines is the same.

More specifically, first, in the case where the number of signal lines is the same, the judging standard that parts are arranged "starting from the largest number of terminals of part" is used, then, the judging standard that parts are arranged "starting from the largest part area" is used in the case where the number of terminals is the same, and then, the judging standard that parts are arranged "starting from the largest registration number in the shape library (Registration No.)" is used in the case where the part area is the same.

Figure 19C:
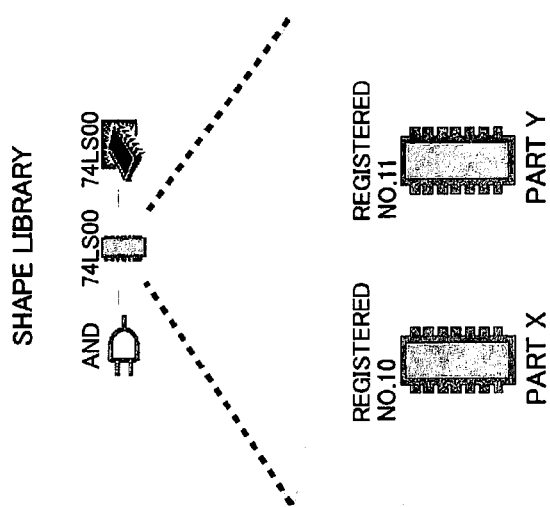
FIG. 19(c) is an explanatory view of registration numbers in a shape library.

It is assumed that registration numbers are given to shapes registered with the shape library in the order starting from the earliest registration of each shape as shown in FIG. 19(c).

Therefore, in deciding an arranging order of parts below, for example, parts are compared by the number of signal lines first.

Part A (number of signal lines 2, number of terminals 14, part area 50 mm$^2$)

Part B (number of signal lines 2, number of terminals 14, part area 40 mm$^2$)

However since the number of signal lines is the same on 2, comparison will be done by the part area next.

Herein, since the number of terminals is the same on 14, comparison will be done in the part area next, in which the part area of part A is judged to be larger, and the arranging order is decided that part A is arranged first and then part B is arranged (part A part B).

In the case where the part area is the same, it is decided that a part having a larger registration number in the shape library should be arranged first.

The registration number in the shape library is a number given when a part is registered with the shape library as described, which is a unique number given by each shape registered, and an arranging order can be uniquely decided. A part having a larger registration number is a part having a newer order registered with the shape library.

When part X and part Y shown in FIG. 19(c) are compared, the registration number of part X is "10" and the registration number of part Y is "11", so that part Y is judged to have a larger registration number.

Next, description will be made for the processing method of "(3) Arrangement of circuit parts according to the arranging order decided in (2) above" while referring to a flowchart showing the processing routine of the automatic arrangement processing shown in FIG. 21 and FIG. 22.

Herein, in the present invention, the processing of "(3) Arrangement of circuit parts according to the arranging order decided in (2) above" is performed on step S2214 to step S2228.

Specifically, each part shape stored in the memory on step S2210 and step S2212 is called from the shape library, and each part shape called from the shape library is stored in the memory (step S2214).

Next, the arranged angle and the arranging coordinates of each part are decided in the order stored on step S2210 around the key device, and stored in the memory (step S2216). Herein, regarding the coordinate value of each part, a position having the shortest route wiring length between key devices is decided as arranging coordinates.

After that, the arranged angle and the arranging coordinates of an unconnected part stored in the memory on step S2212 are decided stored in the memory (step S2218). Herein, regarding the coordinate value of each part, a position having the shortest route wiring length between connected parts is decided as arranging coordinates.

Next, the shape of key device is temporarily displayed such that the origin of key device follows the mouse (step S2220), and each part selected on step S2202 is arranged around the temporarily displayed key device and temporarily displayed (step S2222). In this occasion, each part is arranged on arranging coordinates at an arranging angle decided on step S2216 and step S2218. Further, each part is displayed in the part shape stored in the memory on step S2214.

Then, when the user designates an arranging position on the screen of the physical display region 18eP by using the pointing device 18g (step S2224), the coordinate value designated on the screen of the physical display region 18eP is used as the origin of the key device part, and the part is arranged in the temporary displayed state on step S2222 (step S2226).

Then, the arranging angle and the arranging coordinates of the parts selected on step S2202 are stored in the arrangement information of the database (step S2228), and this processing routine is ended.

Specifically, in the processing of "(3) Arrangement of circuit parts by the arranging order decided in (2) above", the part P1 decided by the processing of "(1) Decision of key device (primary parts)" is used as a key device, and each circuit part is arranged based on the arranging order of the peripheral parts, which is P2→P3→P4, by the processing of "(2) Decision of arranging order of circuit parts".

First, description will be made for a processing of arranging the part P2 by using the part P1 as a standard, the part P1 and the part P2 are connected by a signal line S1 and a signal line S2. Now, taking in consideration that the signal line S1 is connected by a wiring pattern, it should be an letter L distance instead of a rectilinear distance.

Figure 20A:
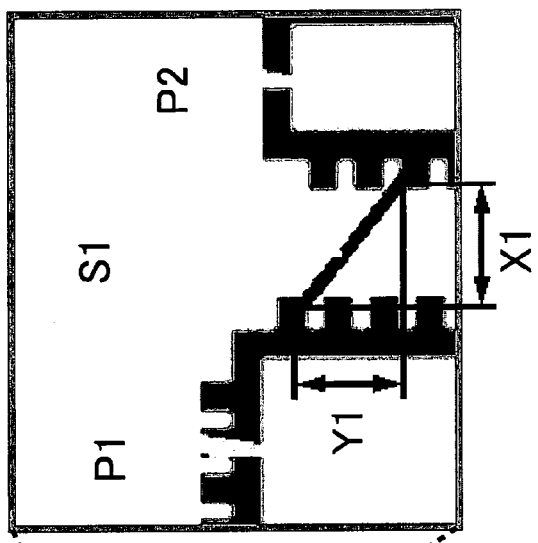
FIGS. 20(a)(b)(c) are explanatory views of the processing of automatic arrangement of electric parts including peripheral parts according to the present invention (automatic arranging processing), where
Figure 20B:
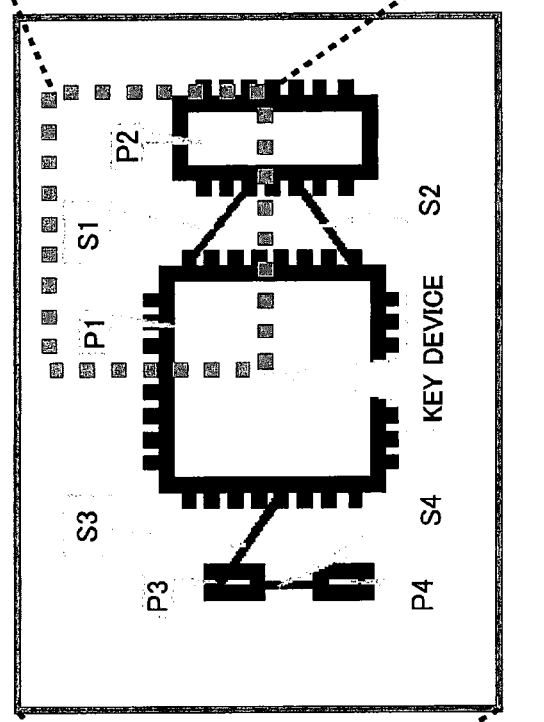
FIG. 20(b) is a partially enlarged view corresponding to FIG. 18(b)
Figure 20C:
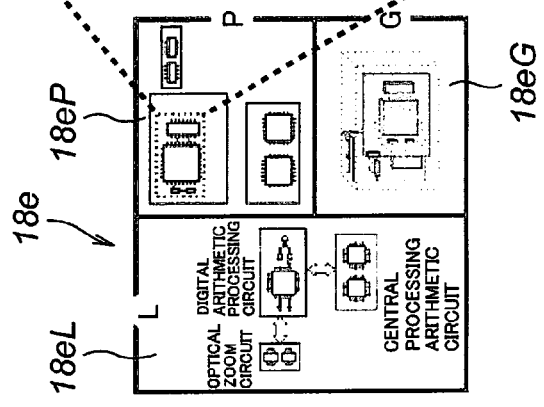
FIG. 20(c) is a principal portion enlarged view of FIG. 20(b).

Herein, as shown in FIG. 20(c) that is the principal portion enlarged view of FIG. 20(b) being the partially enlarged view of FIG. 20(a) corresponding to FIG. 18(a) (FIG. 20(b) corresponds to FIG. 18(b)), assuming that the distance of the signal line S1 in X direction is X1 and the distance in Y direction is Y1, the route wiring length of the signal line S1 (signal route length) should be:

$$\text{Rectilinear distance} = (X1^2 + Y1^2)^{1/2}$$

instead of

Letter $L$ distance $= (X1 + Y1)$

P2 is arranged at a position where the signal route length becomes the shortest and the parts P1 and P2 maintain a designated foil-to-foil distance.

Now, since P2 is connect with P1 by two signal lines of S1 and S2, P2 is arranged at a position where the total of the two signal route lengths of S1 and S2 becomes the shortest.

More specifically, assuming that the distance of the signal line S2 in X direction is X2 and the distance in Y direction is Y2, the part P2 is arranged at a position where the following becomes the shortest.

Route wiring length between P1 and P2 (signal route length) $= (X1 + Y1) + (X2 + Y2)$.

Next, description will be made for a processing where parts P3 and P4 are arranged by using the part P1 as a standard while referring to FIG. 21(b) being the partially enlarged view of FIG. 21(a) corresponding to FIG. 18(a) (FIG. 21(b) corresponds to FIG. 18(b)).

Herein, similar to the one described above, assuming that the distance of the signal line S3, to which the part P3 is connected, in X direction is X3 and the distance in Y direction is Y3, the route wiring length (signal route length) of S3 becomes as follows.

$$\text{Route wiring length between } P1 \text{ and } P3 \text{(signal route length)} = (X3 + Y3)$$

Meanwhile, to decide arranging angle of parts, a state where they are registered with the shape library is set as angle θ°, the signal route length is calculated in the order of 0°→90°→180°→270°, and the parts are arranged at an angle having the shortest signal route length.

In the case where the signal route length is the same, priority is set as follows, and the angle is decided to an angle having higher priority.

First: 0°
Second: 90°
Third: 180°
Fourth: 270°

For example, in the case where the signal route length is the same in the arranging angles of part 0° and 180°, the arranging angle of part is decided to 0° having higher priority.

On the other hand, since the part P4 is not connected to the key device P1, it is arranged at a position having the shortest route wiring length (signal route length) to the part P3 of a connecting destination in this case.

Similar to the one described above, assuming that the distance of the signal line S4 in X direction is X4 and the distance in Y direction is Y4, the signal route length of S4 becomes as follows.

$$\text{Route wiring length between } P3 \text{ and } P4(\text{signal route length}) = (X4+Y4)$$

In the case of a plurality of positions having the same signal route length, parts are arranged at a position having the shortest distance from the key device.

By the processing described above, positional relation between the key device and the peripheral parts can be decided.

Now, regarding the arranging positions on the substrate, peripheral parts are arranged while using a position designated by the mouse or the like is used as the origin of the key device.

Next, description will be made for another example of the processing of automatic arrangement of electric parts including peripheral parts (automatic arranging processing) executed by the computer system 10, specifically, for a method in which a plurality of substrates blocks are connected by the connector and the flexible substrate (hereinafter, appropriately referred to as "flex substrate") according to the electrical connection information. More specifically, description will be made for a method in which substrate blocks, which are not electrically connected to each other, are connected by the connector and the flex substrate.

Figure 23:
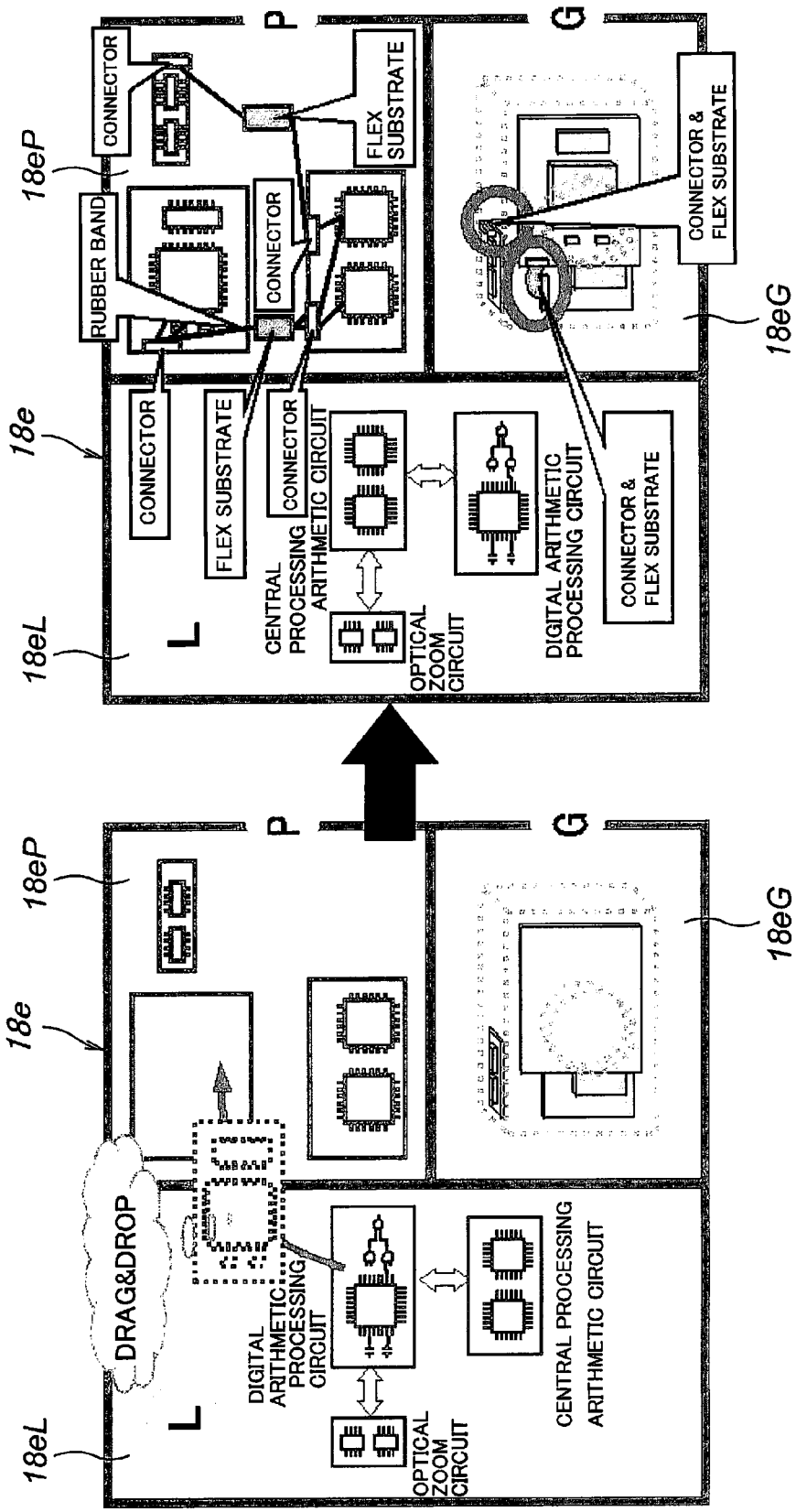
FIG. 23 is an explanatory view of the connecting function of a plurality of substrates according to the present invention.

It is to be noted that a function realized by such a method (hereinafter, appropriately referred to as "connecting function of a plurality of substrates") works in an operation as shown in FIG. 23.

More specifically, FIG. 23 shows a processing where, in the display unit 18e equipped with the logical display region 18eL, the physical display region 18eP and the geometrical display region 18eG on a single display screen, a "digital arithmetic processing circuit" of a circuit block is designated on the logical display region 18eL and the designated "digital arithmetic processing circuit" is arranged on the physical display region 18eP by drag and drop.

In this processing, the electrical connection information defined in the logical display region 18eL is searched based on instruction coordinates by the character input device 18f or the pointing device 18g, the connector and the flex substrate are generated and the connection information is displayed by rubber band via the connector and the flex substrate, on the physical display region 18eP, and the connector and the flex substrate are generated on the same position as that on the physical display region 18eP and the state where parts are connected by the connector and the flexible substrate having the three-dimensional shape is displayed on the geometrical display region 18eG.

More particularly, on the logical display region 18eL, the connecting function of a plurality of substrates works when a circuit element or a circuit element group is selected by either one of the methods such as a to c below, parts are arranged on the physical display region 18eP by drag and drop, and there is electrical connection with another substrate on the physical display region 18eP.

a. Function (circuit) block designation
b. Region designation
c. Designation of one or more parts Further, as shown in FIG. 24, connecting function of a plurality of substrates works even after the part arrangement.

Now, before executing connection by connector displaying connection by a rubber band without a connector based on the connection information is also possible.

Figure 24:
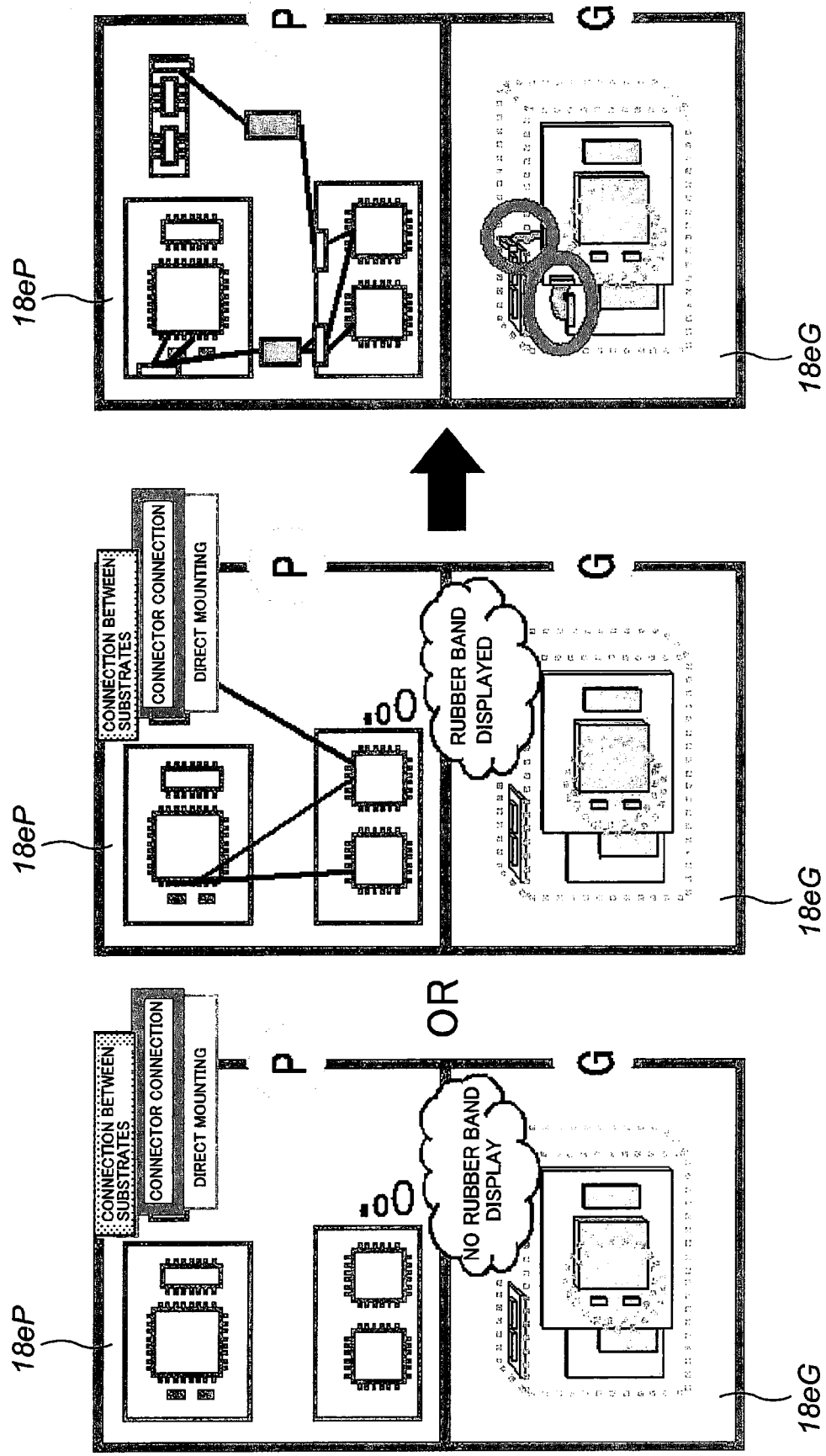
FIG. 24 is an explanatory view of the working state of the connecting function of a plurality of substrates according to the present invention.

As a result of the working of the connecting function of a plurality of substrates, a plurality of substrates are connected on the physical display region 18eP and the geometrical display region 18eG as shown in FIG. 24.

Then, in the connecting function of a plurality of substrates, connection between a plurality of substrates is performed by taking the electrical connection information described below in consideration.

Further, in the connecting function of a plurality of substrates, optimum connector and flex substrate are generated on optimum positions, and to realize this, the connecting function of a plurality of substrates performs processings as shown below.

Processing 1: Deciding a connecting medium such as optimum connector and flex substrate according to the number of signal lines Processing 2: Performing pin assignment where each signal line is connected to terminals of a connecting medium such as a connector and a flex substrate Processing 3: Generating a connector at a position having the shortest route of electric signal By these Processing 1 to Processing 3, optimum connector and flex substrate are generated on optimum positions.

Figure 25:
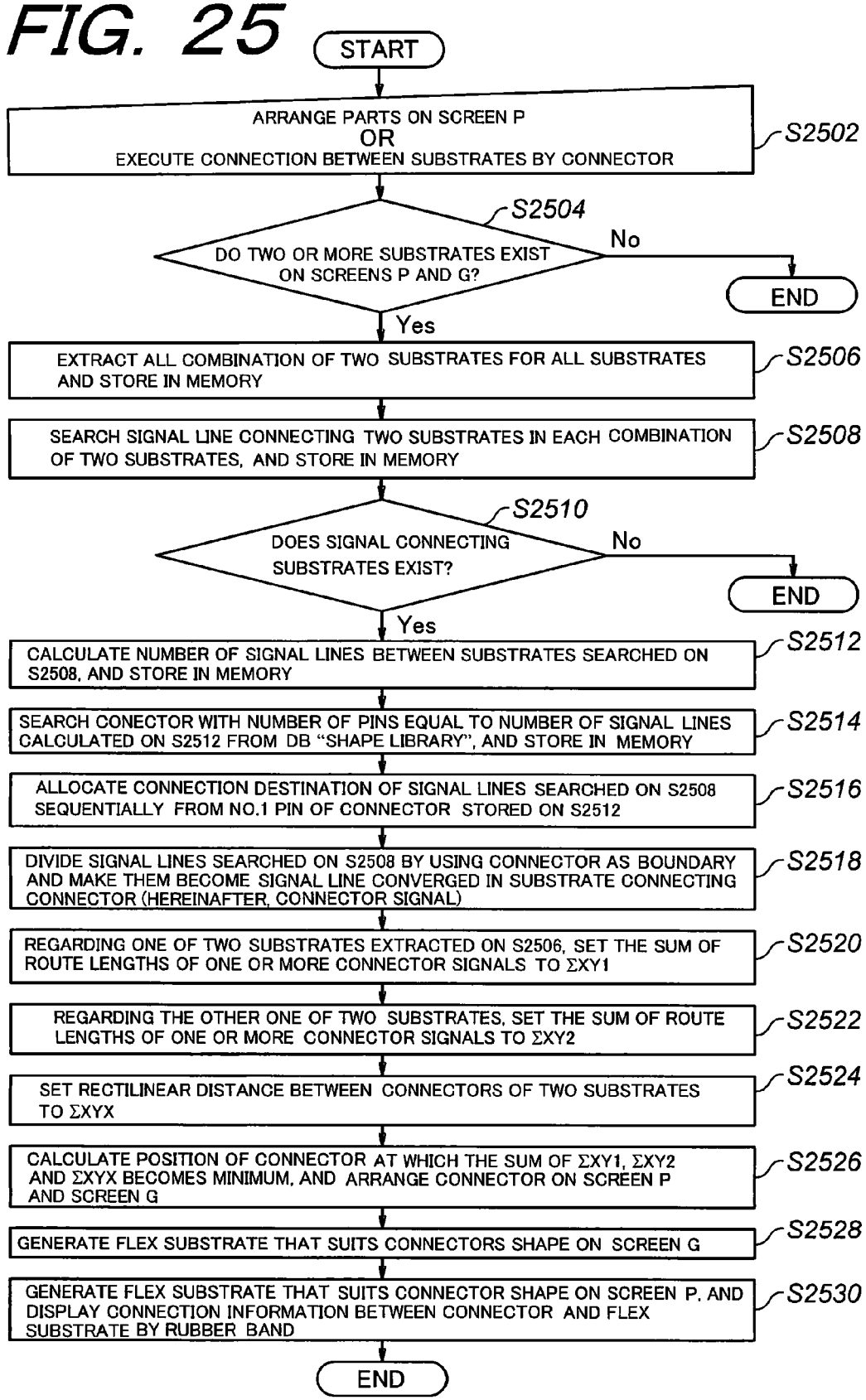
FIG. 25 is a flowchart showing the processing of the connecting function of a plurality of substrates according to the present invention.
Figure 26:
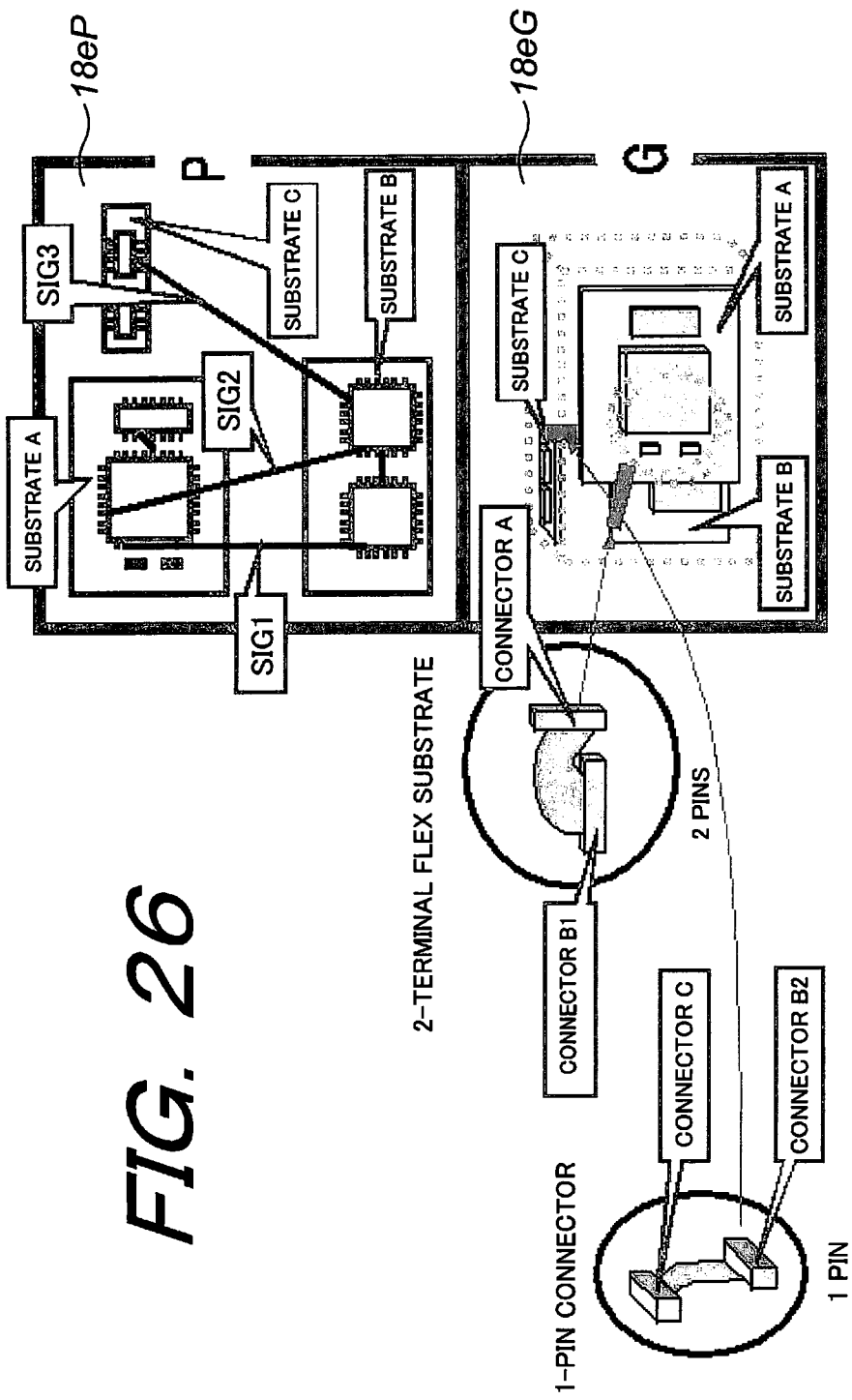
FIG. 26 is an explanatory view of the processing of the connecting function of a plurality of substrates according to the present invention.

In the following, description will be made in detail for each processing of Processings 1 to 3 while referring to the flowchart shown in FIG. 25 and each drawing on FIG. 26 and after.

In the computer system 10, when the user arranges a part on the physical display region 18eP or executes connection between substrates by connector (step S2502) whether or not two or more substrates exist on the physical display region 18eP and the geometrical display region 18eG is judged (step S2504), and in the case of judgment where two or more substrates exist on the physical display region 18eP and the geometrical display region 18eG, processings on step S2506 and after are performed, and the connecting function of a plurality of substrates works.

Now, in this embodiment, to make the present invention easily understood, a processing of deciding and connecting a connectors and a flex substrates to be generated will be described by using the case shown in FIG. 26 as an example.

First, description will be made for Processing 1 executed by step S2506 to step S2514.

In Processing 1, all combinations of two substrates are extracted for all substrates first, and the extracted result is stored in the memory (step S2506). In the example shown in FIG. 26, the three types of substrate A-B, substrate A-C, and substrate B-C are extracted and stored.

When the processing on step S2506 ended, a signal line connecting substrates is searched in the extracted combinations on step S2506 and in the case where the existence of a signal line connecting substrates is searched (step S2508, step S2510), the searched result is stored in the memory (step S2512). In the example shown in FIG. 26, the followings are signal lines.

Substrate A-B→SIG1, STG2 (2 signal lines)
Substrate A-C→None
Substrate B-C→SIG3 (1 signal line)

Then, connectors and flex substrates, which have the number of pins according to the number of signal lines stored in the memory on step S2512 are searched from the shape library of the database, connectors and flex substrates, which have the number of pins according to the number of signal lines stored in the memory on step S2512 are decided and stored in the memory (step S2514). In the example shown in FIG. 26, connectors and flex substrates between each substrate are decided by the searched number of signal lines as follows.

Between substrate A-B: 2-pin connector, 2-terminal flex substrate

Between substrate A-C: No connector and flex substrate

Between substrate B-C: 1-pin connector, 1-terminal flex substrate

Next, describing Processing 2 executed on step S2516, connection destinations of the signal lines searched on step S2508 to step S2512 are allocated sequentially from the first pin of the connector stored on step S2514 (step S2516).

Figure 27:
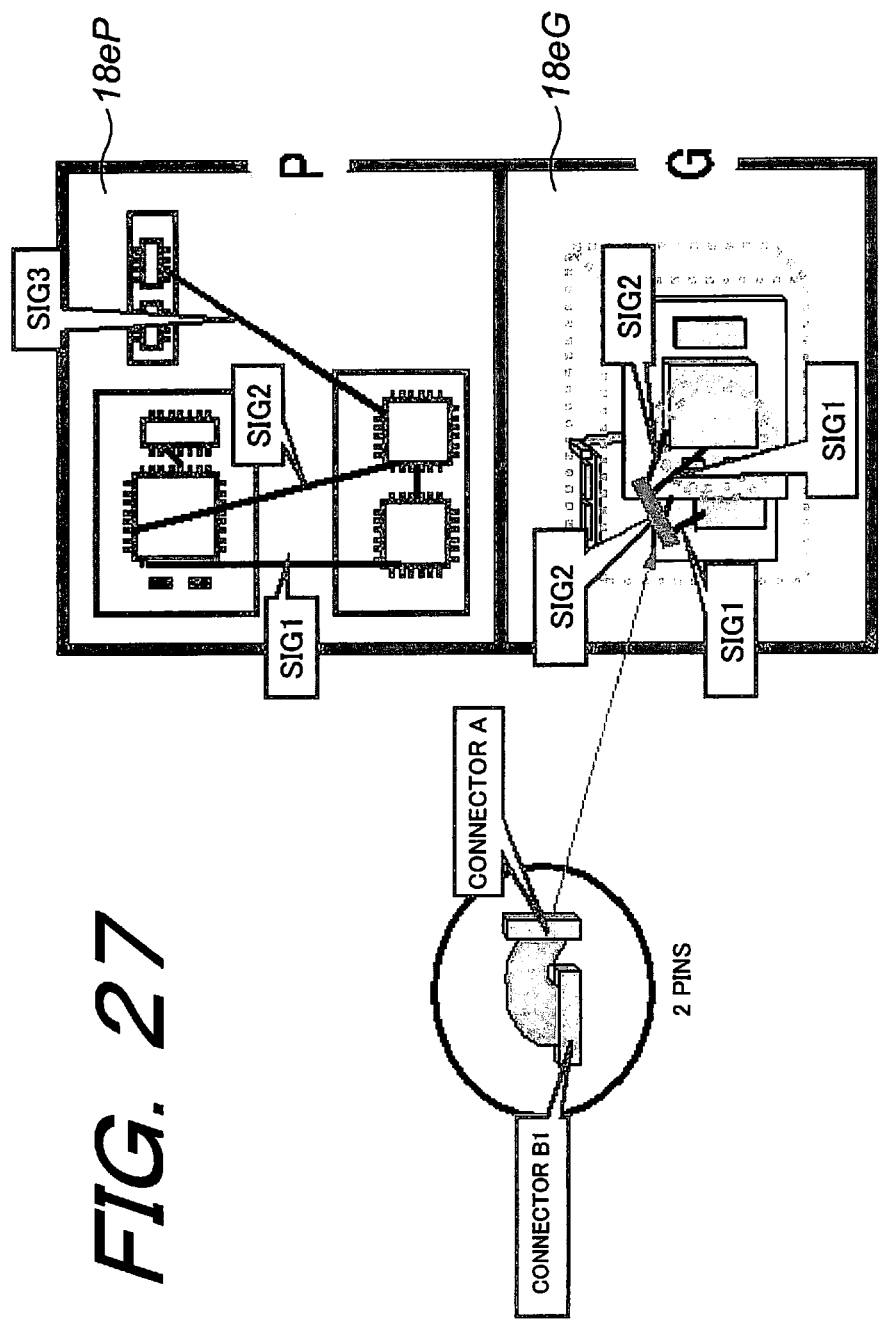
FIG. 27 is an explanatory view of the processing of the connecting function of a plurality of substrates according to the present invention.

More specifically, describing Processing 2 being the pin assignment of each signal line on step S2516 by using FIG. 27 as an example, searched signal lines are sequentially allocated from No. 1 pin of the connectors. Specifically, assuming that signal lines are searched in the order of SIG1, SIG2, SIG3, pin assignment is performed as signal lines connecting to the terminals of the followings.

SIG1→No. 1 pin of connector A, No. 1 pin of connector B1

SIG2→No. 2 pin of connector A, No. 2 pin of connector B1

SIG3→No. 1 pin of connector B2, No. 1 pin of connector C

Then, the connection information and connector pins are set.

Next, description will be made for Processing 3 executed on step S2518 to step S2530.

Figure 28:
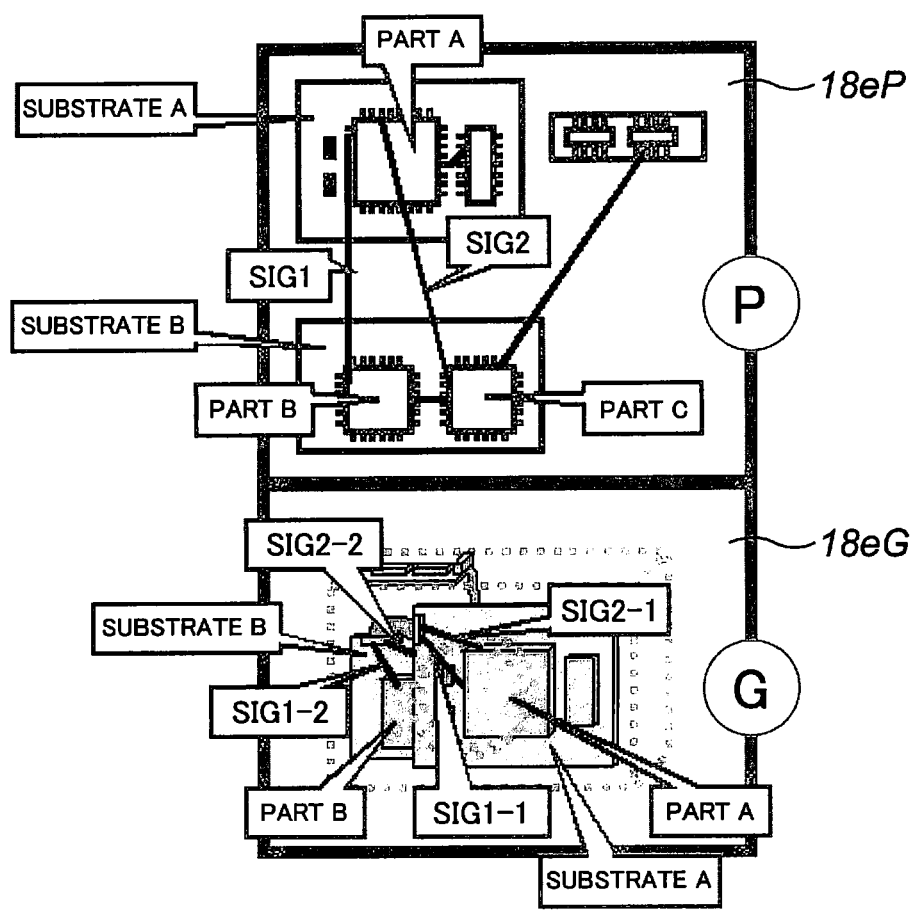
FIG. 28 is an explanatory view of the processing of the connecting function of a plurality of substrates according to the present invention.

In the explanation of Processing 3, on step S2518 first, the signal lines searched on step S2508 to step S2512 are divided into two by using the connector as a boundary and makes them become signal lines converged in the substrate connected to the connectors, (hereinafter, appropriately referred to as "connector signal"). Specifically, as shown in FIG. 28, a processing of deciding the positions of connectors connecting the substrate A and the substrate B is described, the signal line SIG1 between part A and part B is divided into SIG1-1 and SIG1-2 by using the connector as a boundary. Similarly, SIG2 is divided into SIG2-1 and SIG2-2 by using the connector as a boundary.

Next, on step S2520, regarding one of the two substrates extracted on step S2506, the sum of the route lengths of one or more connector signals is set to $\Sigma XY1$.

Figure 29:
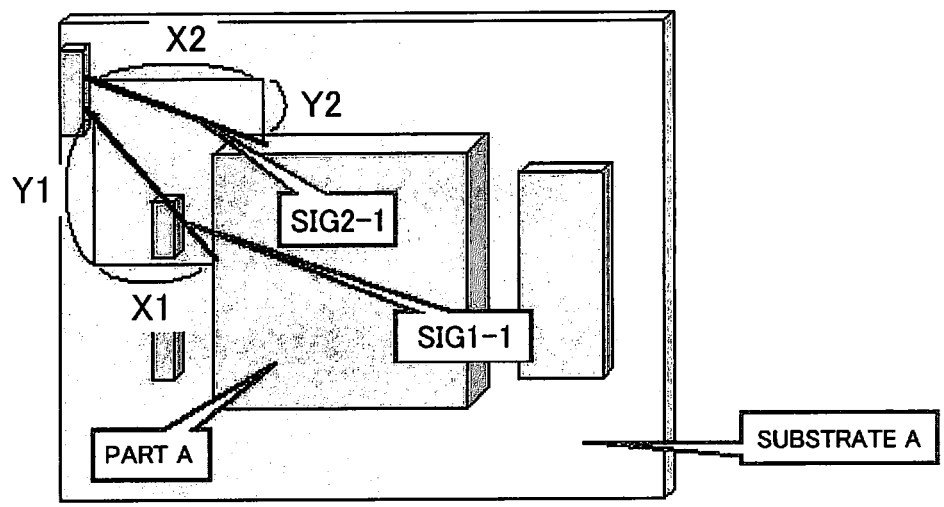
FIG. 29 is an explanatory view of the processing of the connecting function of a plurality of substrates according to the present invention.

When description is made according to the example shown in FIG. 28, the signal route length in the substrate A should be calculated. Herein, the signal route length in the substrate A becomes as follows assuming that the bending angle of a signal pattern is 90 degrees as shown in FIG. 29.

Signal route length in the substrate $A$=Signal route length of $SIG$1-1+Signal route length of $SIG$2-1=$(X1+Y1)+(X2+Y2)$ When the processing of step S2520 ends, procedure proceeds to the processing of step S2522, regarding the other one of the two substrates extracted on step S2506, the sum the route lengths one or more connector signal is set to $\Sigma XY2$.

Figure 30:
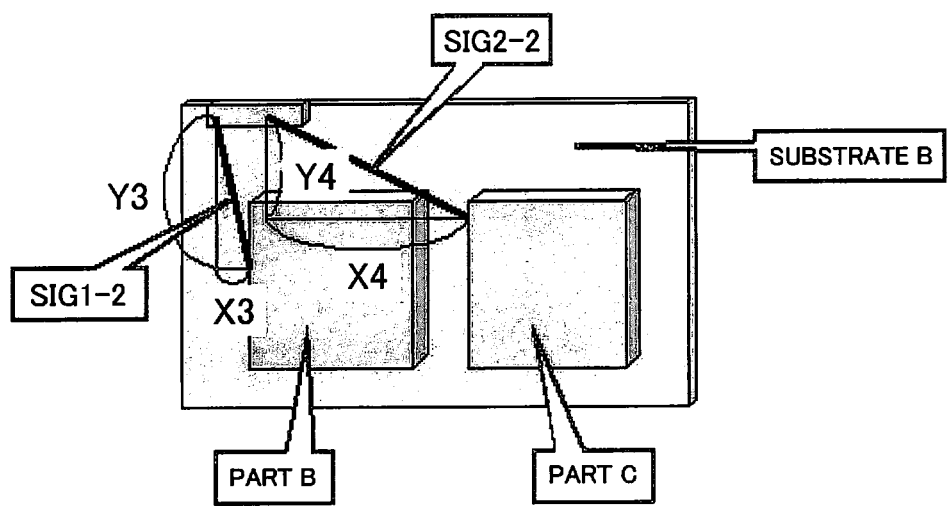
FIG. 30 is an explanatory view of the processing of the connecting function of a plurality of substrates according to the present invention.

When description is made according to the example shown in FIG. 28, a signal route length in the substrate B is calculated. Herein, the signal route length in the substrate B becomes as follows assuming that the bending angle of a signal pattern is 90 degrees as shown in FIG. 30.

Signal route length in the substrate $B$=Signal route length of $SIG$1-2+Signal route length of $SIG$2-2=$(X3+Y3)+(X4+Y4)$ When the processing of step S2522 ends, procedure proceeds to the processing of step S2524, and the rectilinear distance between connectors of two substrates is set to $\Sigma XYX$.

Figure 31:
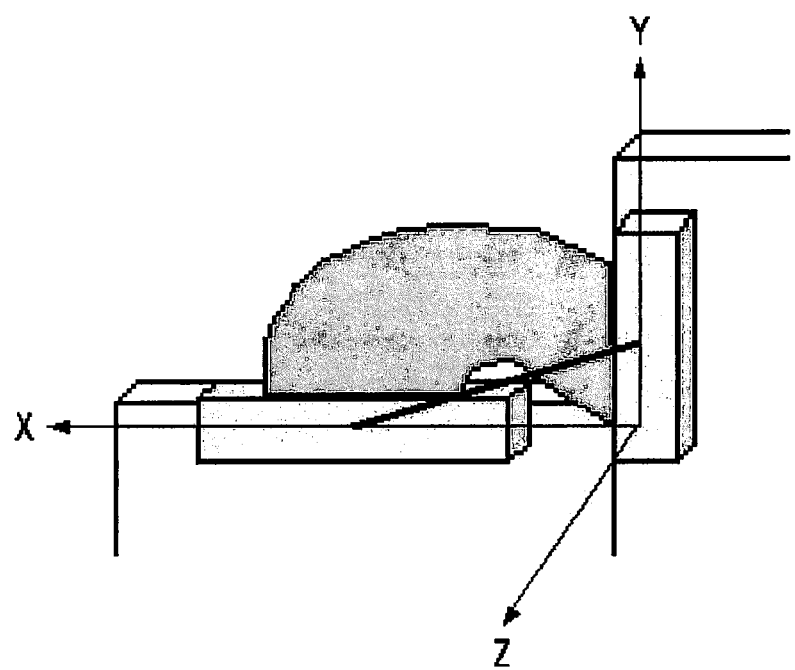
FIG. 31 is an explanatory view of the processing of the connecting function of a plurality of substrates according to the present invention.

When description is made according to the example shown in FIG. 31, the signal route length between the substrate A and the substrate B is calculated. Herein, the signal route length between the substrate A and the substrate B becomes as follows assuming that the route is a rectilinear route connecting the centers of the two connectors.

Signal route length=$(X5^2+Y5^2+Z5^2)^{1/2}$

When the processing of step S2524 ends, procedure proceeds to the processing of step S2526, positions of connectors where the sum of $\Sigma XY1$, $\Sigma XY2$ and $\Sigma XYX$ becomes the minimum is calculated, and the connectors are arranged on the screens of P and G.

When description is made according to the above-described example, a signal route length between the substrate A and the substrate B becomes as follows based on the above.

Signal route length=Signal route length in the substrate $A$+Signal route length in the substrate $B$+Signal route length between the substrate $A$ and the substrate $B$=$(X1+Y1)+(X2+Y2)+(X3+Y3)+(X4+Y4)+(X5^2+Y5^2+Z5^2)^{1/2}$ Positions at which the signal route length becomes the minimum is calculated by the equation above, and connectors are arranged.

When the processing of step S2526 ends, the flex substrate that suit the connector shapes are generated on the screen G (step S2528), then, flex substrates that suit connector shape are generated on the screen P, the connection information between the connectors and the flex substrates is displayed in a rubber band (step S2530) and this processing is ended.

Figure 32:
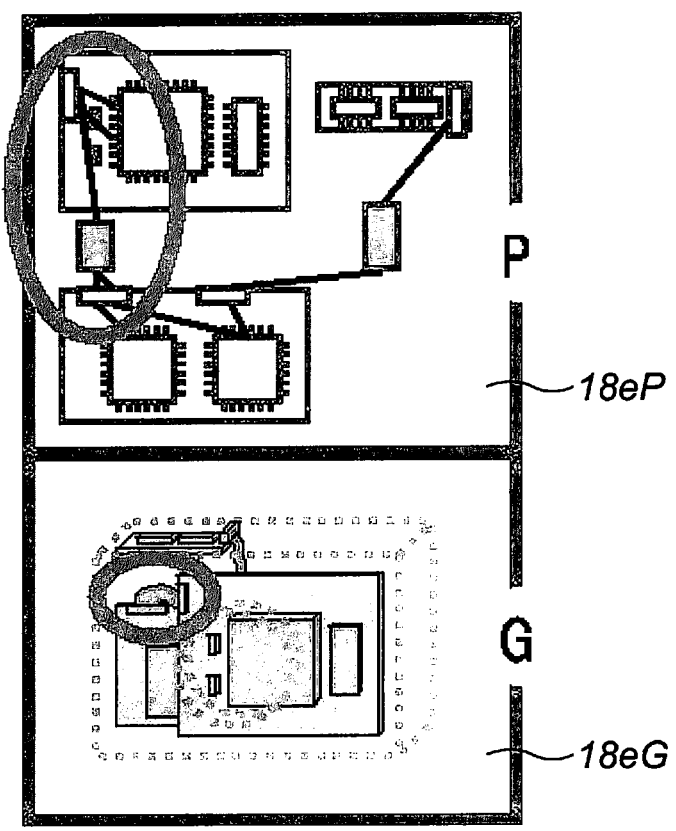
FIG. 32 is an explanatory view of the processing of the connecting function of a plurality of substrates according to the present invention.

When description is made according to the above-described example, the flex substrates are generated in a width according to connector widths (pin shape), and as shown in a round frames in FIG. 32, the electrical connection information of the connectors and the flex substrates is displayed as a rubber band on the screen P, and the connectors and the flex substrates are displayed in a connected state on the screen G.

It is to be noted that the above-described embodiment can be modified as shown in (1) to (7) below.

(1) In the above-described embodiment, the printed circuit board was taken as an object, it goes without saying that the invention is not limited to this, and various objects such as a unit, a module part, a semiconductor chip, a chassis and a chassis part shown in FIG. 49 may be dealt with, for example.

Figure 50:
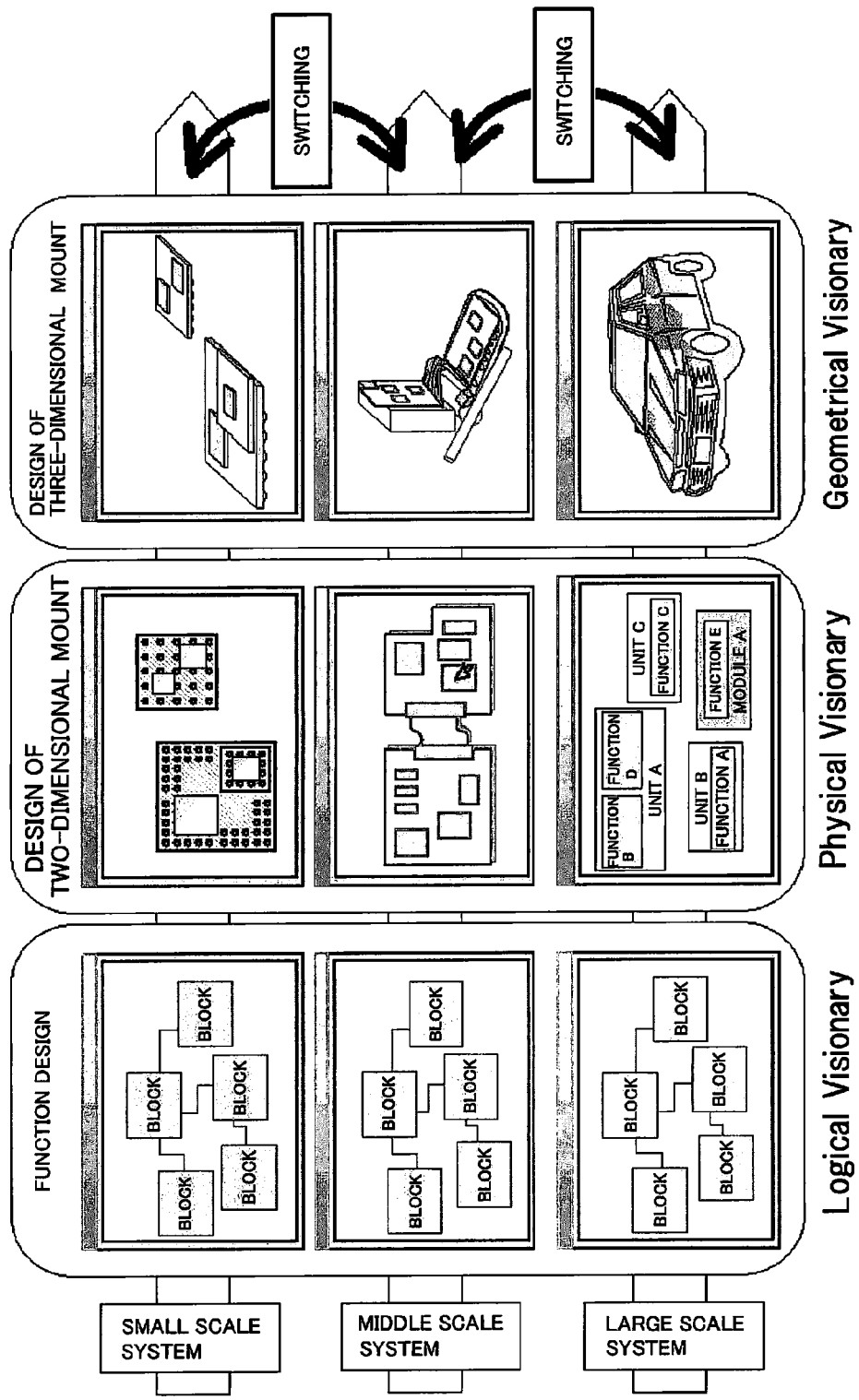

Further, as shown in FIG. 50, design information of automobiles, which has a unit with a larger scale than a printed circuit board as an object design information of a semiconductor chip having a smaller scale than the printed circuit board may be dealt with.

(2) In the above-described embodiment, description has been made for the case of holding matching of the display state between the logical display region 18$e$L, the physical display region 18$e$P and the geometrical display region 18$e$G on the display unit 18$e$ in the single client system 18, but it goes without saying that the present invention is not limited to this, and the invention is also applicable to the case of holding matching of the display state between the logical display region 18eL, the physical display region 18eP and the geometrical display region 18eG in the display units (display) 18e of a plurality of client systems 18c, which will be described in detail below.

Figure 33:
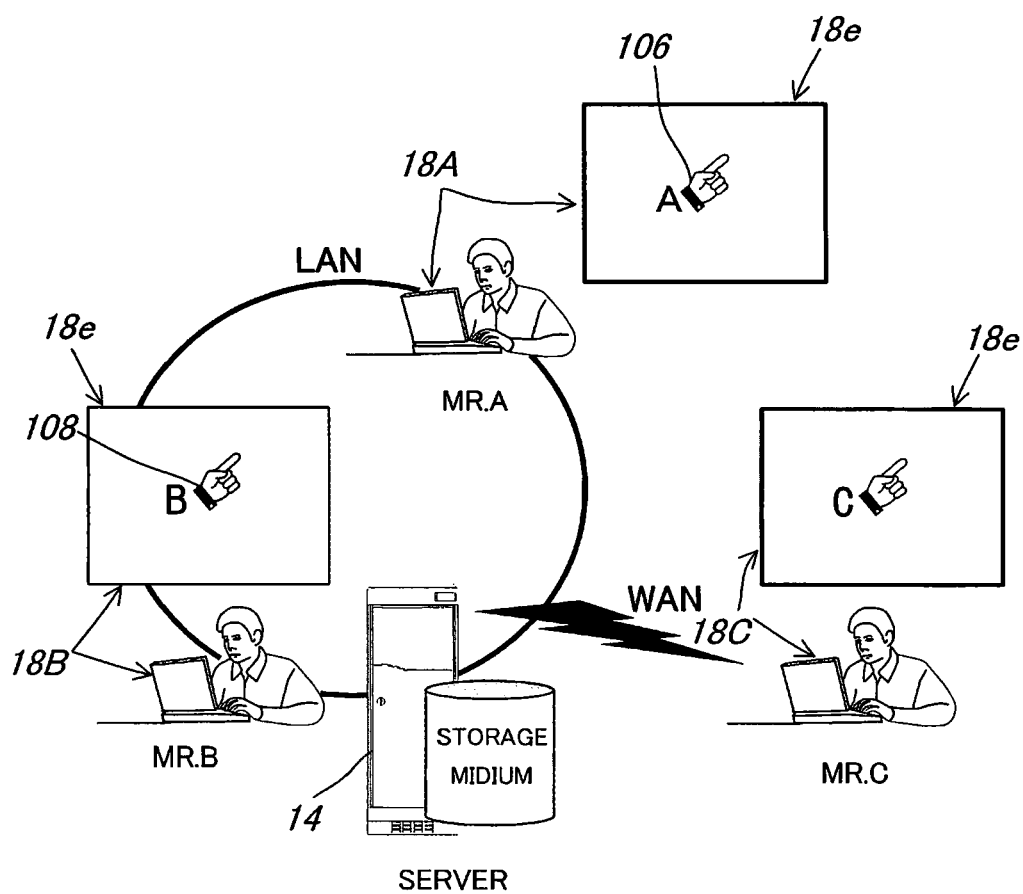
FIG. 33 is an explanatory view of a modification example in the case of holding matching of the display state of the logical display region, the physical display region and the geometrical display region, in the display units of a plurality of client systems.

First, description will be made for operating environment while referring to FIG. 33, where a client system 18A operated by Mr.A having the display unit 18e equipped with the logical display region 18eL, the physical display region 18eP and the geometrical display region 18eG and a client system 18B operated by Mr.B having the display unit 18e equipped with the logical display region 18eL, the physical display region 18eP and the geometrical display region 18eG are connected to each other via a network on a LAN (Local Area Network: on local area network), and the WWW server system 14 is installed in the LAN.

Further, a client system 18C operated by Mr.C having the display unit 18e equipped with the logical display region 18eL, the physical display region 18eP and the geometrical display region 18eG is connected on a WAN (Wide Area Network: wide area network), and is accessible to the WWW server system 14.

In the operating environment, it is assumed that nothing is displayed on the display screen of the display unit 18e of the client system 18A, the display screen of the display unit 18e of the client system 18B and the display screen of the display unit 18e of the client system 18C, in the initial state.

Figure 34:
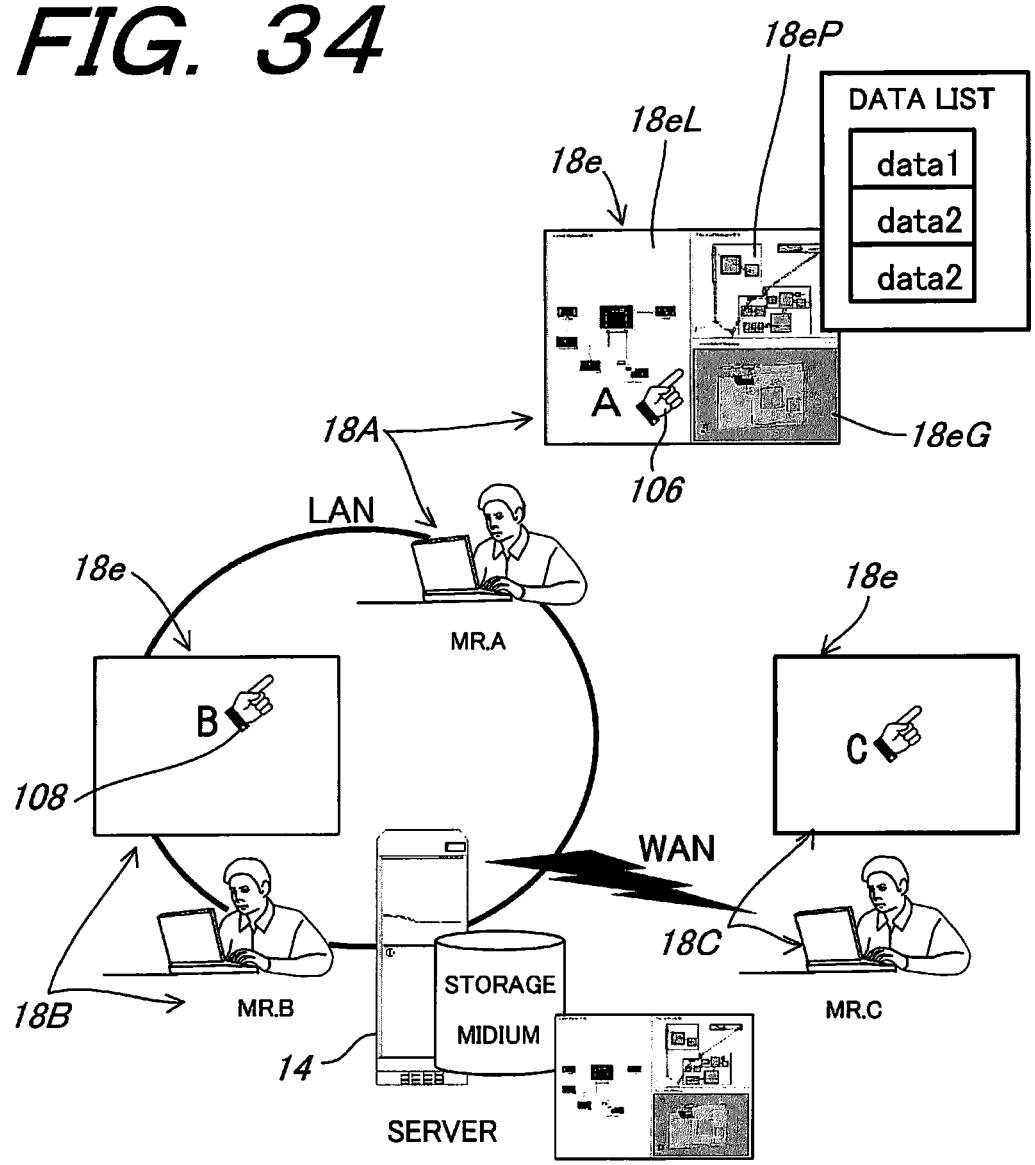
FIG. 34 is an explanatory view of a modification example in the case of holding matching of the display state of the logical display region, the physical display region and the geometrical display region, in the display units of a plurality of client systems.

From this initial state, as shown in FIG. 34, access is made from the client system 18A to the WWW server system 14 according to the operation by Mr.A, data to be edited is selected from a data list stored in the storage medium of the WWW server system 14, the selected data is displayed on the logical display region 18eL, the physical display region 18eP and the geometrical display region 18eG on the display screen of the display unit 18e of the client system 18A. Now, in this state, the display screen of the display unit 18e of the client system 18B and the display screen of the display unit 18e of the client system 18C are not changed at all.

In the state shown on FIG. 34, description will be made for a processing where the display screen of the display unit 18e of the client system 18B is synchronized with the display screen of the display unit 18e of the client system 18A while referring to FIG. 35 and FIG. 36.

Figure 35:
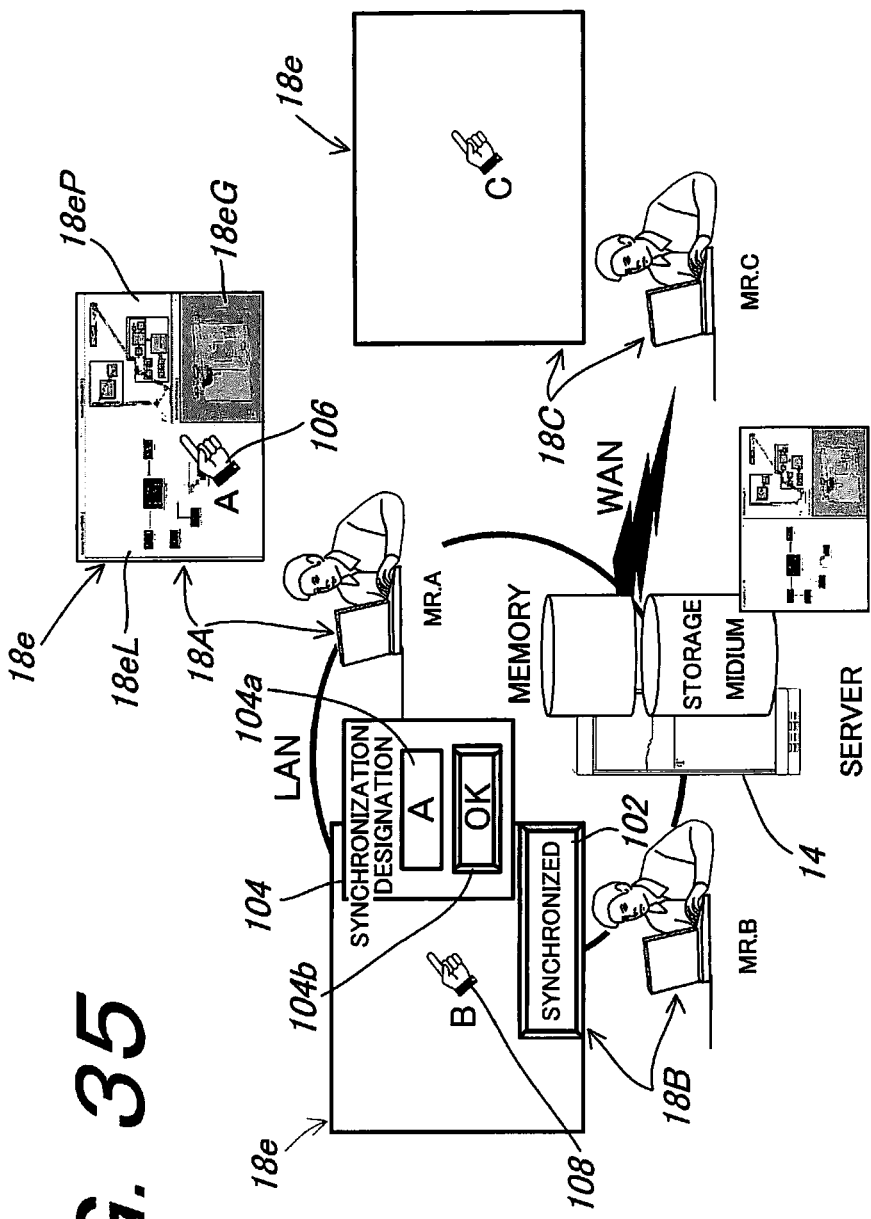
FIG. 35 is an explanatory view of a modification example in the case of holding matching of the display state of the logical display region, the physical display region and the geometrical display region, in the display units of a plurality of client systems.

Herein, FIG. 35 shows a state where the client system 18B designated the client system 18A to be synchronized, which is a state before completing synchronization.

More specifically, by the operation of the pointing device 18g of the client system 18B, synchronization button 102 displayed on the display screen of the display unit 18e is clicked to open a synchronization designating window 104, and then, by inputting "A" that designates the client system 18A in a column of terminal to be synchronized 104a in the synchronization designating window 104 by the operation of the character input device 18f of the client system 18B, and designation of the client system 18A with which the client system 18B synchronizes is completed. Since synchronization is not completed yet, the display screen of the display unit 18e of the client system 18B is not changed at all.

Herein, when an OK button 104b of the synchronization designating window 104 is clicked by the operation of the pointing device 18g of the client system 18B, synchronization is executed, information that "synchronize the client system 18A and the client system 18B" is transmitted from the client system 18B to the WWW server system 14, and the information is stored in the memory of the WWW server system 14.

Figure 36:
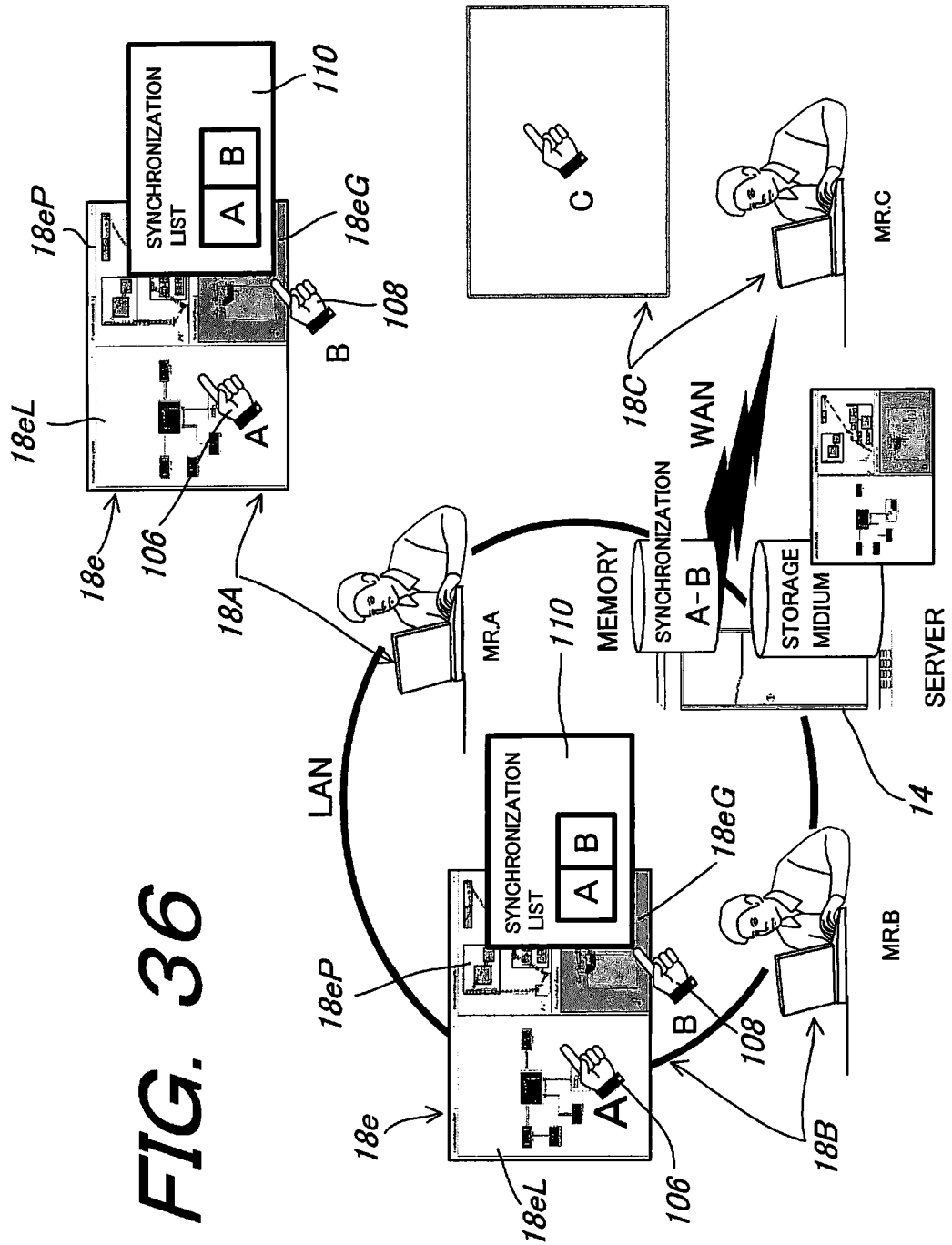
FIG. 36 is an explanatory view of a modification example in the case of holding matching of the display state of the logical display region, the physical display region and the geometrical display region, in the display units of a plurality of client systems.

FIG. 36 shows a state where synchronization between the client system 18A and the client system 18B is completed by clicking the OK button 104b in the synchronization designating window 104.

When the synchronization is completed, the same contents as the displayed contents of the logical display region 18eL, the physical display region 18eP and the geometrical display region 18eG on the display screen of the display unit 18e of the client system 18A are displayed on the logical display region 18eL, the physical display region 18eP and the geometrical display region 18eG on the display screen of the display unit 18e of the client system 18B.

Then, on the display screen of the display unit 18e of the client system 18A and the display screen of the display unit 18e of the client system 18B, two mouse pointers that are a mouse pointer 106 (pointing-finger shape A) for performing the operation of the client system 18A by Mr.A and a mouse pointer 108 (pointing-finger shape B) for performing the operation of the client system 18B by Mr.B are severally displayed.

It is to be noted that synchronization information "synchronization A-B" showing that the client system 18A and the client system 18B were synchronized with each other is stored in the memory of the WWW server system 14 with the processing of this synchronization.

Furthermore, a synchronization list screen 110 is displayed on the display screen of the display unit 18e of the client system 18A and the display screen of the display unit 18e of the client system 18B, and "A" and "B" showing that the client system 18A and the client system 18B are synchronized with each other and displayed on the synchronization list screen 110.

Next, in the state shown on FIG. 36, description will be made for a processing where the display screen of the display unit 18e of the client system 18C is synchronized with the display screen of the display unit 18e of the client system 18A while referring to FIG. 37 and FIG. 38.

Figure 37:
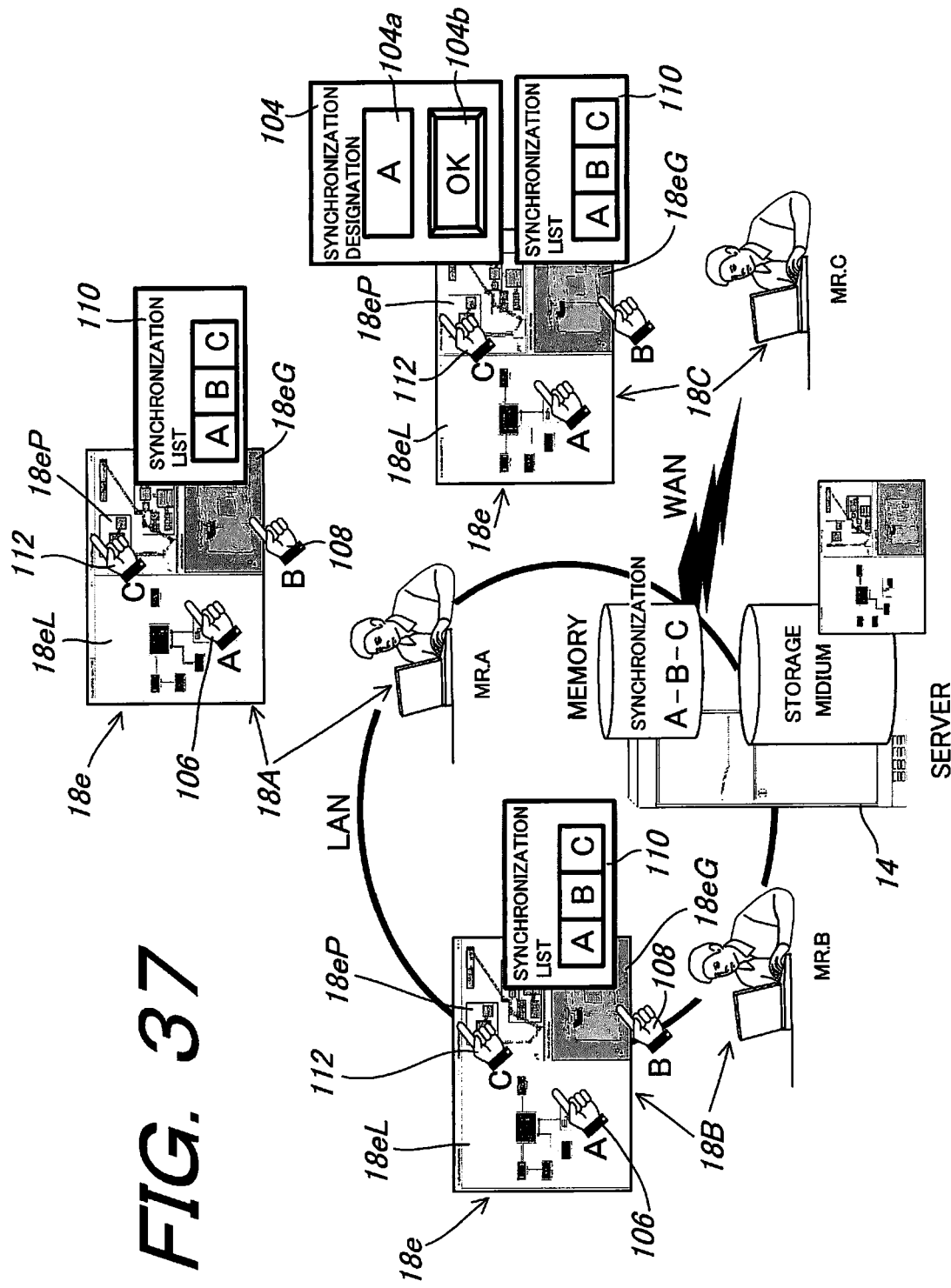
FIG. 37 is an explanatory view of a modification example in the case of holding matching of the display state of the logical display region, the physical display region and the geometrical display region, in the display units of a plurality of client systems.

Herein, FIG. 37 shows the state where the client system 18C completed synchronization with the client system 18A similar to the client system 18B.

Figure 38:
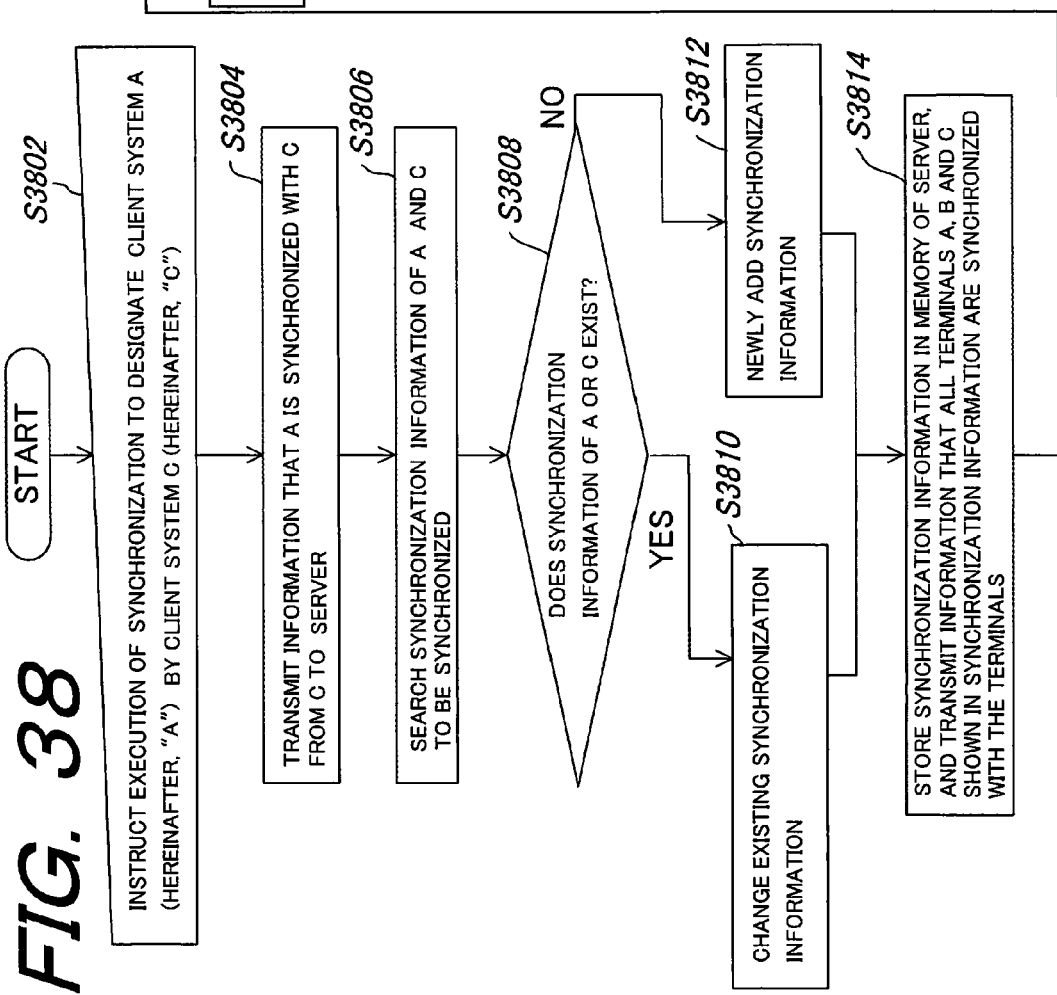
FIG. 38 is flowchart showing the processing procedure of a processing in which the display screen of a display unit of a client system is synchronized with the display screen of a display unit of another client system.

Further, FIG. 38 shows the flowchart showing the processing procedure of a processing where the display screen of the display unit 18e of the client system 18C is synchronized with the display screen of the display unit 18e of the client system 18A.

In the following, description will be made for a processing in which the display screen of the display unit 18e of the client system 18C and the display screen of the display unit 18e of the client system 18A are synchronized, and because the operation processing on the display screen of the display unit 18e of the client system 18C is similar to the operation processing on the display screen of the display unit 18e of the client system 18B, FIG. 35 and FIG. 36 and the above-described explanation regarding FIG. 35 and FIG. 36 are referred to.

First, an instruction of executing synchronization designating the client system A by the client system C is performed (step S3802). Specifically, by the operation of the pointing device 18g of the client system 18C, a synchronization button 102 displayed on the display screen of the display unit 18e is clicked to open a the synchronization designating window 104, and then, by inputting "A" that designates the client system 18A in the column of terminal to be synchronized 104a in the synchronization designating window 104 by the operation of the character input device 18f of the client system 18C, designation of the client system 18A with which the client system 18B synchronizes is completed. Since synchronization is not completed yet, the display screen of the display unit 18e of the client system 18C is not changed at all. Then, by the operation of the pointing device 18g of the client system 18C, an OK button 104b on the synchronization designating window 104 is clicked to instruct execution of synchronization.

When the execution of synchronization is instructed by clicking the OK button 104b, information "synchronize the client system 18A and the client system 18C" is transmitted from the client system 18C to the WWW server system 14, and the information is stored in the memory of the WWW server system 14 (step S3804).

Thus, synchronization information between the client system 18A and the client system 18C to be synchronized is searched from the synchronization information stored in the memory of the WWW server system 14 (step S3806), and whether or not the synchronization information of the client system 18A or the client system 18C exists is judged (step S3808).

In the case of judgment where the synchronization information of the client system 18A or the client system 18C exists by this judgment processing of step S3808, the existing synchronization information is changed (step S3810), and the processing of step S3814 (described later) is performed.

On the other hand, in the case of judgment where the synchronization information of the client system 18A or the client system 18C does not exist by the judgment processing of step S3808, synchronization information is newly added (step S3812), and the processing of step S3814 (described later) is performed.

Then, on step S3814, synchronization information "synchronization A-C" showing that the client system 18A and the client system 18C were synchronized with each other is stored in the memory of the WWW server system 14, but in such occasion, the synchronization information "synchronization A-B" showing that the client system 18A and the client system 18B were synchronized with each other is already stored in the memory of the WWW server system 14, and this means that all of the client system 18A, the client system 18B and the client system 18C are synchronized, so that the WWW server system 14 stores the synchronization information "synchronization A-B" and the synchronization information "synchronization A-C" by rewriting into synchronization information "synchronization A-B-C" showing all of the client system 18A, the client system 18B and the client system 18C were synchronized with each other. Then, the synchronization information "synchronization A-B-C" is transmitted to the client system 18A, the client system 18B and the client system 18C being all terminals that they were synchronized with each other by the synchronization information "synchronization A-B-C".

Next, the client system 18A, the client system 18B and the client system 18C being each terminal that received the synchronization information "synchronization A-B-C" synchronizes each display screen of the display unit 18e to display the logical display region 18eL, the physical display region 18eP and the geometrical display region 18eG, and displays the synchronization list screen 110 on each display screen of the display unit 18e, and displays "A", "B" and "C" showing the synchronization information "synchronization A-B-C" expressing that the client system 18A, the client system 18B and the client system 18C are synchronized with each other on the synchronization list screen 110 (step S3816).

Next, the client system 18A, the client system 18B and the client system 18C being each terminal that received the synchronization information "synchronization A-B-C" transmits a self terminal name being each terminal name, that is, whether it is the client system 18A, the client system 18B or the client system 18C and the current coordinate value of each mouse pointer to the WWW server system 14 (step S3818).

Then, the WWW server system 14 that received the information transmitted by the processing of step S3818 searches synchronization information containing the received self terminal name from the memory (step S3820) and transmits the coordinate value of each mouse pointer to other terminals except the self terminal to synchronized terminals shown by the searched synchronization information, that is, the client system 18A, the client system 18B and the client system 18C (step S3822).

Then, the client system 18A, the client system 18B and the client system 18C being each terminal that received the coordinate value of the mouse pointer transmitted by the processing of step S3822 displays the mouse pointer on the coordinate value on the display screen of the display unit 18e (step S3824), and this processing is ended.

As described above, although the client system 18C only designated synchronization with the client system 18A, the client system 18C becomes synchronized with not only the client system 18A but also the client system 18B because the client system 18A is already synchronized with the client system 18B, and when synchronization is completed, the same contents as the displayed contents of the logical display region 18eL, the physical display region 18eP and the geometrical display region 18eG on the display screens of the display units 18e of the client system 18A and the client system 18B are displayed on the logical display region 18eL, the physical display region 18eP and the geometrical display region 18eG of the display screen of the display unit 18e of the client system 18C.

Then, on the display screen of the display unit 18e of the client system 18A and the display screen of the display unit 18e of the client system 18B and the display screen of the display unit 18e of the client system 18C, three mouse pointers that are the mouse pointer 106 (pointing-finger shape A) for performing the operation of the client system 18A by Mr.A, the mouse pointer 108 (pointing-finger shape B) for performing the operation of the client system 18B by Mr.B and a mouse pointer 112 (pointing-finger shape C) for performing the operation of the client system 18C by Mr.C are severally displayed.

Further, the synchronization information stored in the memory of the WWW server system 14 is changed to the synchronization information "synchronization A-B-C" that the client system 18A, the client system 18B and the client system 18C are synchronized with each other.

Then, on and the display screens of the display units 18e of the synchronization list screen 110 in the client system 18A, the client system 18B the client system 18C, "A", "B" and "C" showing the synchronization information "synchronization A-B-C" that the client system 18A, the client system 18B and the client system 18C are synchronized with each other is displayed.

Herein, description will be made for an editing processing in the case where the client system 18A, the client system 18B and the client system 18C were synchronized with each other. In the case where the client system 18A, the client system 18B or the client system 18C perform the editing processing, the editing processing is started or restarted after a display region that becomes a target of the editing processing is selected from the logical display region 18eL, the physical display region 18eP and the geometrical display region 18eG of the display screen of the display unit 18e, in each of the client system 18A, the client system 18B or the client system 18C.

Figure 39:
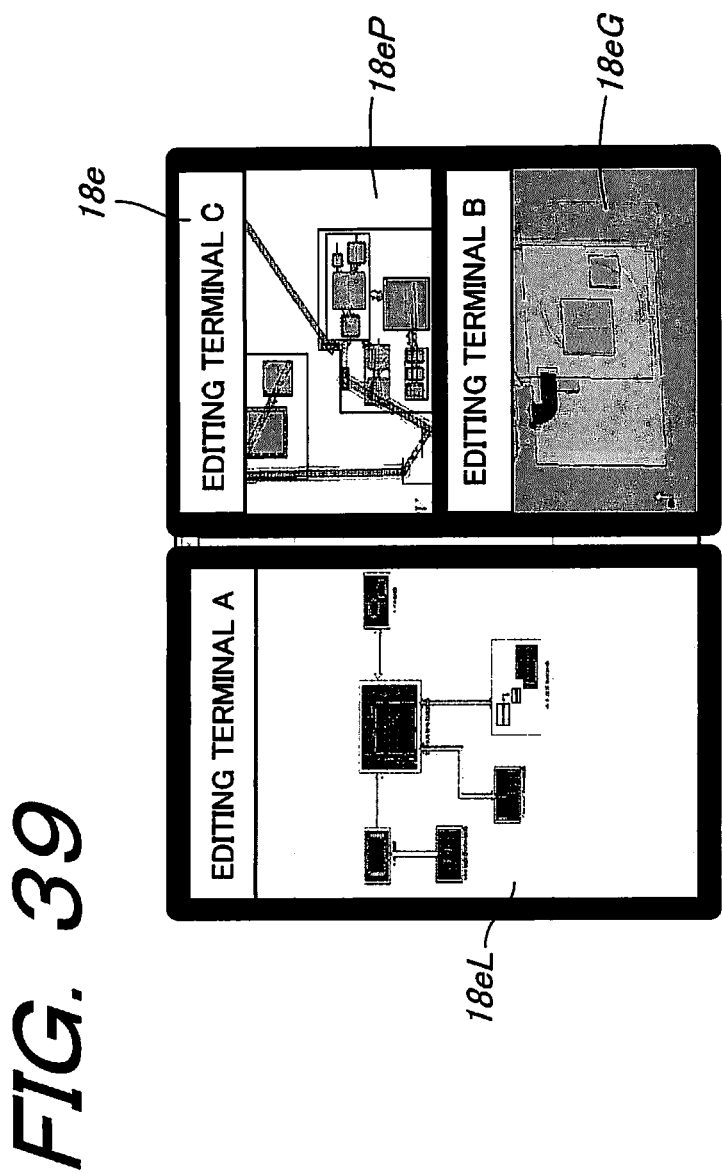
FIG. 39 is a conceptual explanatory view of the display screen of a display unit in the state where the first client system selected a logical display region, the second client system selected a physical display region, and the third client system selected a geometrical display region.

FIG. 39 shows the conceptual explanatory view of the display screen of the display unit 18*e* in the state where the client system 18A selected the logical display region 18*e*L, the client system 18B selected the physical display region 18*e*P, and the client system 18C selected the geometrical display region 18*e*G, where display is made in such a manner that which terminal selected which display region can be seen (refer to display "editing terminal A", "editing terminal B" and "editing terminal C" in FIG. 39).

It is to be noted that displaying the operation process of other terminals in real-time is also possible by performing a processing similar to the one described above on the display screen of the display unit 18*e* of each terminal.

More specifically, when any operation such as moving or clicking of the mouse 18*g* in each terminal and operation of the keyboard 18*f* is performed, a processing that operation contents in each terminal are transmitted to the WWW server system 14, the operation contents are transmitted from the WWW server system 14 to another terminal being synchronized, and the operation contents are reflected on another terminal should only be performed.

Further, for example, in the case where the client system 18B selected the logical display region 18*e*L when the client system 18A selected the logical display region 18*e*L earlier, the editing processing in the logical display region 18*e*L is enabled on the client system 18B that selected the region later, and the client system 18A enters a state where it does not select any display region.

Then, in the case where the client system 18B selected the logical display region 18*e*L after the client system 18A as described the above, display on all synchronized terminals is changed into the state that the client system 18B selected the logical display region 18*e*L.

Figure 40:
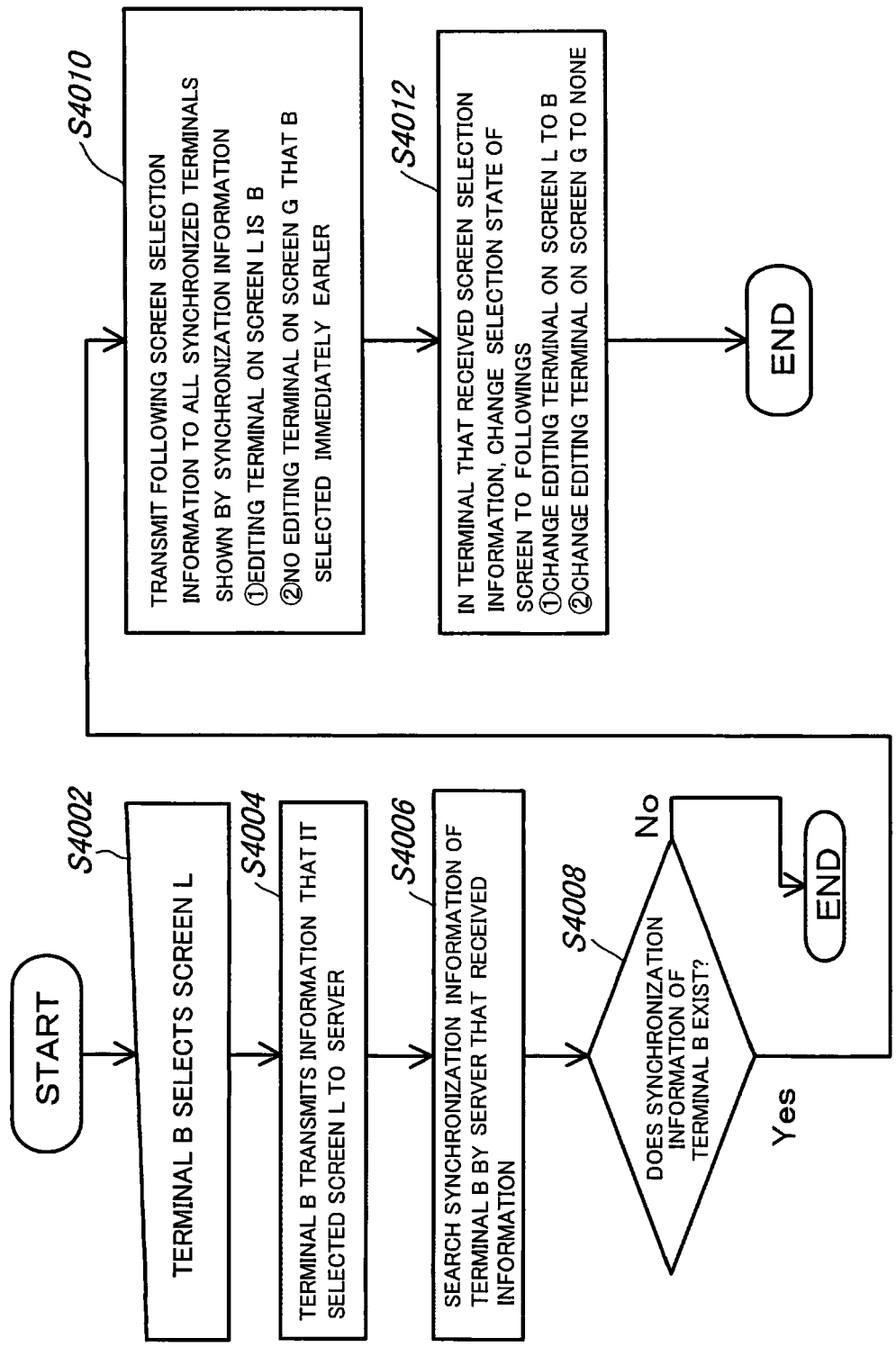
FIG. 40 is a flowchart showing the processing procedure of a processing in the case where the logical display region is selected by a plurality of client systems.

Hereinafter, description will be made for a processing when the client system 18B selected the logical display region 18*e*L in the state where the client system 18A selected the logical display region 18*e*L, the client system 18B selected the physical display region 18*e*P, and the client system 18C selected the geometrical display region 18*e*G, while referring to the flowchart shown in FIG. 40. In the flowchart of FIG. 40, the client system 18B is indicated as "terminal B", the logical display region 18*e*L is indicated as "display L", and the geometrical display region 18*e*G is indicated as "display G" to make the drawing be easily read.

First, when the client system 18B selects the logical display region 18*e*L (step S4002), the client system 18B transmits information that it selected the logical display region 18*e*L to the WWW server system 14 (step S4004).

The WWW server system 14 that received the transmitted information in the processing of step S4004 searches the synchronization information of the client system 18B from the synchronization information stored in the memory (step S4006), and judges whether or not the synchronization information of the client system 18B exists (step S4008).

In the case of judgment where the synchronization information of the client system 18B does not exist in the judgment processing of this step S4008, this processing is ended.

On the other hand, in the case of judgment where the synchronization information of the client system 18B exists in the judgment processing of step S4008, procedure advances to the processing of step S4010, and screen selection information made up of a and b below is transmitted to the client system 18A and the client system 18C being all synchronized terminals shown by the synchronization information.

a: An editing terminal being a terminal that edits the logical display region 18*e*L is the client system 18B b: The geometrical display region 18*e*G that the client system 18B selected immediately earlier has not been selected by any terminal (no editing terminal)

When the above-described processing on step S4010 ended, procedure advances to the processing of step S4012, the client system 18A and the client system 18C being the terminals that received the screen selection information transmitted in the processing of step S4010 change the selection state of the display regions to a and b below, and this processing is ended.

a: Change editing terminal being a terminal that edits the logical display region 18*e*L the client system 18B b: Change to no terminal that edits the geometrical display region 18*e*G (no editing terminal)

Now, in the present invention, in the middle of editing each terminal interrupting operation can be performed from a terminal synchronizing with the terminal in the middle of editing (synchronized terminal).

For example, when the logical display region 18*e*L is selected on the client system 18B while editing the data of the logical display region 18*e*L by the client system 18A, the editing processing of the client system 18A is interrupted, and the operation of the client system 18B becomes effective.

Furthermore, when the logical display region 18*e*L is selected by the client system 18A, editing can be re-started from an operation at the point where the editing processing was interrupted by the client system 18A.

Further, in the present invention, terminals are controlled such that the same object cannot be edited by a plurality of terminals.

Figure 41:
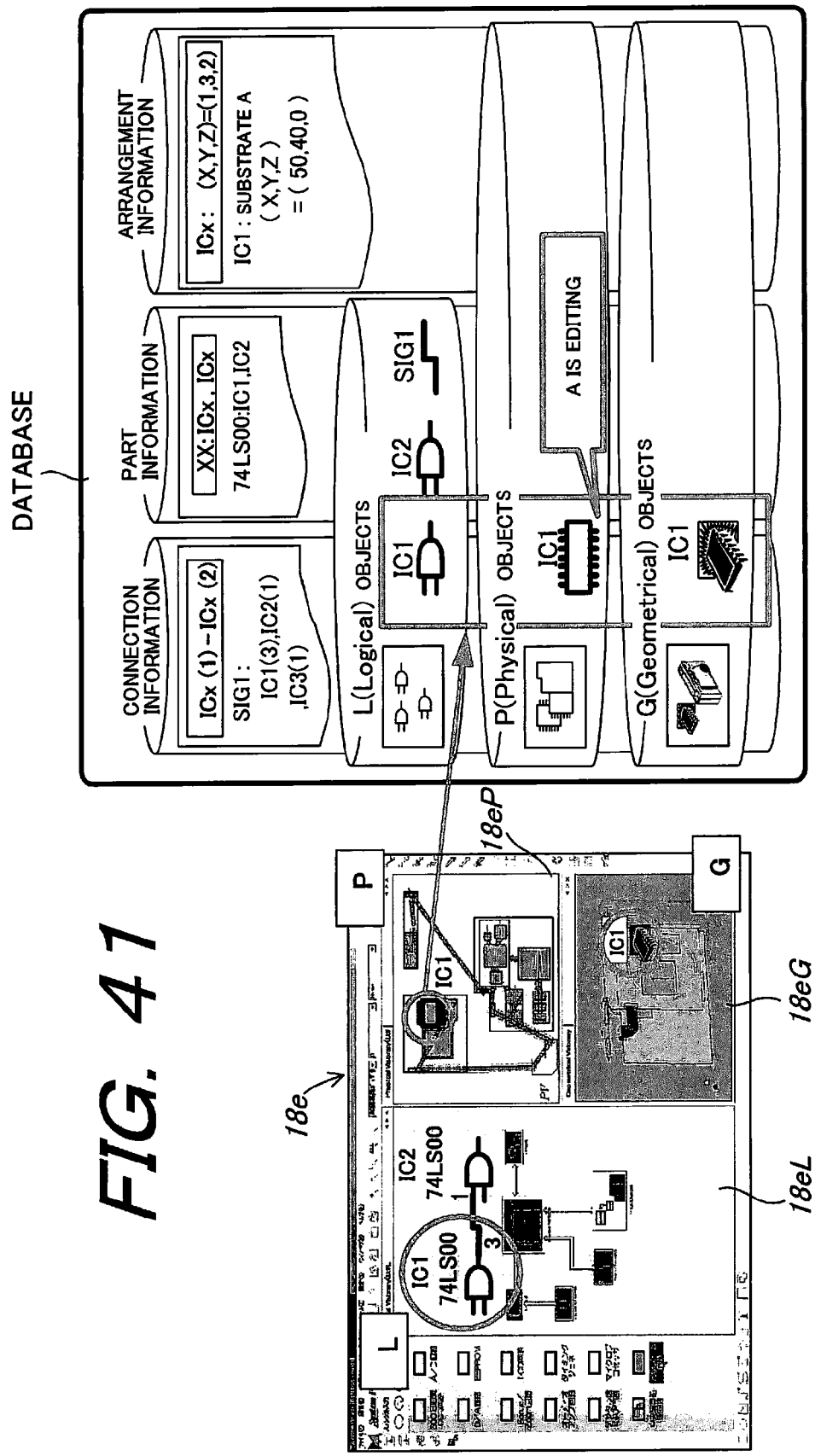
FIG. 41 is an explanatory view regarding control that prevents a plurality of client systems from editing the same object.

Description will be made for this specifically while referring to FIG. 41. When the client system 18A is moving IC1 on the physical display region 18*e*P, IC1 of Logical objects, Physical objects and Geometrical objects in the database is changed to a status that the client system 18A is editing the object.

Herein, when the client system 18B attempts to edit IC1 on the logical display region 18*e*L or the geometrical display region 18*e*G, editing is unable due to the status that the client system 18A being another terminal is editing the object.

(3) In the above-described embodiment, description was made mainly for the case of reflecting the processing contents in the logical display region 18*e*L on the physical display region 18*e*P or the geometrical display region 18*e*G. However, it goes without saying that the present invention is not limited to this, and the processing contents in the physical display region 18*e*P may be reflected on the logical display region 18*e*L or the geometrical display region 18*e*G, or the processing contents in the geometrical display region 18*e*G may be reflected on the logical display region 18*e*L or the physical display region 18*e*P by a processing similar to the case of reflecting the processing contents in the logical display region 18*e*L on the physical display region 18*e*P or the geometrical display region 18*e*G.

Figure 42:
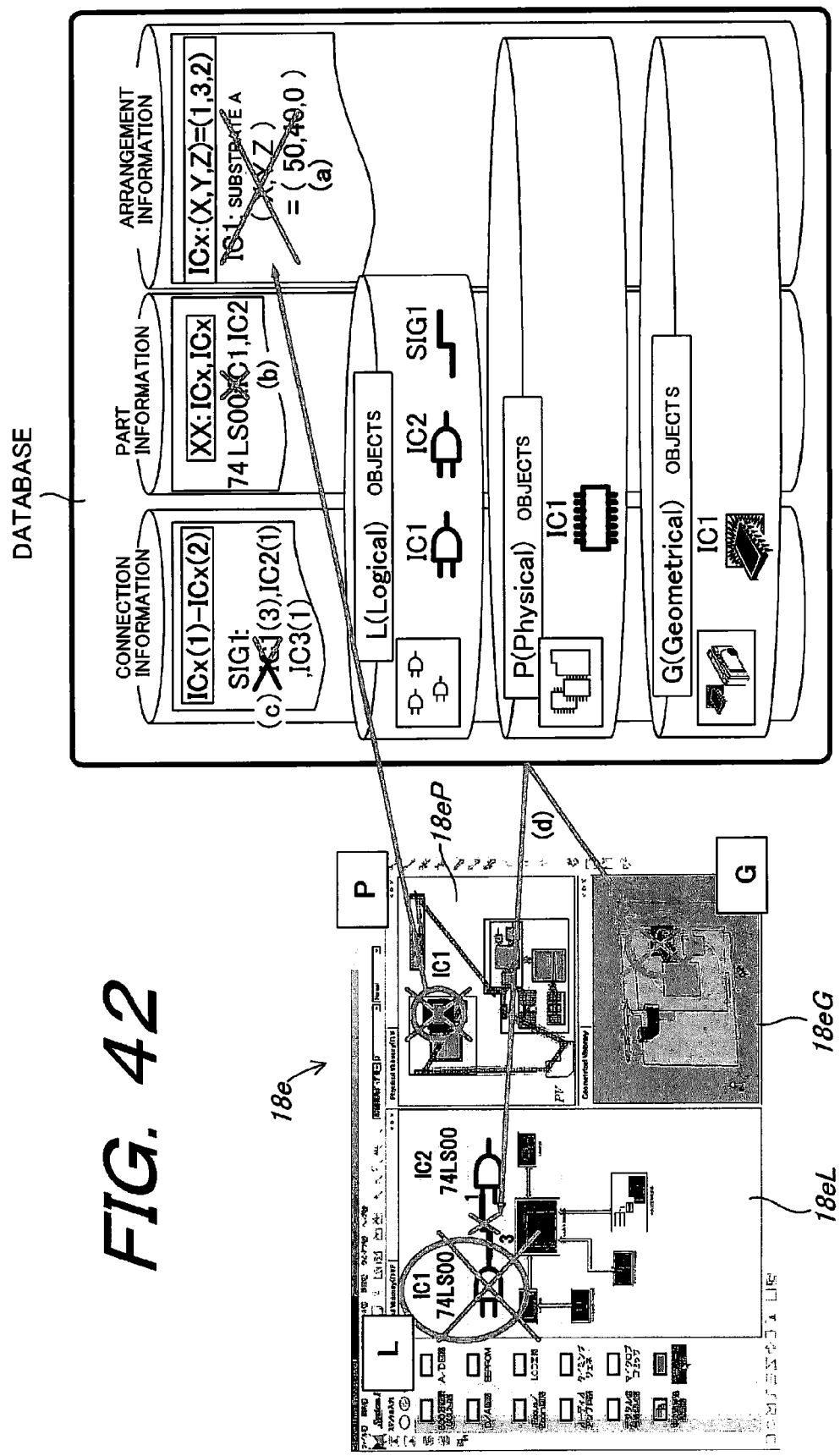
FIG. 42 is an explanatory view regarding a processing in which processing contents in the physical display region are reflected on the logical display region and the geometrical display region.

For example, referring to FIG. 42, description will be made for a processing of reflecting the processing contents in the physical display region 18*e*P on the logical display region 18*e*L and the geometrical display region 18*e*G. When an editing processing of deleting "IC1" on the physical display region 18*e*P is performed, (a) The arrangement information of IC1 is deleted from the arrangement information (refer to (a) of FIG. 42), (b) IC1 is deleted from the part information (refer to (b) of FIG. 42), (c) The connection information of IC1 is deleted from the connection information (refer to (c) of FIG. 42), and at the same time, (d) By reflecting the arrangement information, the part information and the connection information, from which IC1 was deleted, on the logical display region 18eL and the physical display region 18eP, IC1 and the connection information of IC1 are deleted from the logical display region 18eL and the physical display region 18eP (refer to (d) of FIG. 42), in the database on such occasion, As a result, changed contents of arrangement/wiring in the physical display region 18eP is reflected on the logical display region 18eL and the physical display region 18eP and the contents are synchronized.

(4) In the above-described embodiment, description was made mainly for the case of displaying the three display regions of the logical display region 18eL, the physical display region 18eP and the geometrical display region 18eG on the display screen of the display unit 18e of the client system 18 being a terminal.

However, it goes without saying that the present invention is not limited to this, and any two display regions out of the logical display region 18eL, the physical display region 18eP and the geometrical display region 18eG may be selectively displayed on the display screen of the display unit 18e of the terminal.

Specifically, the two display regions of the logical display region 18eL and the physical display region 18eP may be displayed, the two display regions of the logical display region 18eL and the geometrical display region 18eG may be displayed, or the two display regions of the physical display region 18eP and the geometrical display region 18eG may be displayed.

Further, instruction of selecting a display region to be displayed may be performed by operating the keyboard 18f, the mouse 18g or the like of the client system 18.

Meanwhile, in the case of displaying any two display regions out of the logical display region 18eL, the physical display region 18eP and the geometrical display region 18eG, it is different only on the point where two display regions are displayed on the display screen of the display unit 18e of a terminal, and the other processings are the same as the above-described embodiment.

(5) In the above-described embodiment, outputting of various design information regarding electric design by using the client system 18 being a terminal is also made possible.

Specifically, the client system 18 selects and outputs only necessary information regarding electric design from a circuit diagram by the unit of logical (functional) block unit, a substrate unit or the like, and information can be produced. It is to be noted that the information to be outputted denotes various design information regarding electric design of a circuit diagram, a parts list, a netlist or the like.

Herein, description will be made for an example of a processing in outputting design information by each function while referring to the flowchart of a processing routine showing a processing in outputting the design information shown in FIG. 43. First, when this processing routine is activated by the input of a predetermined command in the client system 18, the keyboard 18f, the mouse 18g or the like of the client system 18 is operated to select information of a part name, the number of parts, unit price of parts, power consumption of parts, name of a function block in which parts are arranged and circuit code out of information stored in the database, the information of the part name, the number of parts, the unit price of parts, the power consumption of parts, the name of a function block in which parts are arranged and the circuit code being the selected information is read out from the database, and the information is stored in the random access memory 18c (step S4302).

Next, based on the information stored in the random access memory 18c, parts are classified by the function block unit, and the information is stored in the random access memory 18c (step S4304).

Next, based on the information stored in the random access memory 18c, parts are classified by part names, the number of parts is tallied by each part name, and the information is stored in the random access memory 18c (step S4306).

Next, based on the information stored in the random access memory 18c, calculation processing of "the number of parts× unit price of part" is performed by each part name to tally a subtotal amount, a total amount is calculated from the tallied subtotal amount, and the subtotal amount and the total amount are stored in the random access memory 18c (step S4308).

Next, the information stored in the random access memory 18c is outputted to the display unit 18e, function block names are displayed in a tree view on the display screen of the display unit 18e based on the information stored in the random access memory 18c (step S4310), parts classified in a function block displayed on the top portion of the above-described tree view are displayed in a list by the part name unit, and the number of each part, a subtotal amount and a total amount are displayed (step S4312).

Next, a power consumption tally tag previously set on the display screen of the display unit 18e is clicked by the mouse 18g (step S4314).

Then, the function block name selected in the above-described tree view is detected (step S4316), part names are displayed in a list by reading out parts classified in the function block of the detected function block name from the random access memory 18c and by outputting them to the display unit 18e (step S4318), circuit code and power consumption of each part displaying a part names are displayed in a list (step S4320), power consumption of part classified in the function block of the detected function block are totalized and displayed (step S4322), and this processing is ended.

Figure 47:
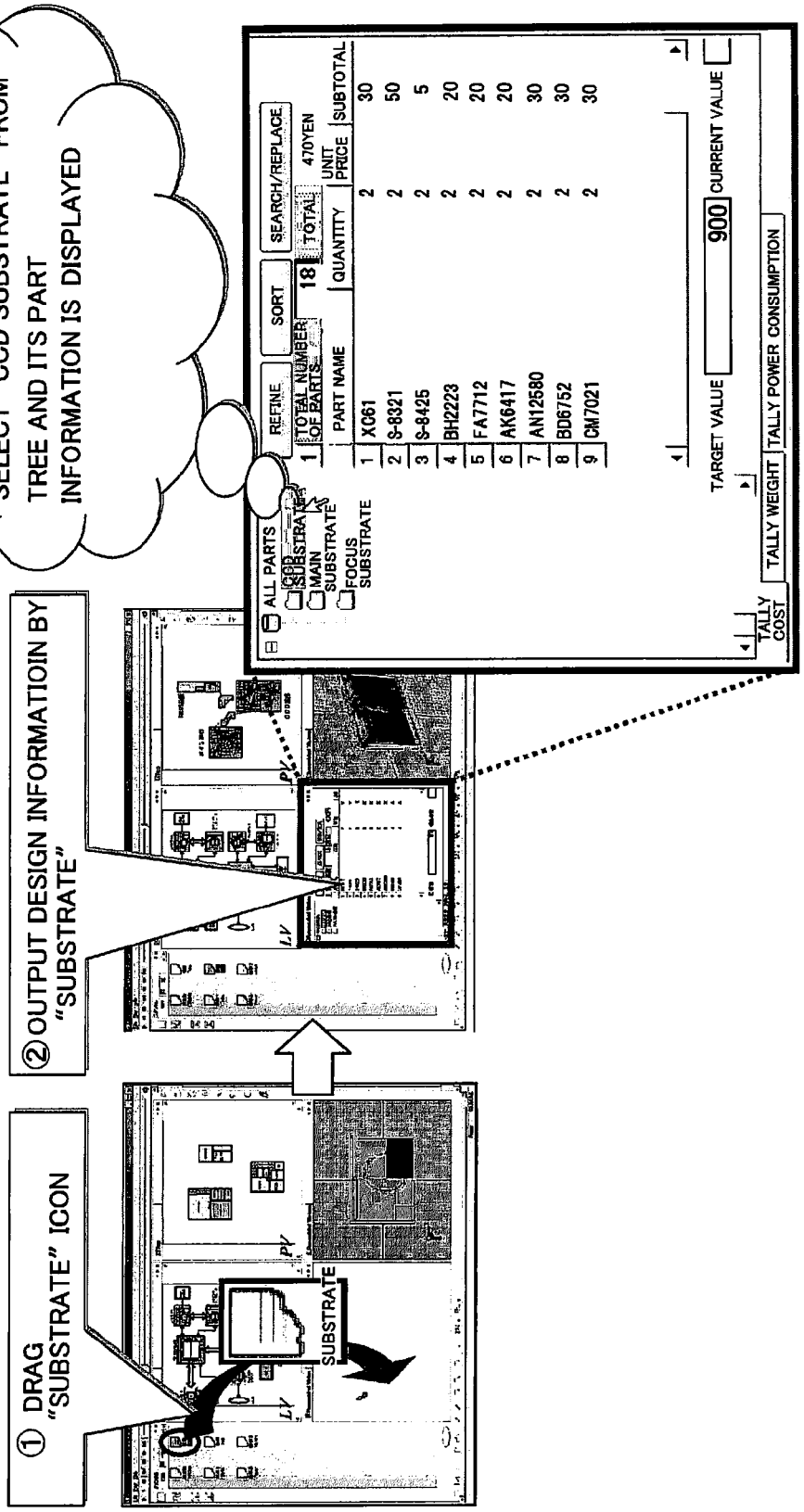
FIG. 47 is an operation explanatory view showing a display screen in the processing in outputting design information by substrate.

Next, while referring to the flowchart of a processing routine showing a processing of outputting the design information shown in FIG. 44 and an operation explanatory view expressing a display screen in a processing when outputting the design information shown in FIG. 47, description will be made for an example of a processing in outputting design information by each substrate. First, when this processing routine is activated by the input of a predetermined command in the client system 18, the keyboard 18f, the mouse 18g or the like of the client system 18 is operated and the information of the part name, the number of parts, the unit price of parts and the name of a substrate on which parts are arranged is selected out of the information stored in the database (refer to "Drag "substrate" icon" in FIG. 47), the information of the part names, the number of parts, the unit price of parts and the name of a substrate on which parts are arranged, that is, the selected information is read out from the database, and the information is stored in the random access memory 18c (step S4402).

Next, based on the information stored in the random access memory 18c, parts are classified by the unit of substrate, and the information is stored in the random access memory 18c (step S4404).

Next, based on the information stored in the random access memory 18c, parts are classified by part names, the number is tallied by each part name and it is stored in the random access memory 18c (step S4406).

Next, based on the information stored in the random access memory 18c, the calculation processing of "the number of parts×unit price of part" is performed by each part name to tally a subtotal amount, a total amount is calculated from the tallied subtotal amount and the subtotal amount and the total amount are stored in the random access memory 18c (step S4408).

Next, the information stored in the random access memory 18c is outputted to the display unit 18e, substrate names are displayed in a tree view on the display screen of the display unit 18e based on the information stored in the random access memory 18c (step S4410), parts classified on a substrate displayed on the top portion of the above-described tree view parts are displayed in a list by the part name unit, the number of each part, a subtotal amount and a total amount are displayed (step S4412) (refer to "output design information by each "substrate"" in FIG. 47), and this processing is ended.

Next, while referring to the flowchart of a processing routine showing a processing in outputting the design information shown in FIG. 45, description will be made for an example of a processing in outputting the design information by the model type unit of products. First, when this processing routine is activated by the input of a predetermined command in the client system 18, the keyboard 18f, the mouse 18g or the like of the client system 18 is operated and information of the part names, the number of parts, the unit price of parts, the power consumption of parts, the model types, the cost target of each model type, the power consumption target of each model type and comment of each model type is selected out of the information stored in the database, the information of the part names, the number of parts, the unit price of parts, the power consumption of parts, the model types, the cost target of each model type, the power consumption target of each model type and the comment of each model type, that is, the selected information is read out from the database, and the information is stored in the random access memory 18c (step S4502).

Next, based on the information stored in the random access memory 18c, parts are classified by the unit of model type, and is stored in the random access memory 18c (step S4504).

Next, based on the information stored in the random access memory 18c, the unit price and the power consumption of parts are totalized, the total amount and the power consumption of each model type are calculated, and stored in the random access memory 18c (step S4506).

Next, the information stored in the random access memory 18c is outputted to the display unit 18e, and the total amount and the power consumption of each model type, which was calculated on step S4506, is displayed based on the information stored in the random access memory 18c (step S4508), the cost target and the power consumption target of model types and the comment of model types are displayed (step S4510), and this processing is ended.

Figure 44:
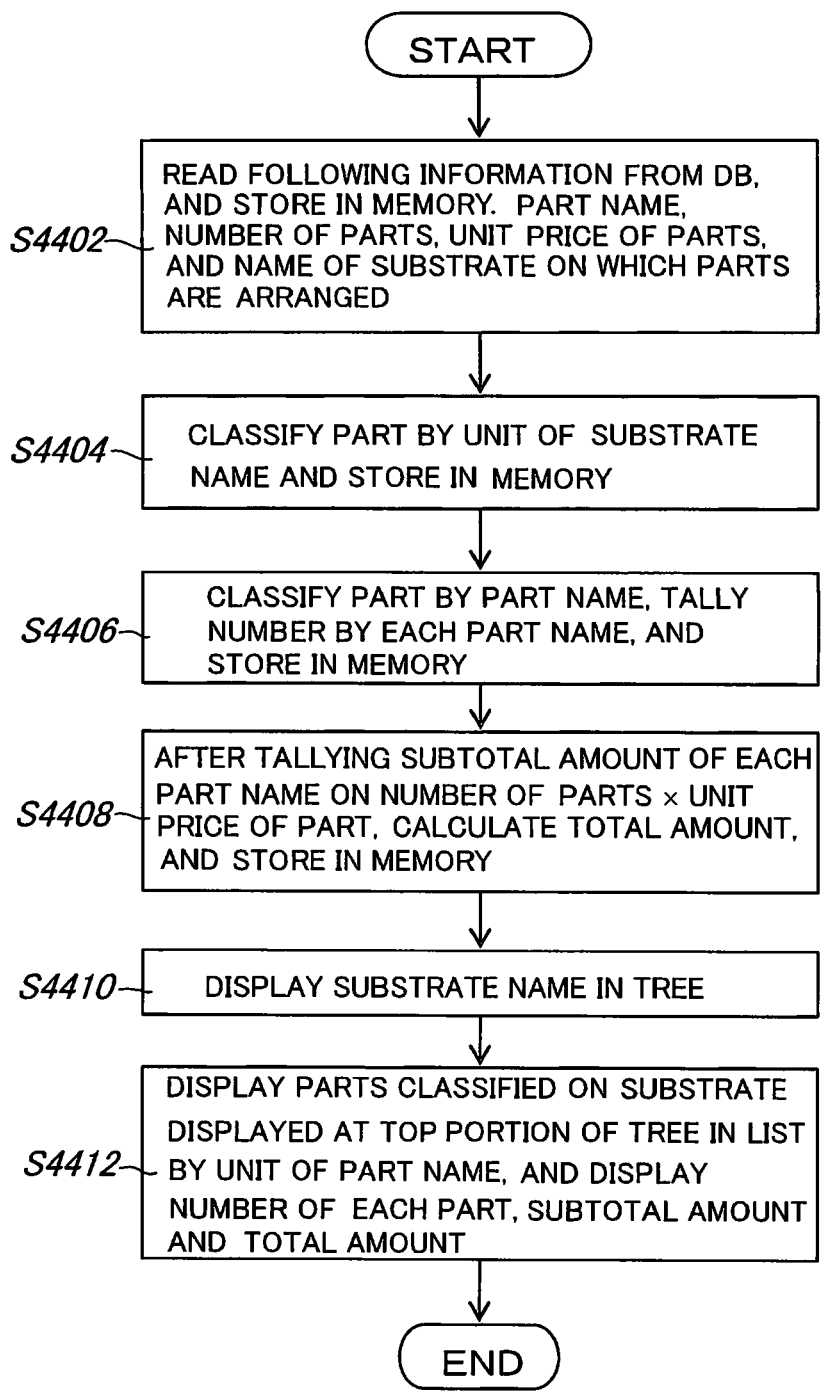
FIG. 44 is a flowchart of processing routine showing a processing in outputting design information by substrate.
Figure 45:
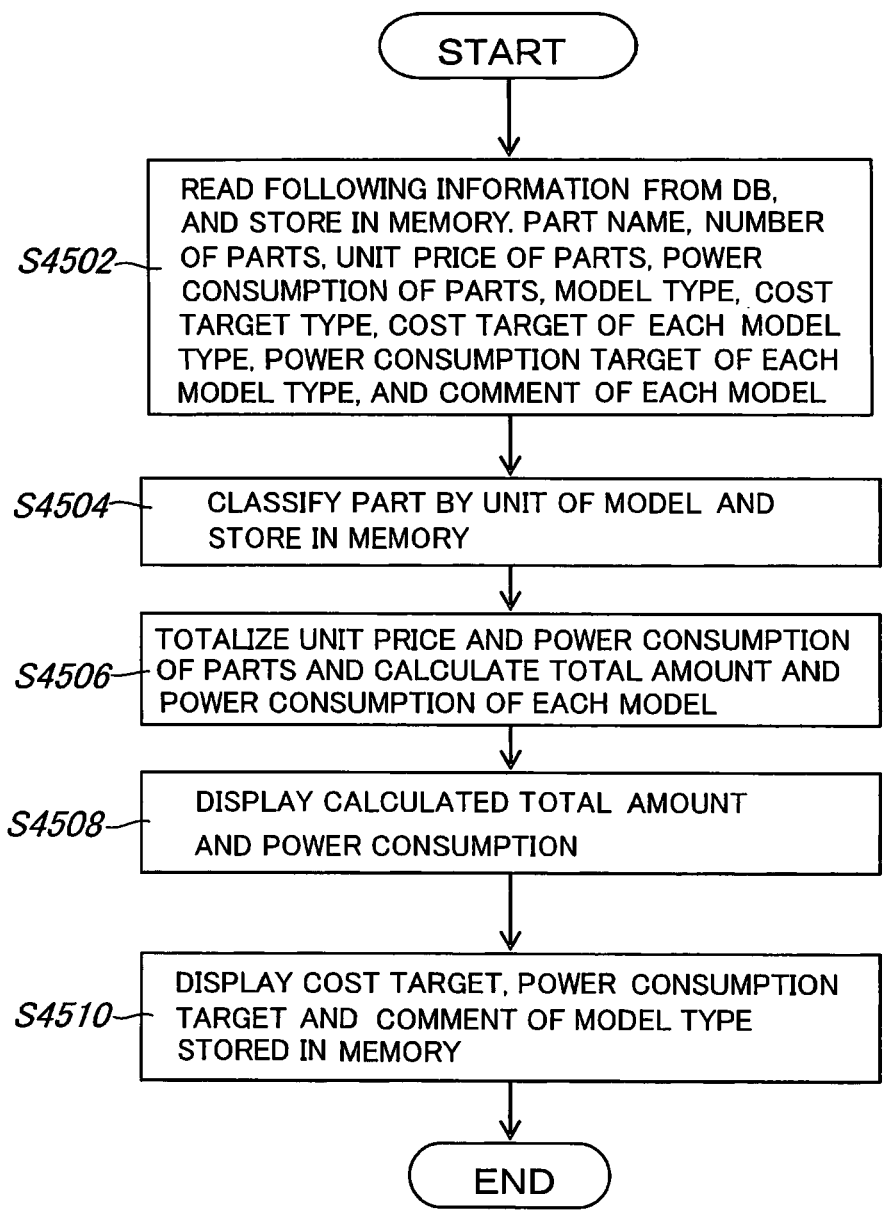
FIG. 45 is a flowchart of a processing routine showing a processing in outputting design information by the unit of model type.

Meanwhile, in the processing shown in the flowcharts of FIG. 43, FIG. 44 and FIG. 45, the design information was displayed by outputting to the display unit 18e, but it goes without saying that the invention is not limited to this, and the design information may be outputted to another output device such as a printer and a storage medium instead of outputting to the display unit 18e.

(6) In the above-described embodiment, association and reference of various design information are also made possible by using the client system 18 being a terminal.

Specifically, information regarding electric design such as the circuit diagram, the parts list and the netlist were associated. Meanwhile, it is also possible to refer to only associated information (such as only the parts list of the logical block A) from particular design information (such as a circuit diagram).

Figure 46:
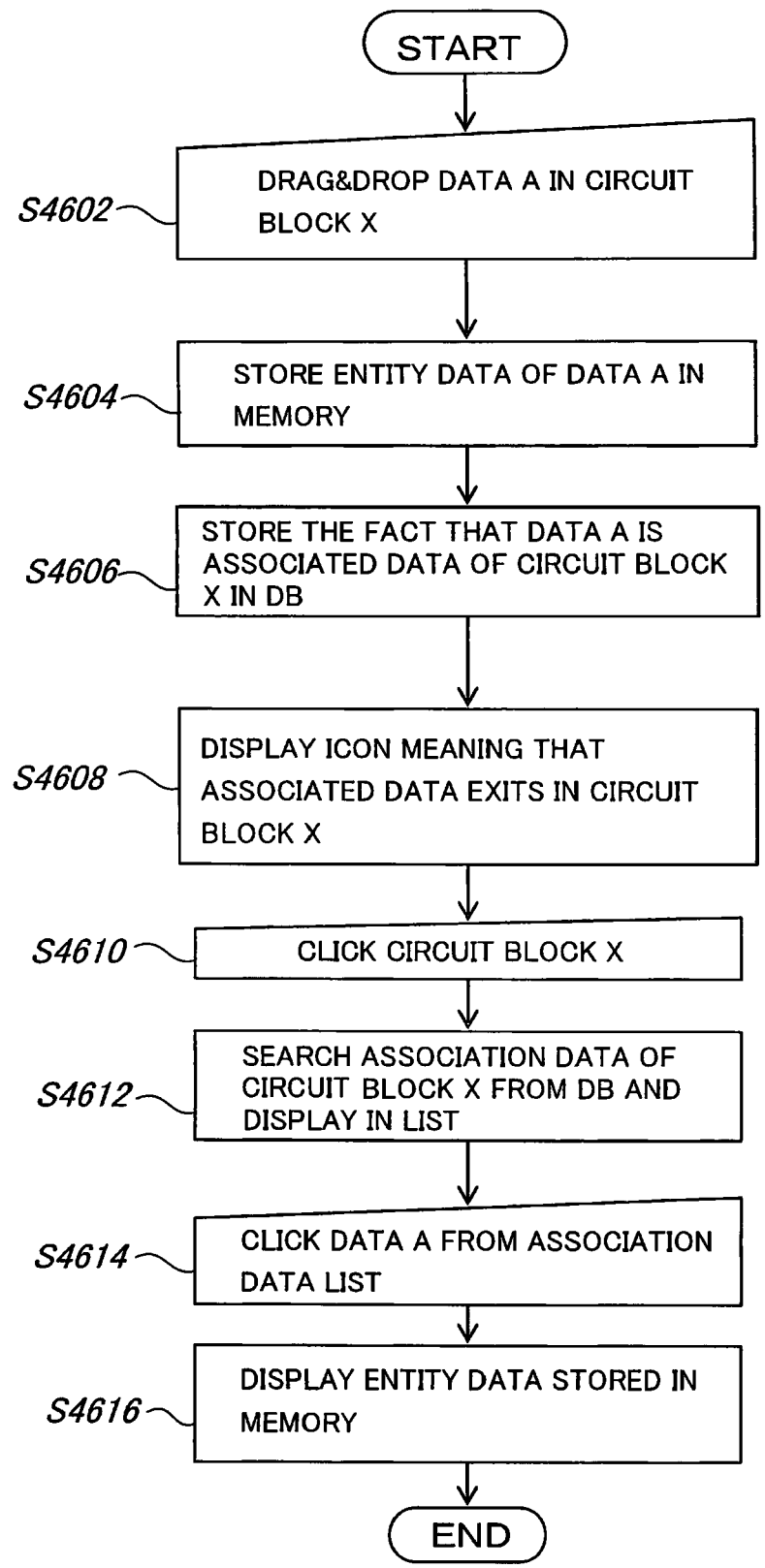
FIG. 46 is a flowchart of a processing routine showing a processing in associating design information.

Herein, while referring to the flowchart of a processing routine showing the processing in associating the design information shown in FIG. 46 and the operation explanatory view illustrating a display screen in the processing in associating the design information shown in FIG. 48, description will be made for a processing of associating data A with a circuit block X as an example of the association processing of design information.

First, when this processing routine is activated by the input of a predetermined command or the like in the client system 18, the data A is dragged to the circuit block X and dropped on the display screen of the display unit 18e by using the mouse 18g (step S4602). More specifically, the data A and the circuit block X are selected as design information to be associated, and an operation for associating the data A with the circuit block X is performed by drag and drop using the mouse 18g (refer to "drag PDF to associate" in FIG. 48).

Next, entity data showing the data A is stored in the random access memory 18c (step S4604), the fact that the data A is the associated data of the circuit block X is transmitted to the database and stored in the database (step S4604).

Next, an icon meaning that an associated data exists is displayed on the display region of the circuit block X on the display screen of the display unit 18e (step S4608).

Figure 48:
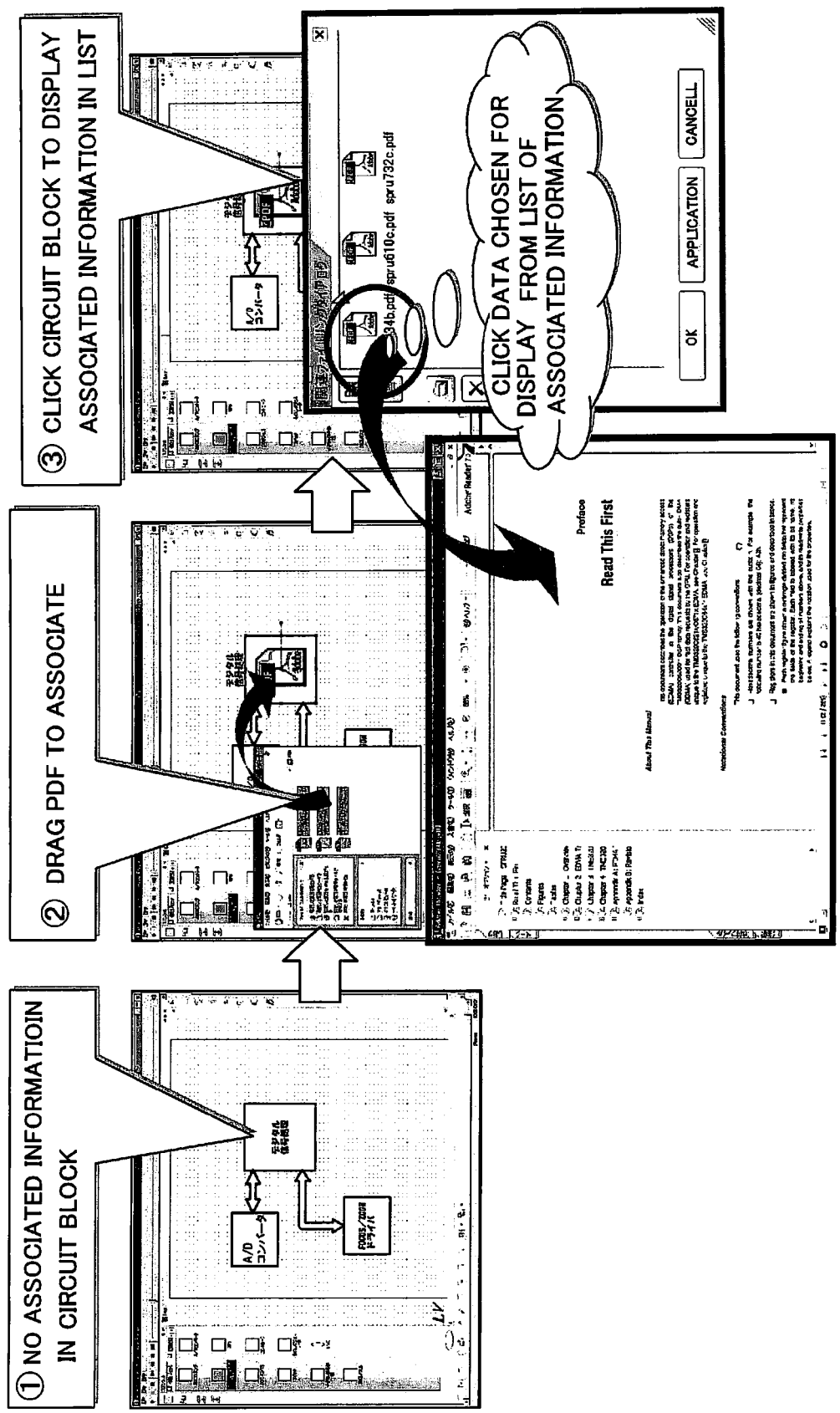
FIG. 48 is an operation explanatory view showing a display screen in the processing in associating design information.

Next, when the circuit block X is clicked by using the mouse 18g (step S4610), the associated data of the circuit block X is searched from the database and displayed in a list (step S4612) (refer to "Click a circuit block to display associated information in a list" in FIG. 48).

Then, when the data A is clicked from the list of associated data by using the mouse 18g (step S4614) (refer to "Click data that needs to be displayed from the list of related information" in FIG. 48), entity data of the data A stored in the random access memory 18c is displayed (step S4616), and this processing is ended.

Now, in the processing in associating the design information, design information to be outputted in the output processing of various design information in the above-described (5) may be selected as the design information to be associated.

(7) The above-described embodiments and the modification examples shown in (1) to (6) may be appropriately combined.

INDUSTRIAL APPLICABILITY

The present invention can be utilized in designing various products.

The invention claimed is:

1. A designing support method in which design information is displayed on a display unit and design is performed by a designing support equipment which has:
a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;
selecting means for selecting at least two displays out of said first display, said second display and said third display;
storing means for storing existing information and shape library which are previously stored information first design information regarding electrical connection information, part information to be used and arrangement information of parts; and an object for said first display, an object for said second display and an object for said third display which are built based on said shape library and said first design information, into database as design information of the objects to be designed; and control means for controlling displayed contents on a display selected by said selecting means on said display unit based on the design information of said objects to be designed stored in said storing means, wherein said control means executes:

a step of displaying a display that said selecting means selected out of said first display, said second display and said third display on said display unit regarding the same object to be designed, and arranging and displaying said object to be designed on a selected display out of said first display, said second display and said third display based on the design information of said objects to be designed respectively;

a step of, when at least any editing processing of changing, deleting, adding and moving of a part in any of said first display, said second display or said third display that a user performed by using a pointing device is performed, changing said first design information in said database based on the editing processing, such that the design information of said object to be designed stored in said database holds matching, changing the contents of the object for said first display, the object for said second display and the objet for said third display based on said first design information and changing the displayed contents of display to which editing processing was performed based on the changed design information of said object to be designed; and a step of changing displayed contents of said first display, said second display or said third display whose displayed contents did not change based on said first design information in said database such that said first display, said second display and said third display after the editing processing move in a coordinated manner and synchronize in real time in order to hold matching with the displayed contents of said first display, said second display or said third display which was changed by the editing processing, based on the changed design information of said object to be designed.

2. A designing support method in which design information is displayed on a display unit and design is performed by a designing support equipment which has:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing existing information and shape library which are previously stored information; first design information regarding electrical connection information, parts information to be used and arrangement information of parts; and an object for said first display, an object for said second display and an object for said third display which are built based on said shape library and said first design information, into database as design information of the objects to be designed; and control means for controlling displayed contents on a display selected by said selecting means on said display unit based on the design information of said objects to be designed stored in said storing means, wherein said control means executes:

a step of displaying a display that said selecting means selected out of said first display, said second display and said third display on said display unit regarding the same object to be designed, and arranging and displaying said object to be designed on a selected display out of said first display, said second display and said third display based on the design information of said objects to be designed respectively;

a step of, when at least any editing processing of changing, deleting and adding of connection information in any of said first display, said second display or said third display that a user performed by using a pointing device is performed, changing said first design information in said database based on the editing processing such that the design information of said object to be designed stored in said database holds matching, changing the contents of the object for said first display, the object for said second display and the object for said third display based on said first design information, and changing the displayed contents of display to which editing processing was performed based on the changed design information of said object to be designed; and a step of changing displayed contents of said first display, said second display or said third display whose displayed contents did not change based on said first design information in said database such that said first display, said second display and said third display after the editing processing move in a coordinated manner and synchronize in real time in order to hold matching with the displayed contents of said first display, said second display or said third display which was changed by the editing processing, based on the changed design information of said object to be designed.

3. A designing support method in a designing support equipment that displays design information on a display unit and performs design, the equipment comprising:

a plurality of terminals connected via a network; and terminal control means for controlling said plurality of terminals, which are connected via said network, via said network, and said terminal has:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing existing information and shape library which are previously stored information; first design information regarding electrical connection information, parts information to be used and arrangement information of parts; and an object for said first display, an object for said second display and an object for said third display which are built based on said shape library and said first design information, into database as design information of the objects to be designed; and control means for controlling displayed contents on a display selected by said selecting means on said display unit based on the design information of said objects to be designed stored in said storing means, wherein said control means executes:

a step of displaying a display that said selecting means selected out of said first display, said second display and said third display on said display unit regarding the same object to be designed, and arranging and displaying said object to be designed on a selected display out of said first display, said second display and said third display based on the design information of said objects to be designed respectively;

a step of, when at least any editing processing of changing, deleting, adding and moving of a part in any of said first display, said second display or said third display that a user performed by using a pointing device is performed, changing said first design information in said database based on the editing processing such that the design information of said object to be designed stored in said database holds matching, changing the contents of the object for said first display, the object for said second display and the object for said third display based on said first design information, and changing the displayed contents of display to which editing processing was performed based on the changed design information of said object to be designed; and a step of changing displayed contents of said first display, said second display or said third display whose displayed contents did not change based on said first design information in said database such that said first display, said second display and said third display after the editing processing move in a coordinated manner and synchronize in real time in order to hold matching with the displayed contents of said first display, said second display or said third display which was changed by the editing processing, based on the changed design information of said object to be designed, and said terminal control means executes:

a step of detecting a change of displayed contents severally displayed on said display units of said plurality of terminals; and a step of changing the displayed contents of terminal whose displayed contents did not change so as to hold matching with the displayed contents of a terminal whose displayed contents changed, when the change of displayed contents is detected on said detecting step.

4. A designing support method in a designing support equipment that displays design information on a display unit and performs design, the equipment comprising:

a plurality of terminals connected via a network; and terminal control means for controlling said plurality of terminals, which are connected via said network, via said network, wherein said terminal has:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing existing information and shape library which are previously stored information; first design information regarding electrical connection information, parts information to be used and arrangement information of parts; and an object for said first display, an object for said second display and an object for said third display which are built based on said shape library and said first design information, into database as design information of the objects to be designed; and control means for controlling displayed contents on a display selected by said selecting means on said display unit based on the design information of said objects to be designed stored in said storing means, wherein said control means executes:

a step of displaying a display that said selecting means selected out of said first display, said second display and said third display on said display unit regarding the same object to be designed, and arranging and displaying said object to be designed on a selected display out of said first display, said second display and said third display based on the design information of said objects to be designed respectively;

a step of, when at least any editing processing of changing, deleting and adding of connection information in any of said first display, said second display or said third display that a user performed by using a pointing device is performed, changing said first design information in said database based on the editing processing such that the design information of said object to be designed stored in said database holds matching, changing the contents of the object for said first display, the object for said second display and the object for said third display based on said first design information, and changing the displayed contents of display to which editing processing was performed based on the changed design information of said objects to be designed; and a step of changing displayed contents of said first display, said second display or said third display whose displayed contents did not change based on said first design information in said database such that said first display, said second display and said third display after the editing processing move in a coordinated manner and synchronize in real time in order to hold matching with the displayed contents of said first display, said second display or said third display which was changed by the editing processing, based on the changed design information of said objects to be designed, and said terminal control means executes:

a step of detecting a change of displayed contents severally displayed on said display units of said plurality of terminals; and a step of changing the displayed contents of terminal whose displayed contents did not change so as to hold matching with the displayed contents of a terminal whose displayed contents changed, when the change of displayed contents is detected on said detecting step.

5. A designing support equipment that displays design information on a display unit and performs design, said equipment comprising:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing existing information and shape library which are previously stored information; first design information regarding electrical connection information, parts information to be used and arrangement information of parts; and an object for said first display, an object for said second display and an object for said third display which are built based on said shape library and said first design information, into database as design information of the objects to be designed; and control means for displaying a display that said selecting means selected out of said first display, said second display and said third display on said display unit regarding the same object to be designed, and arranging and displaying said object to be designed on a selected display out of said first display, said second display and said third display based on the design information of said objects to be designed respectively; when at least any editing processing of changing, deleting, adding and moving of a part in any of said first display, said second display or said third display that a user performed by using a pointing device is performed, changing said first design information in said database based on the editing processing, such that the design information of said object to be designed stored in said database holds matching, changing the contents of the object for said first display, the object for said second display and the object for said third display based on said first design information and changing the displayed contents of display to which editing processing was performed based on the changed design information of said object to be designed; and changing displayed contents of said first display, said second display or said third display whose displayed contents did not change based on said first design information in said database such that said first display, said second display and said third display after the editing processing move in a coordinated manner and synchronize in real time in order to hold matching with the displayed contents of said first display, said second display or said third display which was changed by the editing processing, based on the changed design information of said object to be designed.

6. A designing support equipment that displays design information on a display unit and performs design, said equipment comprising:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing existing information and shape library which are previously stored information; first design information regarding electrical connection information, parts information to be used and arrangement information of parts; and an object for said first display, an object for said second display and an object for said third display which are built based on said shape library and said first design information, into database as design information of the objects to be designed; and control means for displaying a display that said selecting means selected out of said first display, said second display and said third display on said display unit regarding the same object to be designed, and arranging and displaying said object to be designed on a selected display out of said first display, said second display and said third display based on the design information of said objects to be designed respectively; when at least any editing processing of changing, deleting and adding of connection information in any of said first display, said second display or said third display, that a user performed by using a pointing device is performed, changing said first design information in said database based on the editing processing such that the design information of said object to be designed stored in said database holds matching, changing the contents of the object for said first display the object for said second display and the object for said third display based on said first design information, and changing the displayed contents of display to which editing processing was performed based on the changed design information of said object to be designed; and changing displayed contents of said first display, said second display or said third display whose displayed contents did not change based on said first design information in said database such that said first display, said second display and said third display after the editing processing move in a coordinated manner and synchronize in real time in order to hold matching with the displayed contents of said first display, said second display or said third display which was changed by the editing processing, based on the changed design information of said object to be designed.

7. A designing support equipment that displays design information on a display unit and performs design, said equipment comprising:

a plurality of terminals connected via a network; and terminal control means for controlling said plurality of terminals, which are connected via said network, via said network, wherein said terminal has:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing: existing information and shape library which are previously stored information; first design information regarding electrical connection information, parts information to be used and arrangement information of parts; and an object for said first display, an object for said second display and an object for said third display which are built based on said shape library and said first design information, into database design information of the objects to be designed; and control means for displaying a display that said selecting means selected out of said first display, said second display and said third display on said display unit regarding the same object to be designed, and arranging and displaying said object to be designed on a selected display out of said first display, said second display and said third display based on the design information of said objects to be designed respectively; when at least any editing processing of changing, deleting, adding and moving of a part in any of said first display, said second display or said third display that a user performed by using a pointing device is performed, changing said first design information in said database based on the editing processing such that the design information of said object to be designed stored in said database holds matching, changing the contents of the object for said first display, the object for second display and the object for said third display based on said first design information, and changing the displayed contents of display to which editing processing was performed based on the changed design information of said object to be designed; and changing displayed contents of said first display, said second display or said third display whose displayed contents did not change based on said first design information in said database such that said first display, said second display and said third display after the editing processing move in a coordinated manner and synchronize in real time in order to hold matching with the displayed contents of said first display, said second display or said third display which was changed by the editing processing, based on the changed design information of said object to be designed, and said terminal control means has:

detecting means for detecting a change of displayed contents in said first display, said second display and said third display severally displayed on said display units of said plurality of terminals; and among-terminal display matching means for, when said detecting means detected the change of displayed contents, changing the displayed contents to said first display, said second display and said third display severally in terminals whose displayed contents did not change so as to hold matching with the displayed contents of a terminal whose displayed contents changed.

8. A designing support equipment that displays design information on a display unit and performs design, said equipment comprising:

a plurality of terminals connected via a network; and terminal control means for controlling said plurality of terminals, which are connected via said network, via said network, wherein said terminal has:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing: existing information and shape library which are previously stored information; first design information regarding electrical connection information, parts information to be used and arrangement information of parts; and an object for said first display, an object for said second display and an object for said third display which are built based on said shape library and said first design information, into database as design information of the objects to be designed; and control means for displaying a display that said selecting means selected out of said first display, said second display and said third display on said display unit regarding the same object to be designed, and arranging and displaying said object to be designed on a selected display out of said first display, said second display and said third display based on the design information of said objects to be designed respectively; when at least any editing processing of changing, deleting and adding of connection information in any of said first display, said second display or said third display that a user performed by using a pointing device is performed, changing said first design information in said database based on the editing processing such that the design information of said object to be designed stored in said database holds matching, changing the contents of the object for said first display, the object for said second display and the object for said third display based on said first design information, and changing the displayed contents of display to which editing processing was performed based on the changed design information of said object to be designed; and changing displayed contents of said first display, said second display or said third display whose displayed contents did not change based on said first design information in said database such that said first display, said second display and said third display after the editing processing move in a coordinated manner and synchronize in real time in order to hold matching with the displayed contents of said first display, said second display or said third display which was changed by the editing processing, based on the changed design information of said object to be designed, and said terminal control means has:

detecting means for detecting a change of displayed contents in said first display, said second display and said third display severally displayed on said display units of said plurality of terminals; and among-terminal display matching means for, when said detecting means detected the change of displayed contents, changing the displayed contents to said first display, said second display and said third display severally in terminals whose displayed contents did not change so as to hold matching with the displayed contents of a terminal whose displayed contents changed.

9. The designing support equipment according to claim 5, wherein said design information logically expressing an electrical operation is design information including logical blocks in which the electrical operation is logically classified.

10. The designing support equipment according to claim 6, wherein said design information logically expressing an electrical operation is design information including logical blocks in which the electrical operation is logically classified.

11. The designing support equipment according to claim 7, wherein said design information logically expressing an electrical operation is design information including logical blocks in which the electrical operation is logically classified.

12. The designing support equipment according to claim 8, wherein said design information logically expressing an electrical operation is design information including logical blocks in which the electrical operation is logically classified.

13. The designing support equipment according to claim 5, wherein the design information expressing said objects to be designed in a physical two-dimensional shape has at least one or more substrates, and also includes electrical connection information of a plurality of substrates and between said plurality of substrates.

14. The designing support equipment according to claim 6, wherein
the design information expressing said objects to be designed in a physical two-dimensional shape has at least one or more substrates, and also includes electrical connection information of a plurality of substrates and between said plurality of substrates.

15. The designing support equipment according to claim 7, wherein
the design information expressing said objects to be designed in a physical two-dimensional shape has at least one or more substrates, and also includes electrical connection information of a plurality of substrates and between said plurality of substrates.

16. The designing support equipment according to claim 8, wherein
the design information expressing said objects to be designed in a physical two-dimensional shape has at least one or more substrates, and also includes electrical connection information of a plurality of substrates and between said plurality of substrates.

17. The designing support equipment according to claim 5, wherein
the design information expressing said objects to be designed in a physical three-dimensional shape includes electrical connection information.

18. The designing support equipment according to claim 6, wherein
the design information expressing said objects to be designed in a physical three-dimensional shape includes electrical connection information.

19. The designing support equipment according to claim 7, wherein
the design information expressing said objects to be designed in a physical three-dimensional shape includes electrical connection information.

20. The designing support equipment according to claim 8, wherein
the design information expressing said objects to be designed in a physical three-dimensional shape includes electrical connection information.

21. A designing support equipment that displays design information on a display unit and performs design, said equipment comprising:
a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;
selecting means for selecting at least two displays out of said first display, said second display and said third display;
storing means for storing design information of the objects to be designed; and
control means for: displaying a display that said selecting means selected out of said first display, said second display and said third display on said display unit regarding the same object to be designed, based on the design information of said objects to be designed respectively; when at least any editing processing of changing, deleting, adding and moving of a part in any of said first display, said second display or said third display is performed, changing the design information of said object to be designed based on the editing processing, and changing the displayed contents of display to which editing processing was performed based on the changed design information of said object to be designed; and changing displayed contents of said first display, said second display or said third display whose displayed contents did not change so as to hold matching with the displayed contents of said first display, said second display or said third play which was changed by the editing processing, based on the chanted design information of said object to be designed, wherein
said control means has:
automatic generating means for automatically generating a connector and a flexible substrate while holding matching of displayed contents on said second display and said third display.

22. A designing support equipment that displays design information on a display unit and performs design, said equipment comprising:
a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objets to be designed in a physical time-dimensional shape;
selecting means for selecting at least two displays out of said first display, said second display and said third display;
storing means for storing design information of the objects to be designed; and
control means for: displaying a display that said selecting means selected out of said first display, said second display and said third display on said display unit regarding the same object to be designed, based on the design information of said objects to be designed respectively; when at least any editing processing of changing, deleting and adding of connection information in any of said first display, said second display or said third display is performed, changing the design information of said object to be designed based on the editing processing, and changing the displayed contents of display to which editing processing was performed based on the changed design information of said object to be designed; and changing displayed contents of said first display, said second display or said third display whose displayed contents did not change so as to hold matching with the displayed contents of said first display, said second display or said third display which was changed by the editing processing, based on the changed design information of said object to be designed, wherein
said control means has:
automatic generating means for automatically generating a connector and a flexible substrate while holding matching of displayed contents on said second display and said third display.

23. A designing support equipment that displays design information on a display unit and performs design, said equipment comprising:
a plurality of terminals connected via a network; and
terminal control means for controlling said plurality of terminals, which are connected via said network, via said network wherein
said terminal has
a display unit capable of displaying side by side any two or more of a first display that displays design information logically expressing the electrical operation of objects to be designed, a second display that displays design in expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing design information of the objects to be designed; and control means for: displaying a display that said selecting means selected out of said first display, said second display and said third display on said display unit regarding the same object to be designed, based on the design information of said objects to be designed respectively; when at least any editing processing of changing, deleting, adding and moving of a part in any a said first display, said second display or said third display is performed, changing the design information of said object to be designed based on the editing processing, and changing the displayed contents of display to which editing processing was performed based on the changed design information a said object to be designed; and changing displayed contents of said first display, said second display or said third display whose displayed contents did not change so as to hold matching with the displayed contents of said first display, said second display or said third display which was changed by the editing processing, based on the changed design information of said object to be designed, and said terminal control means has:

detecting means for detecting a change of displayed contents severally displayed on said display units of said plurality of terminals; and among-terminal display matching means for changing the displayed contents of terminals whose displayed contents did not change so as to hold matching with the displayed contents of a terminal whose displayed contents changed when said detecting means detect the change of displayed contents, wherein said control means has:

automatic generating means for automatically generating a connector and a flexible substrate while holding matching of displayed contents on said second display and said third display.

24. A designing support equipment that displays design information on a display unit and performs design, said equipment comprising:

a plurality of terminals connected via a network; and terminal control means for controlling said plurality of terminals, which are connected via said network, via said network, wherein said terminal has:

a display unit capable of displaying side by side any two or more of a first display that displays design information logically expressing the electrical operation of objects to be designed, a second display that displays design information expressing the objects to be designed in a physical two-dimensional shape and a third display that displays design information expressing the objects to be designed in a physical three-dimensional shape;

selecting means for selecting at least two displays out of said first display, said second display and said third display;

storing means for storing design information of the objects to be designed and control means for: displaying a display that said selecting means selected out of said first display, said second display and said third display on said display unit regarding the same object to be designed, based on the design information of said objects to be designed respectively; when at least any editing processing of changing, deleting and adding of connection information in any of said first display, said second display or said third display is performed, changing the design information of said object to be designed based on the editing processing, and changing the displayed contents of display to which editing processing was performed based on the changed design information of said object to be designed; and changing displayed contents of said first display, said second display or said third display whose displayed contents did not change so as to hold matching with the displayed contents of said first display, said second display or said third display which was changed by the editing processing, based on the changed design information of said object to be designed, and said terminal control means has:

detecting means for detecting a change of displayed contents severalty displayed on said display units of said plurality of terminals; and among-terminal display matching means for changing the displayed contents of terminals whose displayed contents did not change so as to hold matching with the displayed contents of a terminal whose displayed contents changed when said detecting means detected the change of displayed contents, wherein said control means has:

automatic generating means for automatically generating a connector and a flexible substrate while holding matching of displayed contents on said second display and said third display.

25. A designing support equipment that displays design information on a display unit and performs design, said equipment comprising:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing design information of the objects to be designed; and control means for: displaying a display that said selecting means selected out of said first display, said second display and said third display on said display unit regarding the same object to be designed, based on the design information of said objects to be designed respectively; when at least any editing processing of changing, deleting, adding and moving of a part in any of said first display, said second display or said third display is performed, changing the design information of said object to be designed based on the editing processing, and changing the displayed contents of display to which editing processing was performed based on the changed design information of said objects to be design; and changing displayed contents of said first display, said second display or said third display whose displayed contents did not change so as to hold matching with the displayed contents of said first display, said second display or said third display which was changed by the editing processing, based on the changed design information of said object to be designed, wherein said control means has:

automatic changing means for automatically changing a connector and a flexible substrate while holding matching of displayed contents on said second display and said third display.

26. A designing support equipment that displays design information on a display unit and performs design, said equipment comprising:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing design information of the objects to be designed; and control means for: displaying a display that said selecting means selected out of said first display, said second display and said third display on said display unit regarding the same object to be designed, based on the design information of said objects to be designed respectively; when at least any editing processing of changing, deleting and adding of connection information in any of said first display, said second display or said third display is performed, changing the design information of said object to be designed based on the editing processing, and changing the displayed contents of display to which editing processing was performed based on the changed design information of said object to be designed; and changing displayed contents of said first display, said second display or said third display whose displayed contents did not change so as to hold matching with the displayed contents of said first display, said second display or said third display which was changed by the editing processing, based on the changed design information of said object to be designed, wherein said control means has:

automatic changing means for automatically changing a connector and a flexible substrate while holding matching of displayed contents on said second display and said third display.

27. A designing equipment that displays design information on a display unit and performs design, said equipment comprising:

a plurality of terminals connected via a network; and terminal control means for controlling said plurality of terminals, which are connected via said network, via said network, wherein said terminal has:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting, means for selecting at least two displays out of said first display, said second display and said third display;

storing means for storing design information of the objects to be designed; and control means for: displaying a display that said selecting means selected out of said first display, said second display and said third display on said display unit regarding the same object to be designed, based on the design information of said objects to be designed respectively; when at least any editing processing of changing, deleting, adding and moving of a part in any of said first display, said second display or said third display is performed, changing the design information of said object to be designed based on the editing processing, and changing the displayed contents of display to which editing processing was performed based on the changed design information of said object to be designed: and changing displayed contents of said first display, said second display or said third display whose displayed contents did not change so as to hold matching with the displayed contents of said first display, said second display or said third display which was changed by the editing processing, based on the changed design information of said object to be designed, and said terminal control means has:

detecting means for detecting a change of displayed contents severally displayed on said display units of said plurality of terminals; and among-terminal display matching means for changing the displayed contents of terminals whose displayed contents did not change so as to hold matching with the displayed contents of a terminal whose displayed contents changed when said detecting means detected the change of displayed contents, wherein said control means has:

automatic changing means for automatically changing a connector and a flexible substrate while holding matching of displayed contents on said second display and said third display.

28. A designing support equipment that displays design information on a display unit and performs design, said equipment comprising:

a plurality of terminals connected via a network; and terminal control means for controlling said plurality of terminals, which are connected via said network, via said network, wherein said terminal has:

a display unit capable of displaying side by side any two or more of a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display;

storing means for storing design information of the objects to be designed; and control means for: displaying a display that said selecting means selected out of said first display, said second display and said third display on said display unit regarding the same object to be designed, based on the design information of said objects to be designed respectively; when at least any editing processing of changing, deleting and adding of connection information in any of said first display, said second display or said third display is performed, changing the design information of said object to be designed based on the editing processing, and changing the displayed contents of display to which editing processing was performed based on the changed design information of said object to be designed; and changing displayed contents of said first display, said second display of said third display whose displayed contents did not change so as to hold matching with the displayed contents of said first display, said second display or said third display which was changed by the editing processing, based on the changed design information of said object to be designed, and said terminal means has:

detecting means for detecting a change of displayed contents severally displayed on said display units of said plurality of terminals; and among-terminal display matching means matching means for changing the displayed contents of terminals whose displayed contents did not change so as to hold matching with the displayed contents of a terminal whose displayed contents changed when said detecting means detected the change of displayed contents, wherein said control means has:

automatic changing means for automatically changing a connector and a flexible substrate while holding matching of displayed contents on said second display and said third display.

29. The designing support equipment according to claim 5, wherein said design information includes at least design information regarding electric design.

30. The designing support equipment according to claim 6, wherein said design information includes at least design information regarding electric design.

31. The designing support equipment according to claim 7, wherein said design information includes at least design information regarding electric design.

32. The designing support equipment according to claim 8, wherein said design information includes at least design information regarding electric design.

33. The designing support equipment according to claim 29, said equipment further comprising:

design information selecting means for selecting said design information regarding electric design; and output means for outputting information based on the design information selected by said design information selecting means.

34. The designing support equipment according to claim 30, said equipment further comprising:

design information selecting means for selecting said design information regarding electric design; and output means for outputting information based on the design information selected by said design information selecting means.

35. The designing support equipment according to claim 31, said equipment further comprising:

design information selecting means for selecting said design information regarding electric design; and output means for outputting information based on the design information selected by said design information selecting means.

36. The designing support equipment according to claim 32, said equipment further comprising:

design information selecting means for selecting said design information regarding electric design; and output means for outputting information based on the design information selected by said design information selecting means.

37. The designing support equipment according to claim 29, said equipment further comprising:

associating means for associating said design information regarding electric design.

38. The designing support equipment according to claim 30, said equipment further comprising:

associating means for associating said design information regarding electric design.

39. The designing support equipment according to claim 31, said equipment further comprising:

associating means for associating said design information regarding electric design.

40. The designing support equipment according to claim 32, said equipment further comprising:

associating means for associating said design information regarding electric design.

41. A designing support equipment that displays design information on a display unit and performs design, said equipment comprising:

a display unit that equips side by side a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display; and control means for allowing said display unit to display a display that said selecting means selected out of said first display, said second display and said third display regarding the same object to be designed and for changing displayed contents displayed on said display unit into a state where matching is held in said first display, said second display and said third display, and said control means has:

automatic generating means for automatically generating a connector and a flexible substrate while holding matching of displayed contents on said second display and said third display.

42. A designing support equipment that displays design information on a display unit and performs design, said equipment comprising:

a display unit that equips side by side a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display; and control means for allowing said display unit to display a display that said selecting means selected out of said first display, said second display and said third display regarding the same object to be designed and for changing displayed contents displayed on said display unit into a state where matching is held in said first display, said second display and said third display, and said control means has:

automatic changing means for automatically changing a connector and a flexible substrate while holding matching of displayed contents on said second display and said third display.

43. A designing support equipment that displays design information on a display unit and performs design, said equipment comprising:

a plurality of terminals connected via a network; and terminal control means for controlling said plurality of terminals, which are connected via said network, via said network, wherein said terminal has:

a display unit that equips side by side a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display; and control means for allowing said display unit to display a display that said selecting means selected out of said first display, said second display and said third display regarding the same object to be designed and for changing displayed contents displayed on said display unit into a state where matching is held in said first display, said second display and said third display, said control means has:

automatic generating means for automatically generating a connector and a flexible substrate while holding matching of displayed contents on said second display and said third display, and said terminal control means has:

detecting means for detecting a change of displayed contents severally displayed on said display units of said plurality of terminals; and display matching means for changing the displayed contents of terminals whose displayed contents did not change so as to hold matching with the displayed contents of a terminal whose displayed contents changed when said detecting means detected the change of displayed contents.

44. A designing support equipment that displays design information on a display unit and performs design, said equipment comprising:

a plurality of terminals connected via a network; and terminal control means for controlling said plurality of terminals, which are connected via said network, via said network, wherein said terminal has:

a display unit that equips side by side a first display that displays design information logically expressing the electrical operation of objects to be designed, a second display that displays design information expressing the objects to be designed in a physical two-dimensional shape, and a third display that displays design information expressing the objects to be designed in a physical three-dimensional shape;

selecting means for selecting at least two displays out of said first display, said second display and said third display; and control means for allowing said display unit to display a display that said selecting means selected out of said first display, said second display and said third display regarding the same object to be designed and for changing displayed contents displayed on said display unit into a state where matching is held in said first display, said second display and said third display, said control means has:

automatic changing means for automatically changing a connector and a flexible substrate while holding matching of displayed contents on said second display and said third display, and said terminal control means has:

detecting means for detecting a change of displayed contents severally displayed on said display units of said plurality of terminals; and display matching means for changing the displayed contents of terminals whose displayed contents did not change so as to hold matching with the displayed contents of a terminal whose displayed contents changed when said detecting means detected the change of displayed contents.

45. A program, which is recorded in a non-transitory computer-readable storage medium, that allows a computer to function as the designing support equipment according to claim 5.

46. A program, which is recorded in a non-transitory computer-readable storage medium, that allows a computer to function as the designing support equipment according to claim 6.

47. A program, which is recorded in a non-transitory computer-readable storage medium, that allows a computer to function as the designing support equipment according to claim 7.

48. A program, which is recorded in a non-transitory computer-readable storage medium, that allows a computer to function as the designing support equipment according to claim 8.

49. A program, which is recorded in a non-transitory computer-readable storage medium, that allows a computer to function as the designing support equipment according to claim 41.

50. A program, which is recorded in a non-transitory computer-readable storage medium, that allows a computer to function as the designing support equipment according to claim 42.

51. A program, which is recorded in a non-transitory computer-readable storage medium, that allows a computer to function as the designing support equipment according to claim 43.

52. A program, which is recorded in a non-transitory computer-readable storage medium, that allows a computer to function as the designing support equipment according to claim 44.

* * * * *